United States Patent
Hegazy et al.

(10) Patent No.: US 11,017,147 B2
(45) Date of Patent: May 25, 2021

(54) EDGE-BASED CAMERA FOR CHARACTERIZING SEMICONDUCTOR LAYOUT DESIGNS

(71) Applicant: Mentor Graphics Corporation, Wilsonville, OR (US)

(72) Inventors: Hazem Hegazy, Cairo (EG); Ahmed Hamed Fathi Hamed, Giza (EG); Omar Elsewefy, Giza (EG)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/556,794

(22) Filed: Aug. 30, 2019

(65) Prior Publication Data

US 2021/0064717 A1 Mar. 4, 2021

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .............................. G06F 30/398; G06F 30/392
USPC .......................................................... 716/52
See application file for complete search history.

(56) References Cited

U.S. PATENT DOCUMENTS

| | | | |
|---|---|---|---|
| 8,458,623 B1 * | 6/2013 | Wagner | G03F 7/70433 716/51 |
| 9,646,124 B2 * | 5/2017 | Chidambarrao | G06F 30/327 |
| 10,216,888 B2 * | 2/2019 | Kanshin | G06F 30/398 |
| 2005/0185159 A1 * | 8/2005 | Rosenbluth | G03F 7/70441 355/53 |
| 2006/0277520 A1 * | 12/2006 | Gennari | G06T 7/0004 716/53 |
| 2014/0089877 A1 | 3/2014 | Salem et al. | |
| 2014/0215416 A1 | 7/2014 | Sahouria | |
| 2018/0307791 A1 | 10/2018 | Mousa et al. | |
| 2018/0365370 A1 * | 12/2018 | Egan | G06F 3/04815 |
| 2019/0087526 A1 | 3/2019 | Park et al. | |

(Continued)

OTHER PUBLICATIONS

Jason P. Cain, Moutaz Fakhry, Piyush Pathak, Jason Sweis, Frank E. Gennari, and Ya-Chieh Lai, "Pattern-based analytics to estimate and track yield risk of designs down to 7nm", Proc. SPIE 10148, Design-Process-Technology Co-optimization for Manufacturability XI, Mar. 30, 2017, pp. 1014805-1-1014805-14.

*Primary Examiner* — Suresh Memula

(57) ABSTRACT

System and methods for an edge-based camera are disclosed. Semiconductor layout designs are a representation of an integrated circuit that are used to manufacture the integrated circuit. Parts of the layout design, such as points of Interest (POIs), may be subject to analysis with regard to a downstream application, such as hotspot detection. Unlike pixel-based characterizations, POIs are characterized using topological features indicative of quantized values and dimensional features indicative of analog values. For example, an edge may be characterized using a set of relations, which characterizes corners and polygons (including the polygon on which the POI resides and external polygons). In turn, the set of relations may be used to define image representations, including images in different directions relative to the POI (including cardinal and ordinal image). In this way, the topological/dimensional characterization of the POI may be used to analyze the POI in the layout design.

20 Claims, 51 Drawing Sheets

(56) References Cited

U.S. PATENT DOCUMENTS

2019/0155142 A1    5/2019  Lai
2020/0143099 A1*   5/2020  Wu .................... G01N 23/2251

* cited by examiner

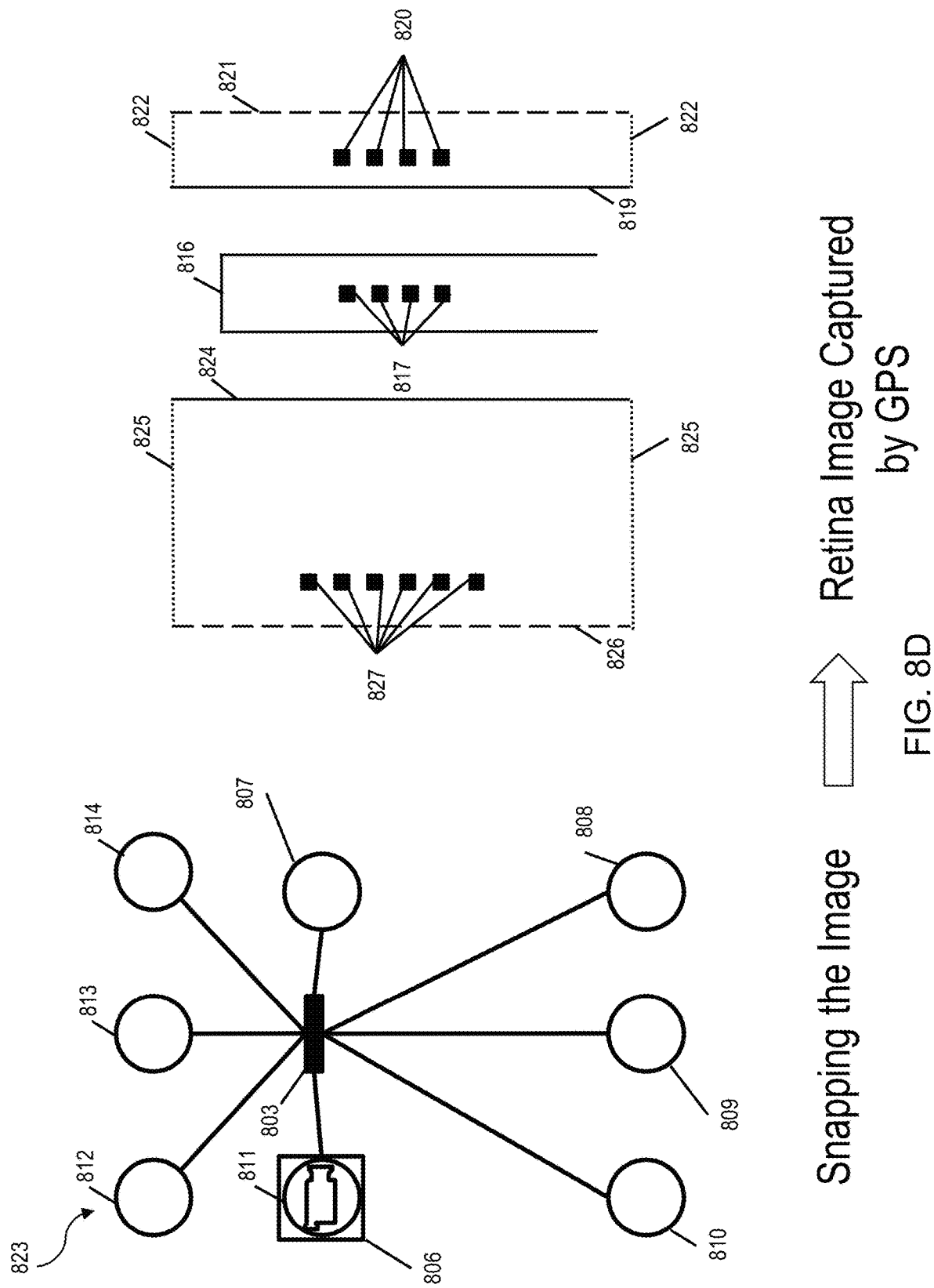

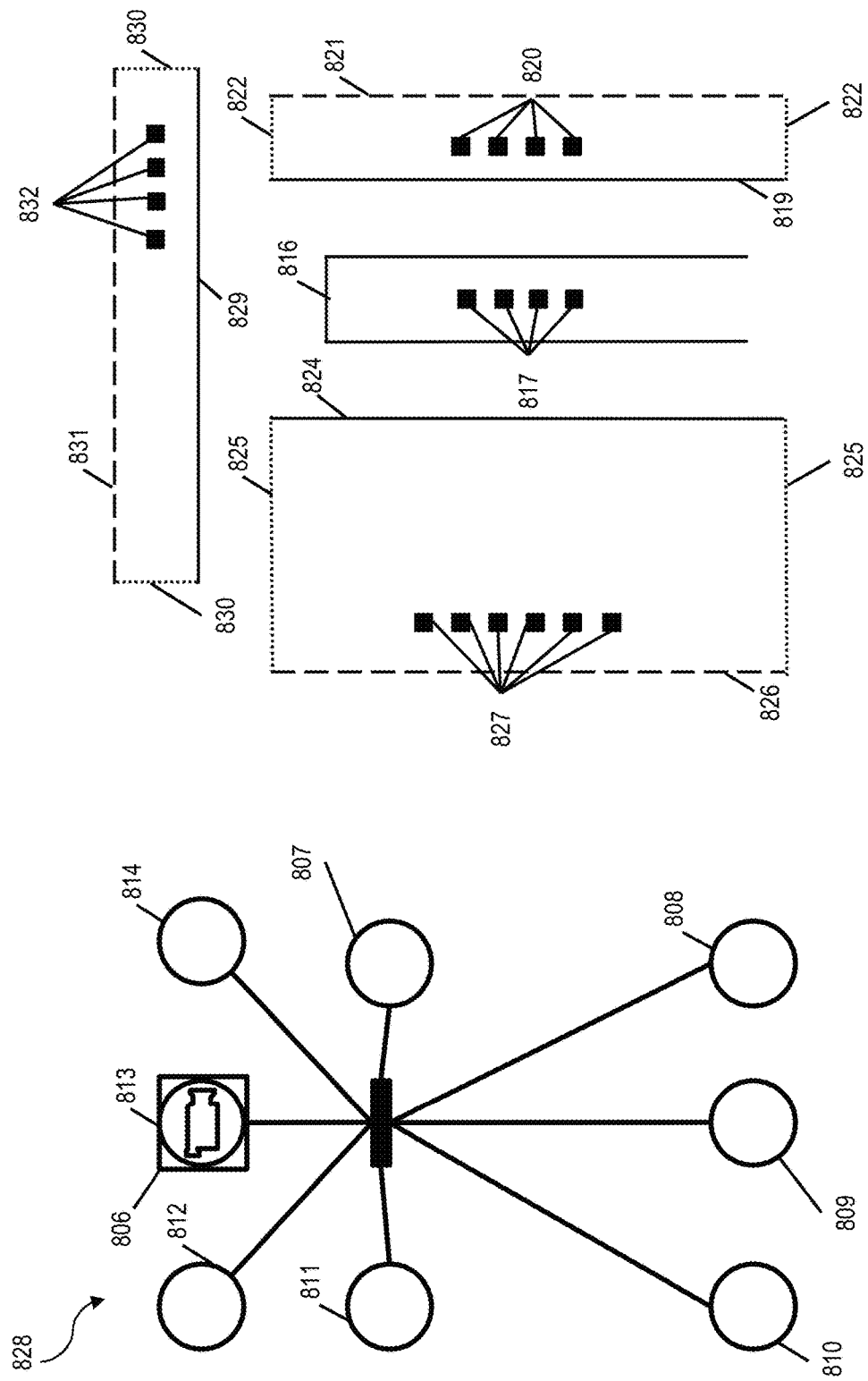

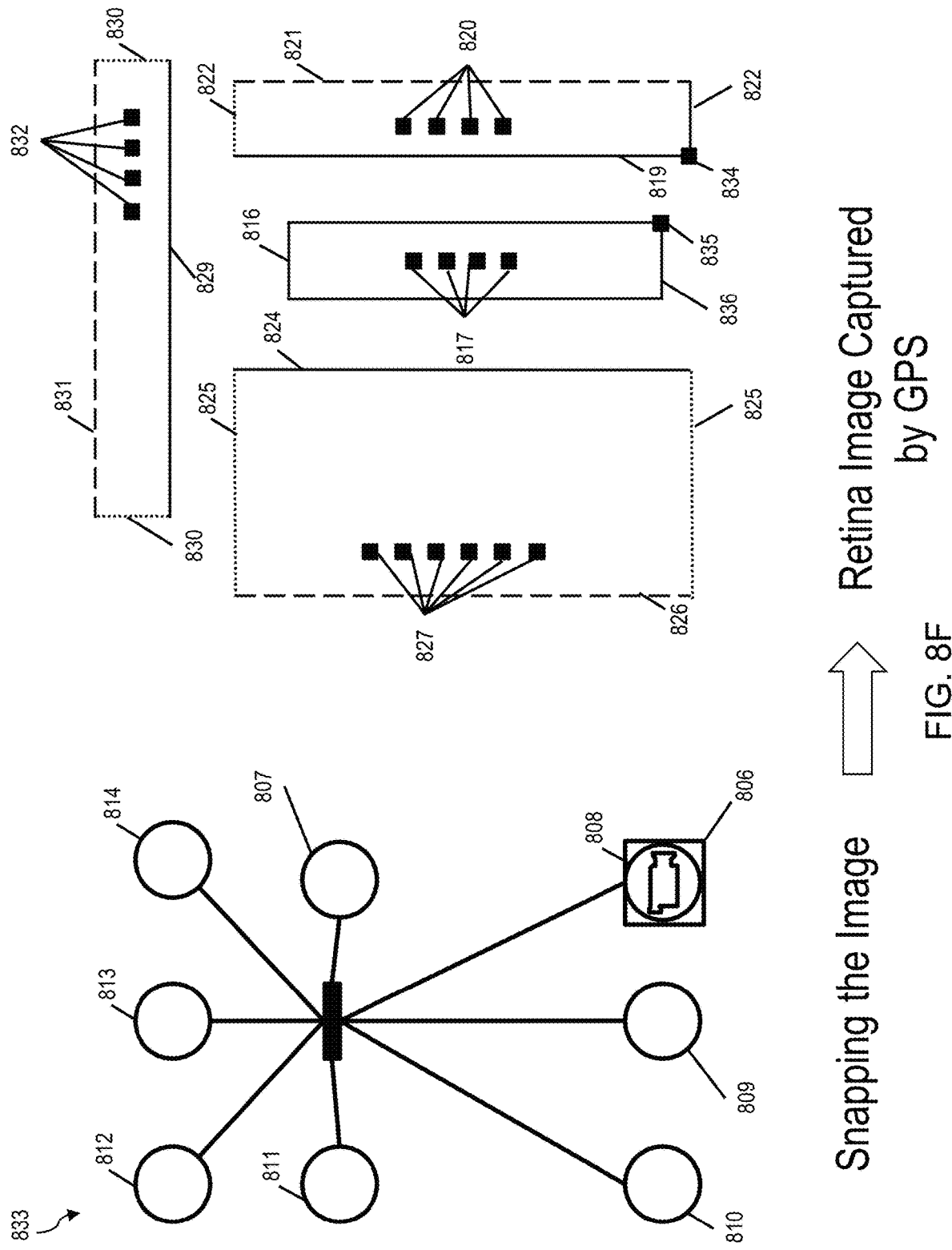

EDGE-BASED CAMERA FOR CHARACTERIZING SEMICONDUCTOR LAYOUT DESIGNS

FIELD

The present disclosure relates to the field of semiconductor layout analysis, and specifically relates to characterizing edges in a layout design using an edge-based camera.

BACKGROUND

Electronic circuits, such as integrated microcircuits, are used in a variety of products, from automobiles to microwaves to personal computers. Designing and fabricating integrated circuit devices typically involves many steps, sometimes referred to as a "design flow." The particular steps of the design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

For example, a layout design (interchangeably referred to as a layout) may be derived from an electronic circuit design. The layout design may comprise an integrated circuit (IC) layout, an IC mask layout, or a mask design. In particular, the layout design may be a representation of an integrated circuit in terms of planar geometric shapes which correspond to the patterns of metal, oxide, or semiconductor layers that make up the components of the integrated circuit. The layout design can be one for a whole chip or a portion of a full-chip layout design.

Traditionally, the context of the layout design is captured as some form of image or pattern, with the modeling and simulation applications focusing on the image or pattern as part of the requisite analysis. Further, the process physics are captured as engineering data and formula entry. However, since the layout design may be exceedingly complex, with layouts patterns potentially numbering in the billions per layout design, such analysis is a challenge both for computational time and for memory requirements.

SUMMARY

The patent application includes a system and methods for an edge-based camera. Semiconductor layout designs can be a representation of an integrated circuit used to manufacture an integrated circuit. Parts of the layout design, such as Points of Interest (POIs), may be subject to analysis with regard to a downstream application, such as hotspot detection. Unlike pixel-based characterizations, POIs can be characterized using topological features indicative of quantized values and dimensional features indicative of analog values. For example, an edge may be characterized using a set of relations, which characterizes corners and polygons (including the polygon on which the POI resides and external polygons). In turn, the set of relations may be used to define image representations, including images in different directions relative to the POI (including cardinal and ordinal image). In this way, the topological/dimensional characterization of the POI may be used to analyze the POI in the layout design. Embodiments of the edge-based camera will be described below in greater detail.

BRIEF DESCRIPTION OF THE DRAWINGS

The accompanying drawings, which are incorporated in and constitute a part of this specification, illustrate various aspects of the invention and together with the description, serve to explain its principles. Wherever convenient, the same reference numbers will be used throughout the drawings to refer to the same or like elements.

FIGS. 8A-I illustrates block diagrams for a first example of translating the layout to taking snapshots of different images in order to define a retina image captured by GPS.

DETAILED DESCRIPTION OF EMBODIMENTS

General Considerations

Figure 1:
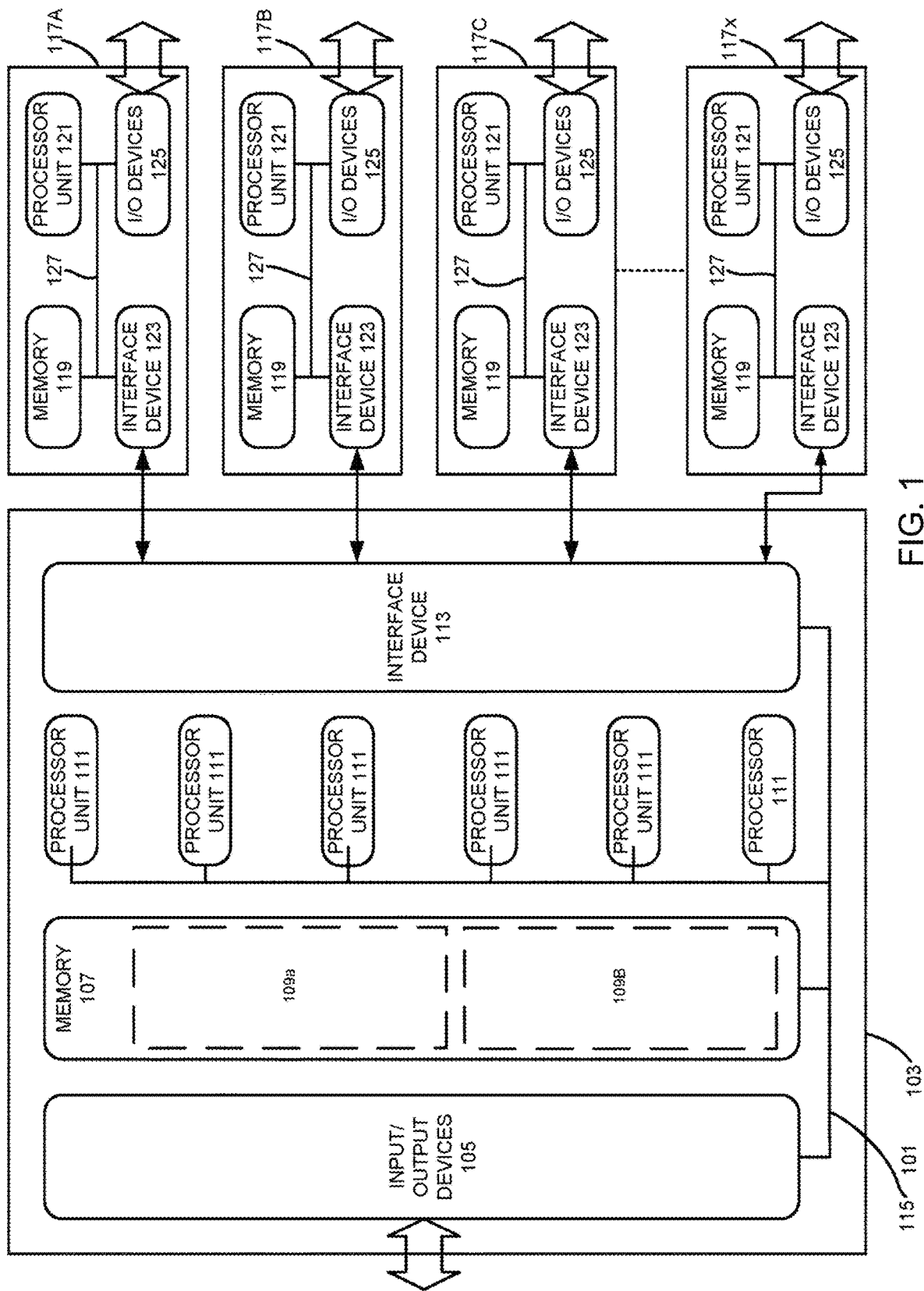
FIG. 1 illustrates an example of a computing system that may be used to implement various embodiments of the disclosed technology.

Various aspects of the present disclosed technology relate to an edge-based camera for a layout design. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on one or more non-transitory computer-readable media, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "generate," "access," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input/output devices 105 and a memory 107. The input/output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include non-magnetic and magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations, such as the operations disclosed herein. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device, a graphics processor unit (GPU) device, or the like. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations, include using an application-specific integrated circuit (ASIC) or a field programmable gate array (FPGA). The interface device 113, the processor units 111, the memory 107 and the input/output devices 105 are connected together by a bus 115.

Figure 2:
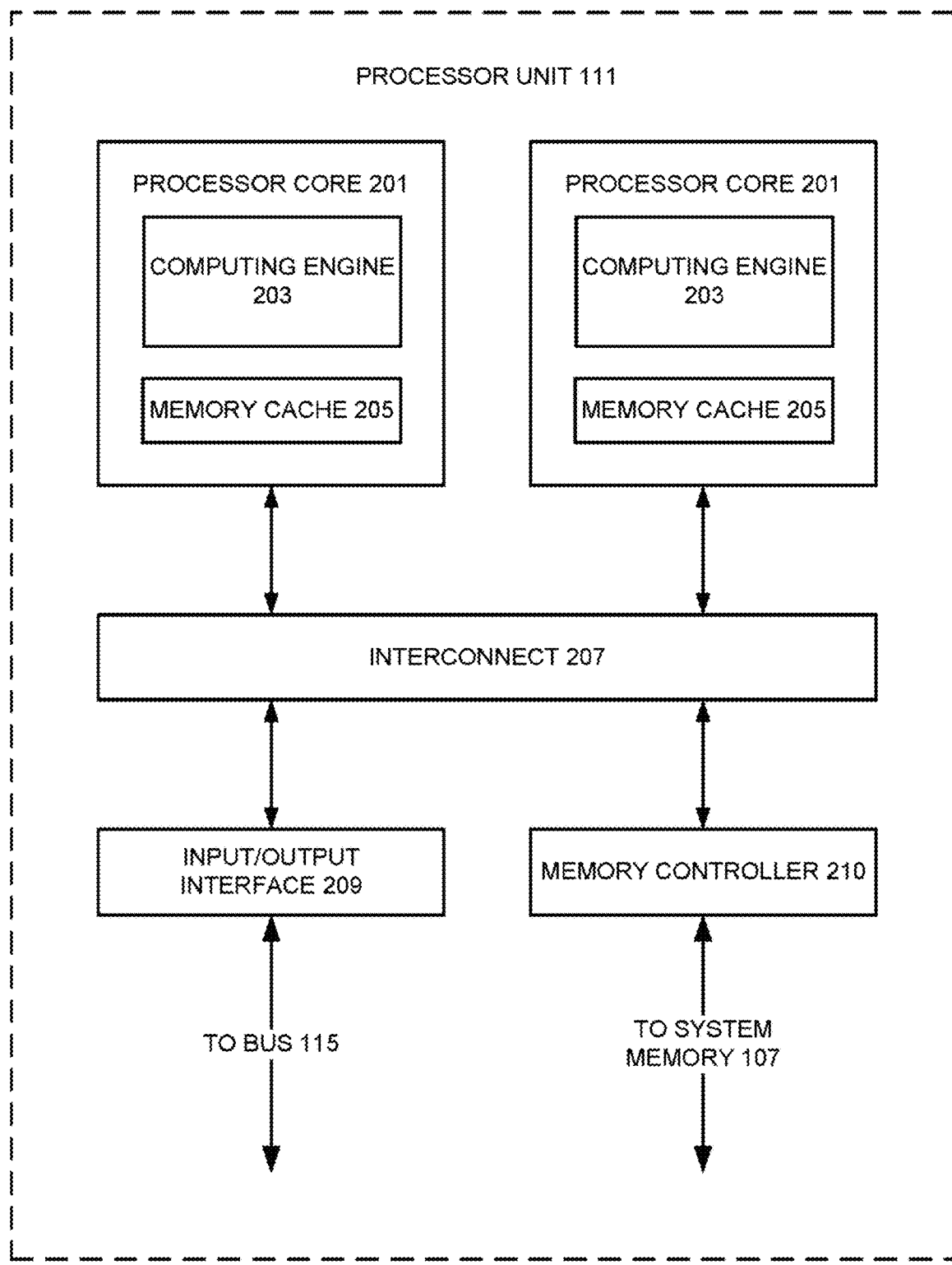
FIG. 2 illustrates an example of a multi-core processor unit that may be used to implement various embodiments of the disclosed technology.

With some implementations of the disclosed technology, the master computer 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations (e.g., using an ASIC or an FPGA). Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Edge-Based Camera

As discussed in the background, analysis of layout context typically focuses on image analysis, such as a pixel-based image analysis. However, the traditional image analysis highlights several problems. First, the dataset used for the image analysis is identical in informational density, and is thus limiting, particularly for different types of layout context analysis. For example, each pixel in a bitmap dataset represents the same information for each point in the image. In particular, the layout design may be described in a layout design file, which contains a set of polygons (e.g., patterns) that represents what should be printed on the silicon wafer on a certain layer. One example of a layout design file comprises a pattern file whereby each coordinate represents a simple point in a grid with no additional information captured, with the data storage taking the form of a bitmap or compressed bitmap image data or coordinate polygonal databases. These datasets are essentially single parameter inputs (i.e., polygon layer coordinates/pixels) or few parameters (i.e., multiple layer coordinates/pixels).

Second, focusing on image analysis pattern matching is both computationally expensive and inherently limiting. In particular, pixel-based image analysis may require higher hardware and/or software computational resources, such as during any one, any combination, or all of: the context capturing phase; the model training phase; the validation phase; or the testing phase.

Third, using a pixel-based image analysis limits the ability to do any one, any combination, or all of the following: (i) decompose the effect of different contextual polygons on a selected point of interest (POI); (ii) correlate potentially violating patterns with known violating patterns without the need for clustering; (iii) image reconstruction after machine-learning (ML) model training; (iv) methodically determine which edge to move and optionally by how much in order to change a potentially violating pattern into a compliant one; or (v) understand what the ML model captured from the original image and trained on.

In one or some embodiments, a camera generates a representation of a POI, whereby the representation of the POI, such as an edge, is based on topological and dimensional features of the POI. Though the discussion below focuses an edge as the POI, other POIs are contemplated. In this regard, any discussion herein regarding an edge may be equally applied to other POIs. The camera, interchangeably described as an edge-based camera, is in contrast to a traditional camera, which describes the edge in a pixel-based manner. For example, the edge-based camera is configured to generate an "image" of the POI; however, the "image" (or interchangeably an "image representation") generated by the edge-based camera is not based on pixels, but is instead based on the representation, including the topological and dimensional features of the POI. One manifestation of the topological and dimensional features are a plurality of properties associated with the POI, discussed in more detail below. In that regard, the discussion herein regarding a camera, or an edge-based camera, is directed to generate a type of image (or image representation) of the POI based on the topological and dimensional features of the POI. As discussed in more detail below, the image representation may comprise a numerical value, a table, or the like.

Generally speaking, the edge-based camera is configured to generate an output (e.g., an image representation) such that there is a 1-to-1 manner of describing the edge, whereby the edge-based camera translates a respective edge into a single output representation, and wherein the single output representation from the edge-based camera may likewise be translated back to the respective edge in the layout design. In particular, the representation, with quantized and/or continuous (e.g., measured) values (discussed further below), enable capturing the context around any POI that makes it possible to reconstruct by using the quantized/continuous (e.g., measured) values to redraw that part of layout design around a same/similar POI.

The representation, as generated by the edge-based camera, of the POI may be manifested in one of several ways. In one way, the representation may comprise a numerical representation of the image. For example, for reconstructability, the image may be represented by a long binary number that each group of bits represents an edge based feature. As another example, the image may be represented by a table of values, as discussed in further detail below (see, for example, Table 1 below). In this way, pattern clustering and/or matching may be performed through numerical comparison rather than through pixel convolutions. Thus, the edge-based camera may replace the pixel-based approaches as an image capturing solution and may enable the 1-to-1 mapping for one, some or all of the edges in the layout design that may result in a potential violation around the POI.

The edge-based camera capitalizes on the inherent constraints in layout designs in order to generate the 1-to-1 relation. In particular, layout designs are generally subject to several constraints, such as those related to placing and routing tools, in addition to spacing, directions, minimum/maximum widths, etc. In this regard, Geometrical Position Surveying (GPS), discussed further below, relies on the Constraint Generality Concept (CGC) inherent to layout designs. Thus, patterns in a layout design are not unconstrained, such as in a freeform drawing that may take any shape. Quite the contrary, layout designers are restricted to certain type of geometries, such as polygons, and nothing else, as well as being subject to other restrictions (e.g., place and route tools, spacing, directions, min/max width, etc.), resulting in the layout design patterns being a much smaller subset of the freeform population.

In particular, segmenting the definition of an edge, such as based on topological and dimensional features, allows for the representation of the sub-infinite problem and allows for the reversal of the read image in order to enable reconstructability. Thus, in one or some embodiments, the representation of the POI comprises (or alternatively consists of) geometrical and edge-based measurements in a reconstructable methodology to describe the context around the POI (instead of using pixels), which more generally speaking comprises a general platform to capture the context around the POI and which may be used to model yield enhancement mechanisms (e.g., correcting potential hotspots). In this way, the edge-based camera describes a respective edge using contextual relations and measures, as discussed further below, without the need to take a traditional snapshot for pixel-based image analysis approaches. In particular, the edge-based camera and the GPS methodology enable the image reconstruction through reversing the stamping values of the edges to the dynamic grid around each or any POI. In this way, starting with the original layout design, the edge-based camera may generate a representation of a part (or all) of the original layout design for further analysis. Further, starting with the representation, the original layout design may be recreated.

As discussed above, a respective edge may be defined based on two main features: topological features; and dimensional features. The topological features comprise quantized values (e.g., values that are restricted to a discrete set, such as discrete set of 2 (e.g., horizontal/vertical; convex/concave; or yes/no values) that describe a certain geometrical state (e.g., orientation (e.g., horizontal or vertical), corner type (e.g., convex or concave), existence of polygon (e.g., determine whether there is a polygon to the left, to the right, etc. of the polygon where the edge is resident). Further, the dimensional features represent analog measurements (e.g., space, width, enclosure, angle, etc.). In one or some embodiments, the topological features provide the framework in order for the dimensional features to build over the information input for the topological features. Thus, the topological features may be based on the constraints of the layout design process, with the dimensional features expounding on the particulars of the layout design (akin to the topological features defining a tree structure with the dimensional features elaborating on the tree structure).

One manifestation of the topological/dimensional features definition comprises using relations/images in which relations are first defined, and thereafter images are defined based on the previously defined relations. Thus, in one implementation, the relations may define a relations level, and the images may define an image level, with the image level being dependent on the relations level.

In particular, the relations may be with regard to the polygon at which the edge is resident (interchangeably referred to as a resident polygon) and/or with regard to a polygon external to the resident polygon (interchangeably referred to as an external polygon), such as defining relations with regard to any one, any combination, or all of: the external polygon itself; the edge relative to the external polygon; or the resident polygon relative to the external polygon. Alternatively, or in addition, the relations may be with regard to corners on one or both of the resident polygon or external polygons. For example, using the layout design constraints, such as CGC, a description of the context around any POI, such as an edge, may be built over a few basic relations. Example relations include any one, any combination, or all of: directional relation matrix; orientation relation vector; corner relation vector; geometrical relation vector; and zone relation matrix.

In particular, the directional relation matrix may describe the border around the POI, such as the edge, in one or more predefined directions, such as cardinal directions (e.g., north/east/west/south) to the polygon or space type (e.g., a separation distance). The orientation relation vector may describe the orientation of edge/polygon, such as to either horizontal or vertical. The corner relation vector may describe the corners and define one or more basic corner properties, such as one or both of: corner type (e.g., whether a concave or a convex corner); and corner edge measurements (e.g., corner space and/or corner length). The geometrical relation vector may describe one or more geometrical properties of width and space of the resident polygon and/or one or more geometrical properties of the external polygon. The zone relation matrix may organize various geometrical measurements to different zones according to the distance from the POI, such as beginning from the closest zone and thereafter moving further away from the POI.

Further, based on relations described, the image layer may be constructed to capture the image around the POI, such as one or both of the polygon features (such as one or both of the resident polygon feature(s) or external polygon(s) features) or corner features (corners on external polygon(s) and/or corners on the resident polygon). As mentioned above, the "image" layer may comprise the representation of the POI with regard to the topological and/or dimensional features (e.g., properties defining the representation of the POI). The image layer may treat different features differently, such as polygons and corners differently (e.g., corners at the ordinal directions and polygons at the cardinal directions). As discussed in more detail below, the image layer comprises any one, any combination, or all of: cardinal image; ordinal image; or POI image.

In one or some embodiments, the cardinal image comprises the distance to the polygons on one or more predefined directions (e.g., the north/west/east/south directions, which may define one or more cardinal polygons) measured from the resident polygon to one or more external polygons. The distance may comprise the first in one or more features measured in the predefined directions (e.g., the cardinal directions). Example other features include one or both of the following: run length between the resident polygon and cardinal polygon. Cardinal polygon properties include any one, any combination, or all of: area; perimeter; horizontal extent; vertical extent; orientation; and vertex count. One, some, or all of the measurements may be combined to create the cardinal description around the POI. After the cardinal description is created, a zoning module may be applied in order to create the final cardinal zoned image, as discussed further below.

The ordinal image comprises a distance to the corners on predefined directions, such as along the ordinal (e.g., such as any one, any combination or all of: the north east direction; north west direction; south east direction; or southwest direction) measured from the POI to the corners. The distance may be the first in one or more features measured in the predefined directions (e.g., the ordinal directions). Example other features include one or both of the following: corner type (e.g., convex or concave); or corner edge measurements (e.g., length of the two edges constituting a corner). One, some or all of the measurements may be combined to create the ordinal description around the POI. After the ordinal description is created, the zoning module is applied in order to create the final ordinal-zoned image. The ordinal measurement may be classified to self-zoned ordinal image or to outer-zoned ordinal image. In particular, the self-zoned ordinal image refers to the ordinal image for the resident polygon in the respective zone while the outer-zoned ordinal image refers to the external polygon in the respective zone.

The POI image comprises the geometrical polygonal properties of resident polygon, which may be calculated in order to provide an accurate image of the resident polygon. Features of the POI image comprise any one, any combination, or all of: width; length; perimeter; vertex count; concave corner count; convex corner count; orientation; POI facing border distance; and run length.

In one or some embodiments, the topological and/or dimensional features obtained and/or the analysis of the obtained features may be tailored to a downstream application. As one example, a first downstream application may only analyze topological features whereas a second downstream application may analyze both topological features and dimensional features. Thus, in one embodiment, depending on the downstream application, a subset of the features for a POI may be populated (e.g., in the example of the first downstream application only analyzing topological features, only the topological features are populated). Thereafter, the subset of features for the POI may be analyzed for the downstream application. Alternatively, the entire set of features for the POI may be populated, with a subset of the entire set of features being analyzed for the downstream application. In the example of the first downstream application, both the topological features and the dimensional features may be populated (e.g., populating values for the entire Table 1 below). However, only a subset of the populated features (e.g., only the topological features) are analyzed for the first downstream application. In this way, the obtaining and/or analyzing of the features may be tailored to the downstream application.

Figure 3:
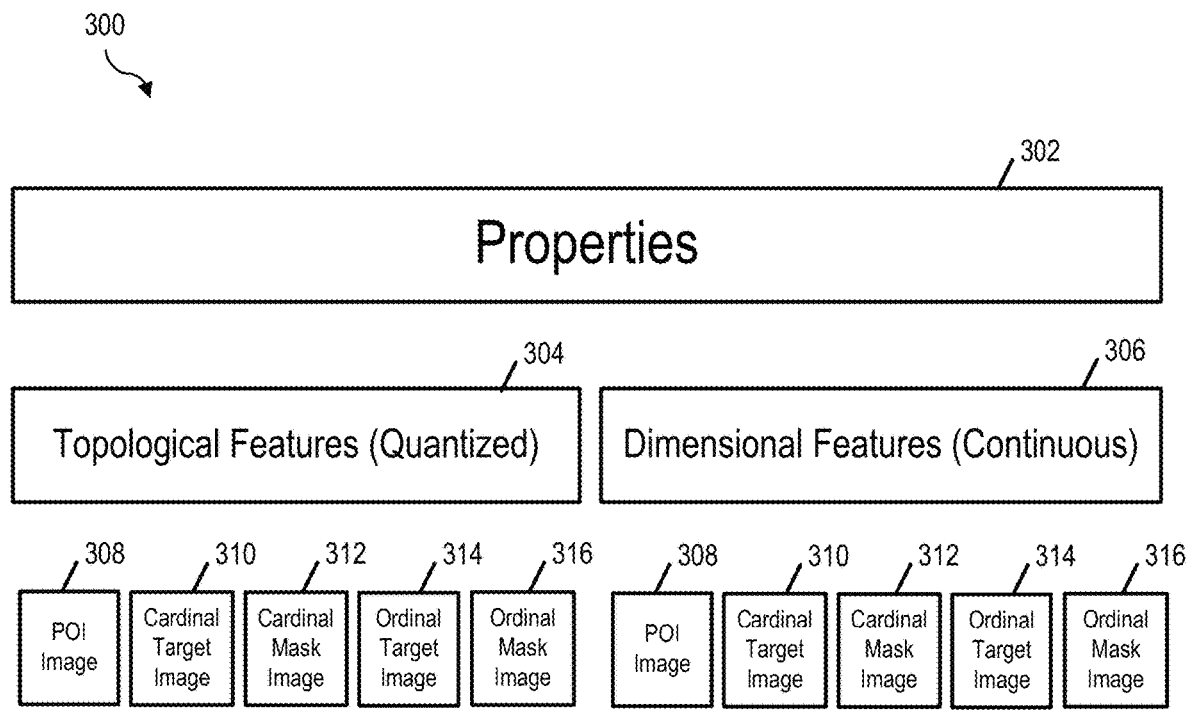
FIG. 3 is a block diagram representing division of properties of edges into topological and dimensional features.

Referring to back the figures, FIG. 3 is a block diagram 300 representing division of properties 302 of edges into topological features 304 and dimensional features 306. As discussed above, the topological features 304 may be quantized, such as at a discrete set of values (e.g., a set of two values, such as horizontal/vertical; yes/now; convex/concave; etc.; a set three values; etc.). The dimensional features 306 may be considered continuous (e.g., to the extent within a measured capacity). The topological features 304 and the dimensional features 306 may be used to generate one or more images. For example, as depicted in FIG. 3, the topological features 304 and the dimensional features 306 may result in one or more images, such as any one, any combination, or all of: the POI image 308; the cardinal target image 310; the cardinal mask image 312; the ordinal target image 314; or the ordinal mask image 316.

In one or some embodiments, an image comprises a representation of at least a part of the layout, with the representation being based on one or both of topological features and dimensional features in order to characterize the at least a part of the layout. Various type of images of the layout are contemplated, such as those illustrated in FIG. 3. For example, images may be generated based on any one, any combination, or all of: at different directions (e.g., at the ordinal versus the cardinal directions); at the mask level or at the target level (e.g., at the layout design or for a specific mask); at the corners or at the polygons; at the resident polygon or with regard to an external polygon (e.g., relative to the external polygon and/or describing the external polygon).

For example, an ordinal image of corners for external polygons (described below as an outer-ordinal image) may be generated whereas an ordinal image for the resident polygon (described below as a self-ordinal image) may be generated. Further, the ordinal image (whether separately for the outer-ordinal image and the self-ordinal image or for the ordinal image) may be at the target level (e.g., ordinal target image 314) and/or at the mask level (e.g., ordinal mask image 316). As another example, a cardinal image for external polygons (described below as a cardinal image) may be generated whereas a cardinal image for the resident polygon (described below as a POI image) may likewise be generated. Further, the cardinal image (such as for external polygons) may be at the target level (e.g., cardinal target image 310) and/or at the mask level (e.g., cardinal mask image 312).

Thus, the images may be at the target level, directed to a part or an entirety of the layout design. Alternatively, or in addition, the images may be at the mask level, such as directed to a part or an entirety of a mask (when using multiple masks in multi-patterning). For example, this is illustrated below with regard to Table 1. Multi-patterning, such as double-patterning EUV, involves splitting a layout design into multiple (such as at least two masks, at least three masks, at least four masks, etc.) simpler masks. Each respective mask is then printed as a separate layer. For example, in multi-patterning, different "colors" are used to denote how a circuit will be printed in multiple stages to make an entire circuit. As each color is printed in a different pass of the manufacturing process, there are slight variations (e.g., tolerances) associated with each pass that will impact device and circuit performance. In particular, semiconductor manufacturers have adopted double patterning lithography techniques. A common form of double patterning lithography decomposes a layout design into two portions for two masks. The decomposition process is often referred to as coloring, i.e., the mask layers are assigned colors. The two masks are used in two separate exposure processes with an existing nm wafer immersion lithography. The two coarser patterns formed are combined and superimposed, which enables a single finer image on the wafer. An example of this is illustrated in US Patent Application Publication No. 2018/0307791 A1, incorporated by reference herein in its entirety.

Figure 4:
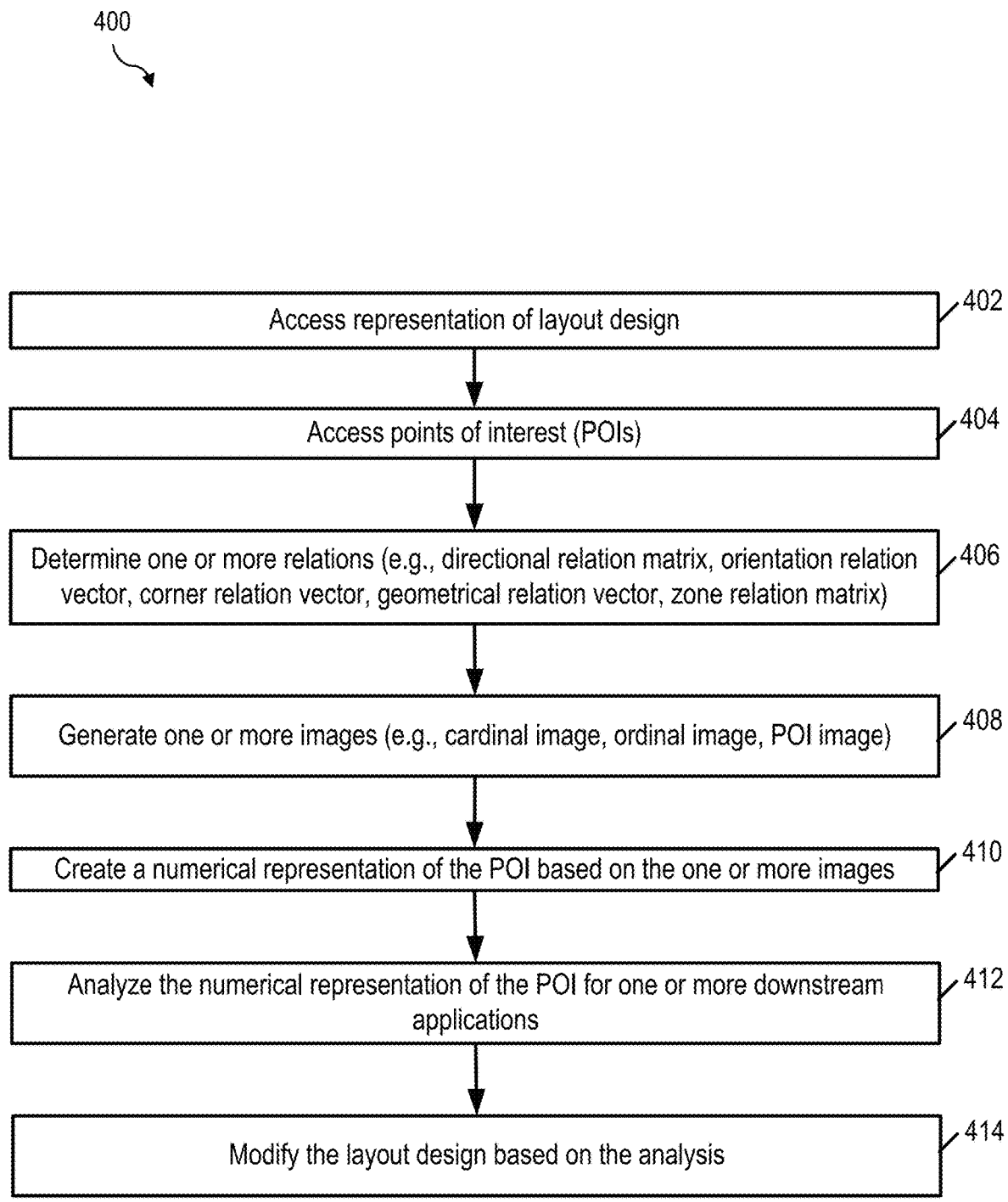
FIG. 4 is a flow chart of characterizing edges by first defining relations for a respective edge and thereafter defining images for the POI, such as the respective edge.

FIG. 4 is a flow chart 400 of characterizing edges by first defining relations for a respective edge and thereafter defining images for the POI, such as the respective edge, and using the characterization in order to analyze the POI. At 402, a representation of the layout design is accessed. At 404, one or more POIs are accessed. At 406, one or more relations are determined, such as any one, any combination, or all of: directional relation matrix; orientation relation vector; corner relation vector; geometrical relation vector; or zone relation matrix. At 408, one or more images are generated, such as any one, any combination, or all of: the cardinal image; the ordinal image; or the POI image. Examples of information or properties regarding the various images are illustrated in Table 1 below and with regard to FIGS. 6A-9Z. In one or some embodiments, the relations and/or the images may be selected based on the downstream application. For example, a hotspot set of relations and/or a hotspot set of images may be generated, tailored to subsequent hotspot detection analysis. As another example, an OPC set of relations and/or an OPC set of images may be generated, tailored to subsequent OPC analysis. At 410, a numerical of the POI is created based on the one or more images. As discussed above, various representations, such as a numerical representation, of the image are contemplated, including a long binary number, a table (such as illustrated in Table 1 below), or the like.

At 412, the numerical representation of the POI may then be analyzed with regard to the downstream application. Various downstream applications are contemplated including: (1) optical proximity correction (OPC), such as for generating OPC correction values (see e.g., US Patent Application Publication No. 2014/0215416 A1 and US Patent Application Publication No. 2019/0155142 A1, both of which are incorporated by reference herein in their entirety); (2) sub resolution assist feature (SRAF) placement; (3) hotspot detection (such as detecting whether a part of the layout design is susceptible to pinching (e.g., an open circuit) or bridging (e.g., a short circuit); see e.g., US Patent Application Publication No. 2014/0089877 A1 and US Patent Application Publication No. 2019/0087526 A1, both of which are incorporated by reference herein in their entirety); and (4) retargeting of layout design (e.g., layout reduction). Other downstream applications are contemplated. Further, in some embodiments, the type of POI may be specific to a specific downstream application. For example, the following are different type of POIs as locations for potential hotspots in hotspot detection including: (i) Line-End Pull Back hotspot; (ii) Line's Pinching/nicking hotspot; (iii) Lines bridging hotspot; and (iv) insufficient line-via overlay hotspot.

The analysis may comprise determining whether there is an exact match of the numerical representation with a known numerical representation (e.g., a numerical representation of a known "hotspot" or a known "good pattern"). For example, values that populate some or all of Table 1 below for a POI under examination may be compared with values that populate some or all of Table 1 below for a known POI (e.g., a known "hotspot" or a known "good pattern"). A match may comprise an exact match of part or all of the properties associated with the POI under examination and with the known POI. For example, a specific downstream application may compare a subset of properties in Table 1 for the POI under examination and with the known POI. Alternatively, fuzzy matching or clustering may be used in order to determine whether the properties for the POI under examination match with the properties for the known POI.

Alternatively, one or more machine learning methodologies may be used to generate mathematical models directed to the different downstream applications (e.g., an OPC mathematical model directed to determining, based on the numerical representations generated, whether the respective numerical representations indicate a "good geometry" or a "bad geometry"; a hotspot mathematical model directed to determining, based on the numerical representations generated, whether the respective numerical representations indicate a "hotspot" or a "good pattern"). In the example of training a hotspot mathematical model, the machine learning methodology may use a training dataset that includes numerical representation data corresponding to known hotspots and signature data corresponding to known good patterns in order to generate the hotspot mathematical model. As another example, a machine learning methodology may use a training dataset that includes POI properties corresponding to known Line-End Pull Back hotspots and POI parameter data corresponding to known non-Line-End Pull Back hotspots, to train a machine learning model tailored to Line-End Pull Back hotspot detection. In this way, the analysis may determine for the respective POI a conclusion tailored to the downstream application (e.g., whether the respective POI is determined to be a "hotspot" or "good pattern").

Further, different POIs are contemplated. In one embodiment, the POI comprises a respective edge. In that regard, the respective edge is characterized with topological and/or dimensional features, and analyzed accordingly with topological and/or dimensional features of another edge (e.g., another edge in the layout design or a known edge with known properties). Alternatively, the POI may comprise a polygon, with the analysis including deconstructing the polygon into a series of edges, with each edge in the series of edges having assigned topological and/or dimensional features. Each edge in the series of edges may be analyzed in combination against another series of edges (e.g., another polygon in the layout design or a known polygon with known properties).

For example, testing data, such as scan chain testing data, may be used in combination with the edge-based camera approach in order to identify problematic parts of the layout design. In particular, scan chain testing may amass enormous amounts of data as to potential errors from Automatic Test Pattern Generation (ATPG) on the actual working dies. In turn, the scan chain testing data may be analyzed in order to isolate parts of the layout design, including specific combinations of edges or polygons, that result in potential errors. The identified specific combinations of edges or polygons may be translated into topological and/or dimensional values that populate identified POI property datasets. As one example, through analysis of the scan chain test data, a specific structure, such as a specific type of via, may be identified as potentially prone to error (e.g., has a certain % of failing). The specific structure, which is at the polygon level, may be described in one or more identified POI property datasets (e.g., a via problematic POI property dataset includes a series of edges, with each respective edge having an edge POI property dataset (e.g., topological and/or dimensional parameters) for the specific type of via that is potentially prone to error). In practice, for the layout design under examination, the POI property dataset may be compared to the problematic POI property dataset. Specifically, each respective edge POI property dataset may be compared with a corresponding edge in the problematic POI parameter datasets in order to determine whether there is a match (or a match within a certain tolerance) in order to conclude whether a specific via in the layout design is prone to error (e.g., has a certain % error possibility). Alternatively, analysis may be at the edge level. In particular, the topological and/or dimensional features for a respective edge in the layout design may be compared with the topological and/or dimensional features for another edge in the layout design for pattern matching or a known edge with known properties. Thus, one, some, or all of the various structures within the layout design under examination may be analyzed and ascribed a certain % potential error, and in turn ranked for potential modification.

At 414, the system may modify the layout design based on the analysis. As one example, OPC may correct errors by moving edges and/or by adding extra polygons to the pattern written on the mask. This modification of the layout design may be drive by pre-computed look-up tables based on width and spacing between features (e.g., rule-based OPC) or by using models to dynamically simulate the final pattern and in turn determine the movement of the edges.

Figure 5A:
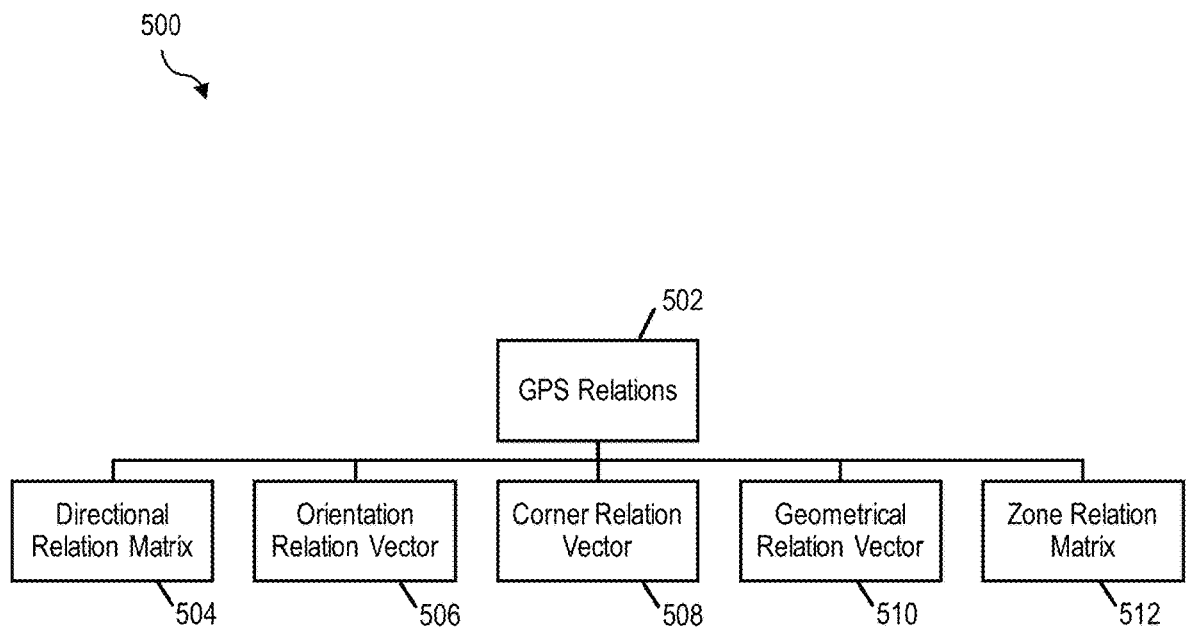
FIG. 5A is a block diagram defining relations for the POI, such as the respective edge.

FIG. 5A is a block diagram 500 defining relations for the POI, such as the respective edge. Specifically, the GPS relations 502 may be divided into any one, any combination, or all of: directional relation matrix 504; orientation relation vector 506; corner relation vector 508; geometrical relation vector 510; or zone relation matrix 512.

Figure 5B:
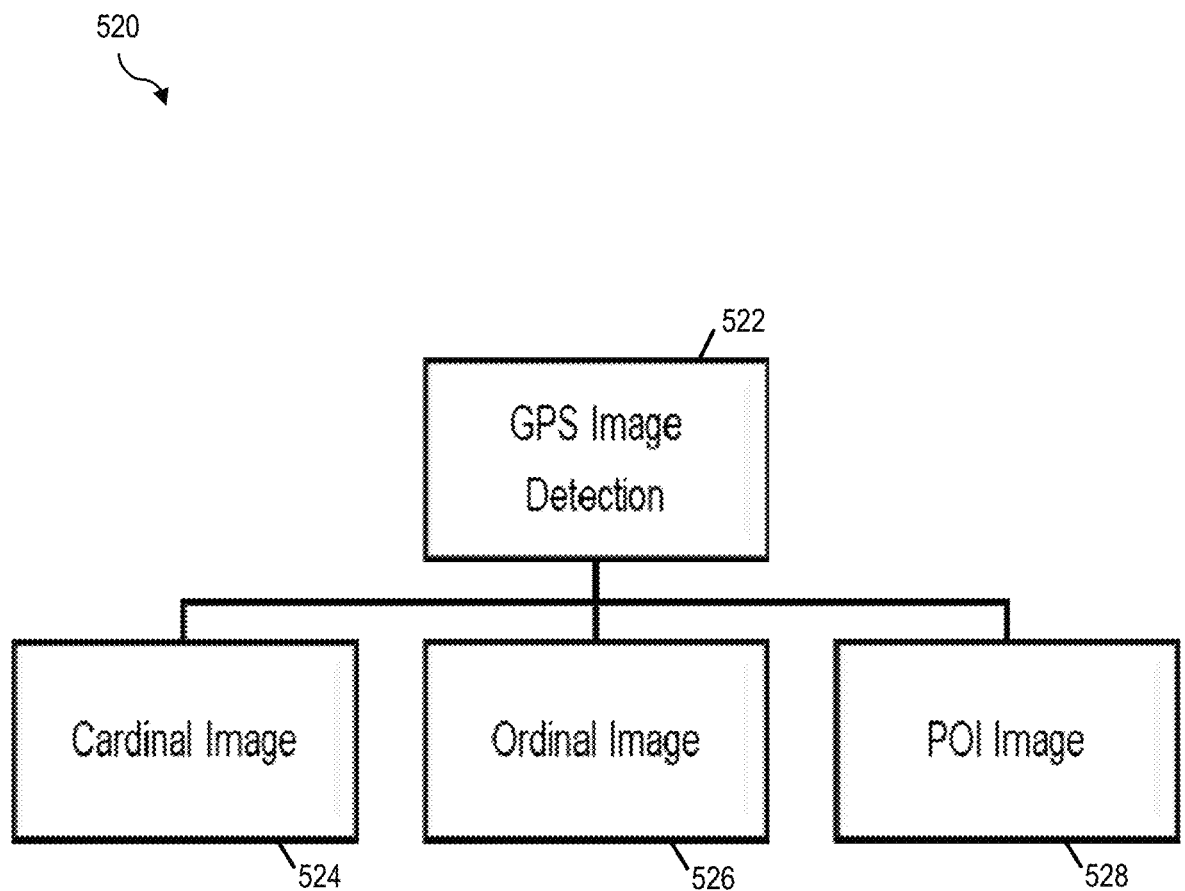
FIG. 5B is a block diagram defining images for the POI, such as the respective edge.

FIG. 5B is a block diagram 520 defining images, including GPS image detection 522 for the POI, such as the respective edge. As discussed further below, the images may comprise any one, any combination, or all of: the cardinal image 524, the ordinal image 526, or the POI image 528.

Figure 5C:
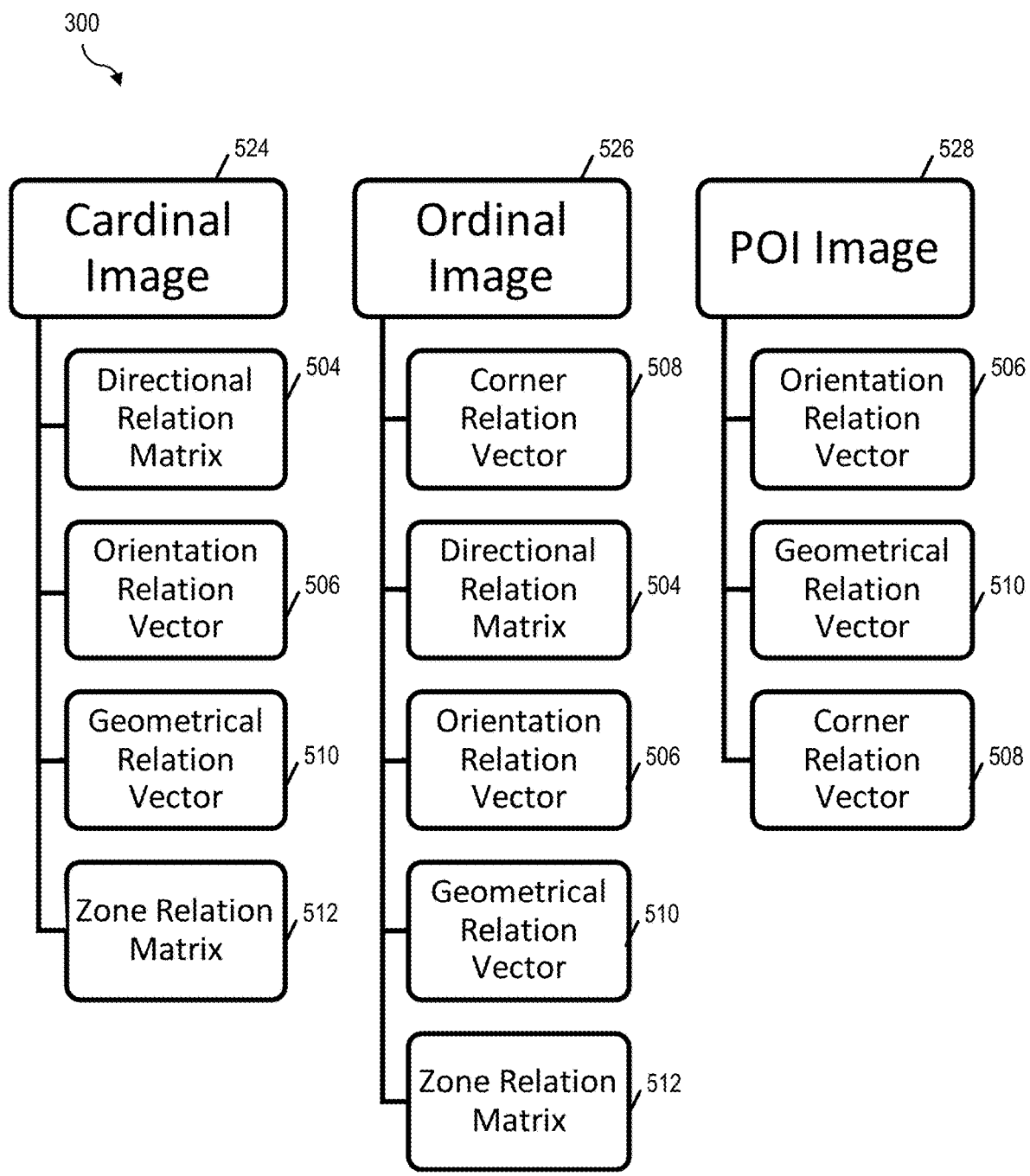
FIG. 5C is a block diagram defining the images for the POI, such as the respective edge based on the relations for the respective edge.

FIG. 5C is a block diagram 540 defining the images for the POI, such as the respective edge based on the relations for the respective edge. As discussed above and further elaborated below with regard to Table 1, the relations may be used as a basis to define the images. For example, the cardinal image 524 may be defined based on any one, any combination or all of: the directional relation matrix 504; the orientation relation vector 506; the geometrical relation vector 510; or the zone relation matrix. The ordinal image 526 may be defined based on any one, any combination or all of: the directional relation matrix 504; the orientation relation vector 506; the corner relation vector 508; the geometrical relation vector 510; or the zone relation matrix. The POI image 528 may be defined based on any one, any combination or all of: the orientation relation vector 506; the corner relation vector 508; or the geometrical relation vector 510.

Figure 6A:
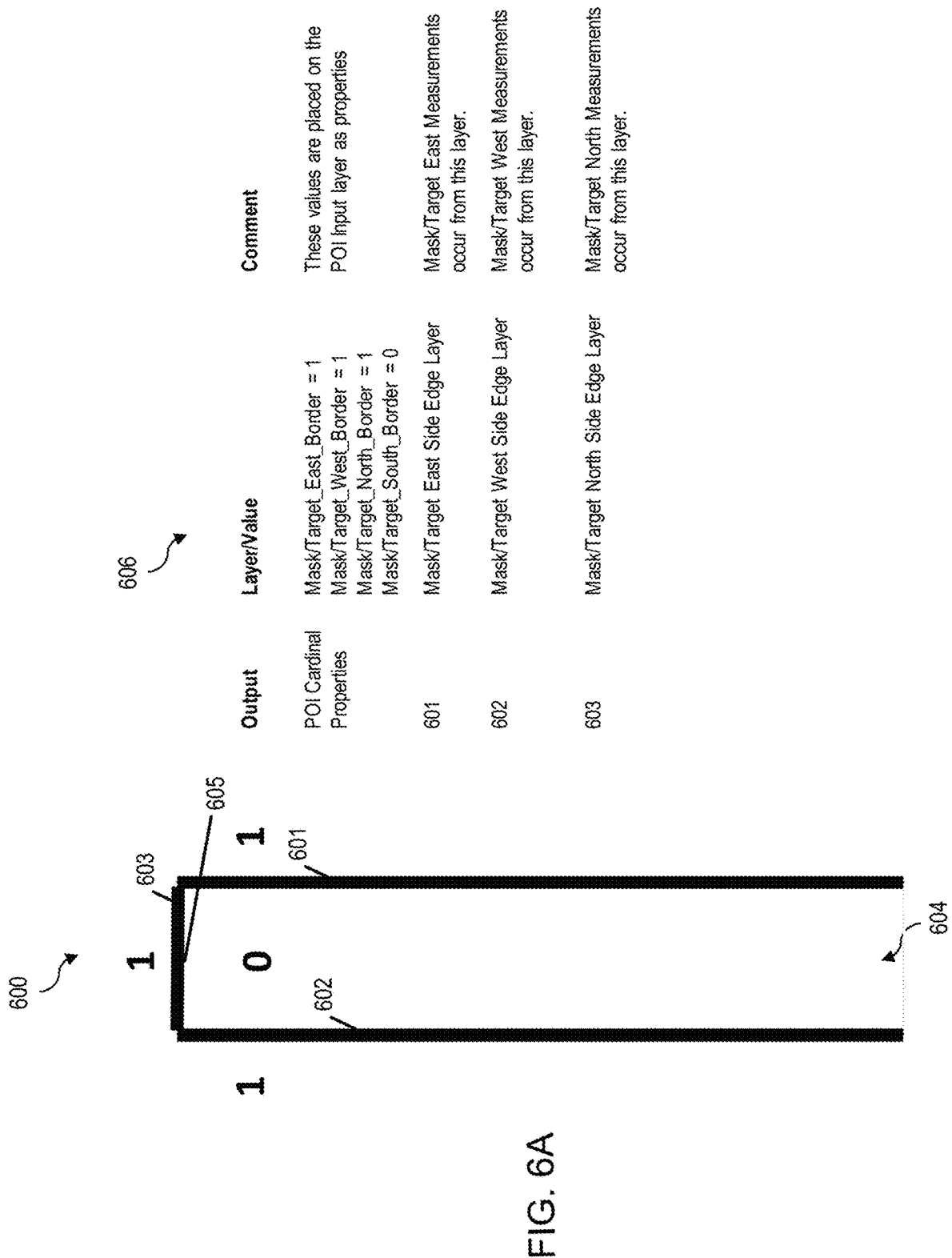
FIG. 6A is a representation of a respective edge and a table illustrating an example of the directional relation matrix for the respective edge.

FIG. 6A is a representation 600 for a respective line edge 605 and a table 606 illustrating an example of the directional relation matrix 504 for the respective edge. For example, the directional relation matrix 504 may describe the border around the POI (such as a line edge 605) in one or more predetermined directions, such as cardinal directions (e.g., north/east/west/south), to a polygon or a space type. As shown in FIG. 6A, mask/target_east_border has a property of "1", meaning that an edge is present to the east side, mask/target_west_border has a property of "1", meaning that an edge is present to the west side, mask/target_north_border has a property of "1", meaning that an edge is present to the north side, and mask/target_south_border has a property of "0", meaning that an edge is not present to the south side. In contrast, if the polygon were rotated 180 degrees, the mask/target_north_border would have a property of "0", meaning that no edge is present to the north side, and mask/target_south_border would have a property of "1", meaning that an edge is present to the south side. These parameters are illustrated in the table below. Further, Mask/Target East Side Edge Layer 601, Mask/Target West Side Edge Layer 602, and Mask/Target North Side Edge Layer 603 are respective east, west, and north side measurements.

The orientation relation vector may be indicative of the orientation (such as horizontal or vertical) of an edge or a polygon, which is illustrated below with regard to FIGS. 7A-E.

Figure 6B:
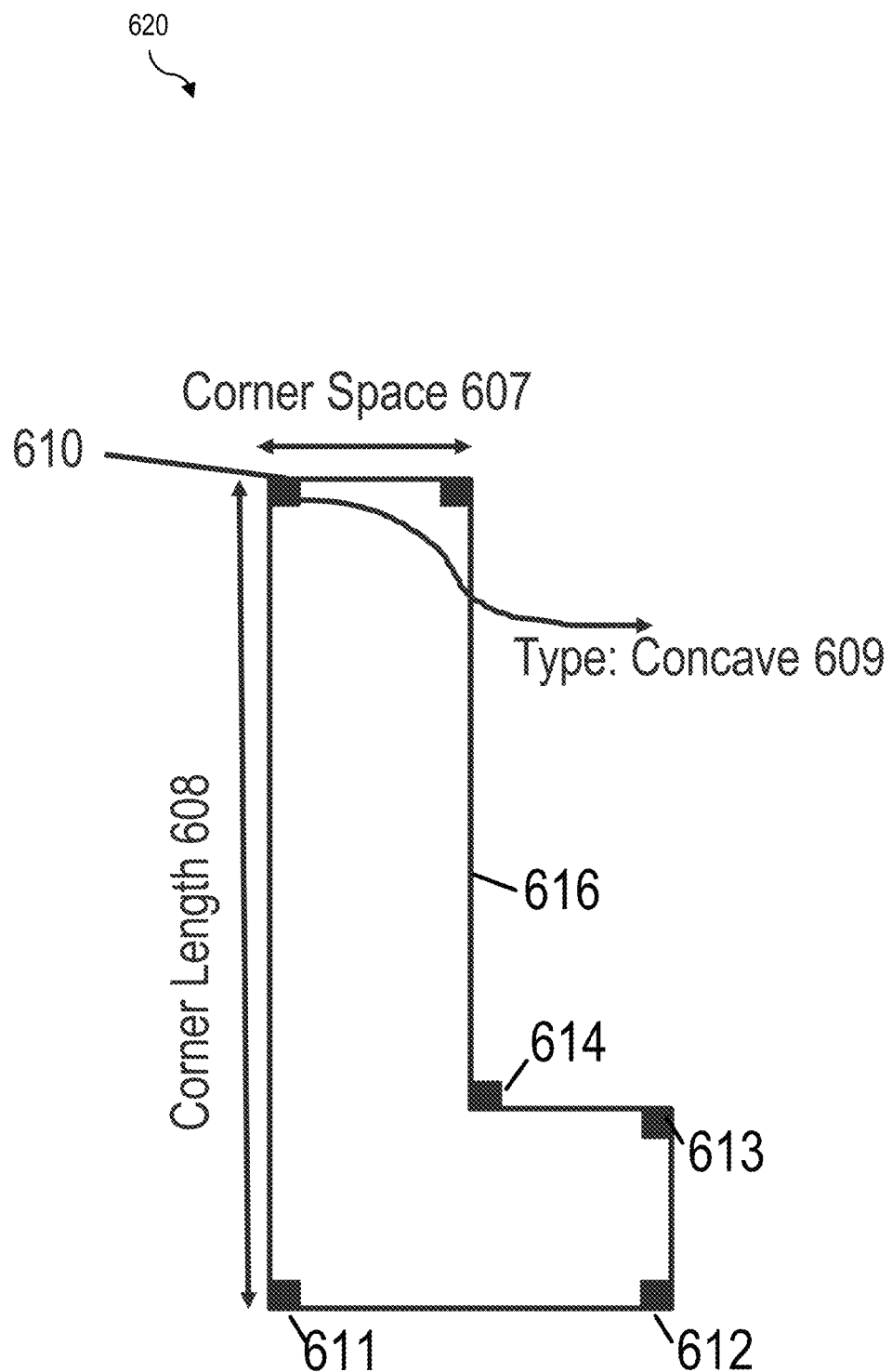
FIG. 6B illustrates an example of the corner relation vector for the respective edge.

FIG. 6B illustrates an example 620 of the corner relation vector 508 for the respective edge. As shown, one, some, or all of the following may be used for the corner relation vector 508 for the respective edge: corner space 607; corner length 608; or corner type 609 (e.g., convex or concave, with FIG. 6B illustrating concave). Various corners 610, 611, 612, 613, 614, 615 for a polygon 616 may be used to define the corner relation vector 508.

Figure 6C:
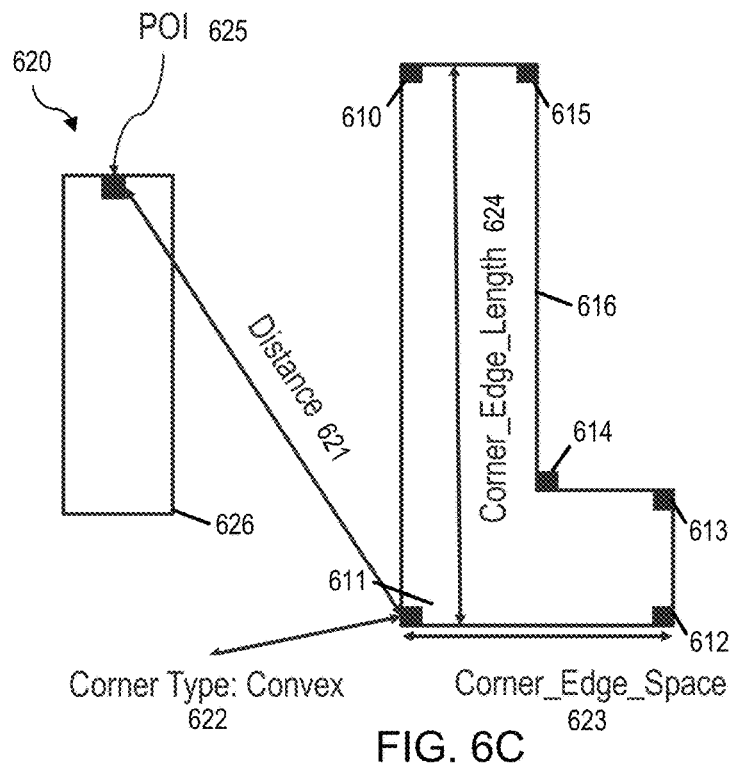
FIGS. 6C-D illustrates an example of the geometrical relation vector with regard to the POI relative to an external polygon and with regard to the polygon at which the POI resides (the resident polygon) relative to the external polygon.
Figure 6D:
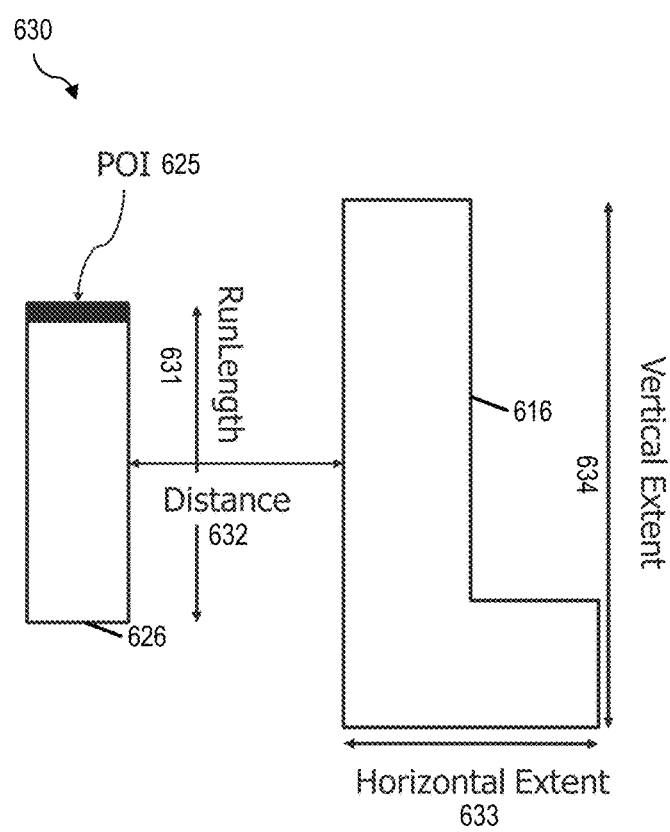

FIGS. 6C-D illustrates an example of the geometrical relation vector 510 with regard to the POI relative to an external polygon (FIG. 6C) and with regard to the polygon at which the POI resides (the resident polygon 626) relative to the external polygon 616 (FIG. 6D). In particular, FIG. 6C is an illustration 620 of the geometrical relation vector 510 with regard to the POI relative to an external polygon 616, which may include any one, any combination, or all of: the distance 621 between the POI 625 and a corner (such as corner 611 on polygon 616); corner type 622 (e.g., concave or convex, with FIG. 6C illustrating convex); corner_edge_space 623; or corner_edge_length 624. FIG. 6D is an illustration 630 of the geometrical relation vector 510 for the resident polygon 626, which may include any one, any combination, or all of: the runlength 631 common between the resident polygon 626 and the external polygon 616; distance 632 between the resident polygon 626 and the external polygon 616; horizontal extent 633 of the external polygon 616; or vertical extent 634 of the external polygon.

Figure 6E:
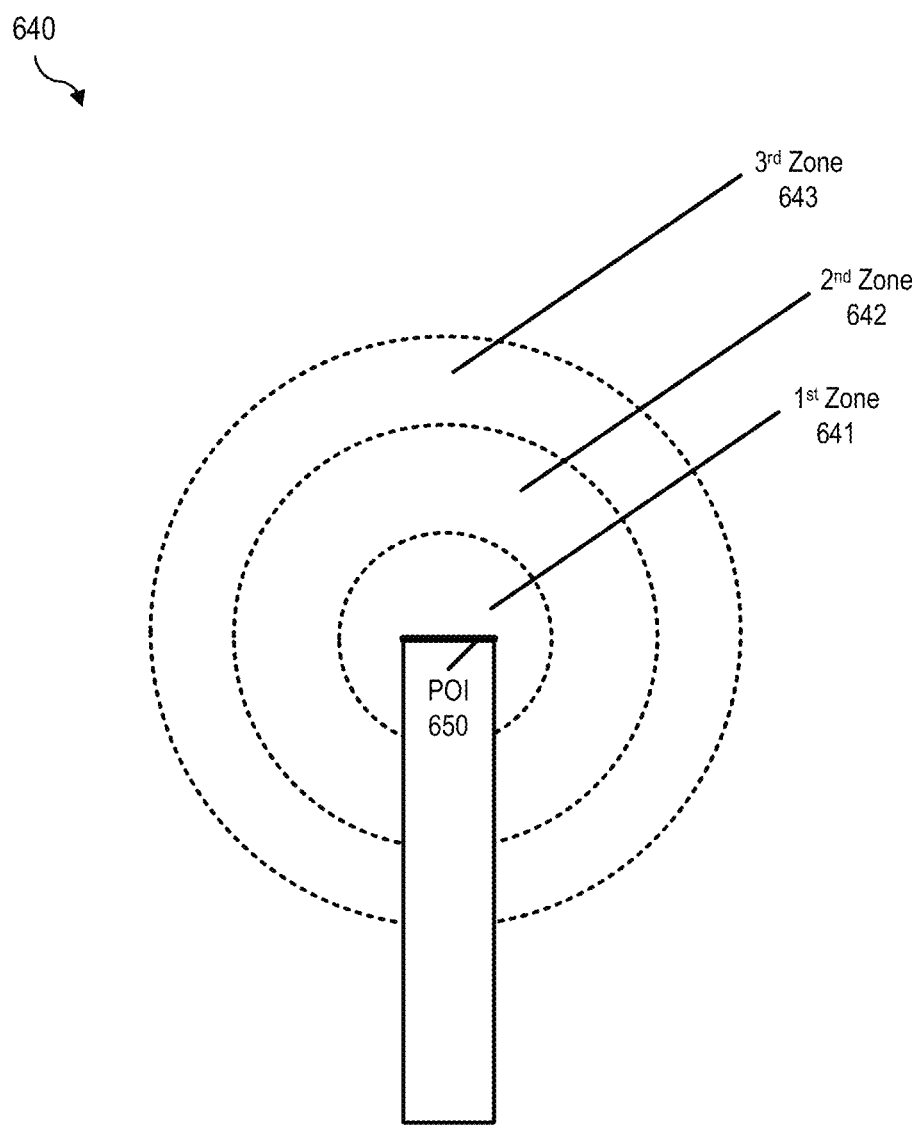
FIG. 6E illustrates an example of the zone relation matrix for the respective edge.

FIG. 6E illustrates an example 640 of the zone relation matrix 512 for the respective POI 650. FIG. 6E shows, merely by way of example, three zones, including a $1^{st}$ zone 641, a $2^{nd}$ zone 642, and a $3^{rd}$ zone 643. It is contemplated that the layout may be defined based on one or more zones, such as at least two zones, at least three zones, at least four zones, at least five zones, at least six zones, at least seven zones, at least eight zones, at least nine zones, at least ten zones, at least twenty zones, at least thirty zones, at least forty zones, at least fifty zones, etc. The different zones may be used to create images (such as a specific type of image) for the respective zones. As one example, a zoning module configured to create a $1^{st}$ zone cardinal image, a $2^{nd}$ zone cardinal image, etc. Alternatively, or in addition, the zoning module is configured to create a $1^{st}$ zone ordinal image, a $2^{nd}$ zone ordinal image, etc.

As discussed above, various information may be associated with the cardinal image, the ordinal image and the POI image. One example is illustrated in the table below:

TABLE 1

| | Per Mask Properties | Target Properties |
|---|---|---|
| Cardinal Image | Mask_East_Border | Target_East_Border |
| | Mask_West_Border | Target_West_Border |
| | Mask_North_Border | Target_North_Border |
| | Mask_South_Border | Target_South_Border |
| | Mask_East_Zone_3 | Target_East_Zone_3 |
| | Mask_East_Zone_2 | Target_East_Zone_2 |
| | Mask_East_Zone_1 | Target_East_Zone_1 |
| | Mask_East_Distance_3 | Target_East_Distance_3 |
| | Mask_East_Distance_2 | Target_East_Distance_2 |
| | Mask_East_Distance_1 | Target_East_Distance_1 |
| | Mask_East_RunLength_3 | Target_East_RunLength_3 |
| | Mask_East_RunLength_2 | Target_East_RunLength_2 |
| | Mask_East_RunLength_1 | Target_East_RunLength_1 |
| | Mask_East_Area_3 | Target_East_Area_3 |
| | Mask_East_Area_2 | Target_East_Area_2 |
| | Mask_East_Area_1 | Target_East_Area_1 |
| | Mask_East_Perimeter_3 | Target_East_Perimeter_3 |
| | Mask_East_Perimeter_2 | Target_East_Perimeter_2 |
| | Mask_East_Perimeter_1 | Target_East_Perimeter_1 |
| | Mask_East_Orientation_3 | Target_East_Orientation_3 |
| | Mask_East_Orientation_2 | Target_East_Orientation_2 |
| | Mask_East_Orientation_1 | Target_East_Orientation_1 |
| | Mask_East_Vertex_Count_3 | Target_East_Vertex_Count_3 |
| | Mask_East_Vertex_Count_2 | Target_East_Vertex_Count_2 |
| | Mask_East_Vertex_Count_1 | Target_East_Vertex_Count_1 |
| | Mask_East_Hor_Extent_3 | Target_East_Hor_Extent_3 |
| | Mask_East_Hor_Extent_2 | Target_East_Hor_Extent_2 |
| | Mask_East_Hor_Extent_1 | Target_East_Hor_Extent_1 |
| | Mask_East_Ver_Extent_3 | Target_East_Ver_Extent_3 |
| | Mask_East_Ver_Extent_2 | Target_East_Ver_Extent_2 |
| | Mask_East_Ver_Extent_1 | Target_East_Ver_Extent_1 |
| | Mask_West_Zone_3 | Target_West_Zone_3 |
| | Mask_West_Zone_2 | Target_West_Zone_2 |
| | Mask_West_Zone_1 | Target_West_Zone_1 |
| | Mask_West_Distance_3 | Target_West_Distance_3 |
| | Mask_West_Distance_2 | Target_West_Distance_2 |
| | Mask_West_Distance_1 | Target_West_Distance_1 |
| | Mask_West_RunLength_3 | Target_West_RunLength_3 |
| | Mask_West_RunLength_2 | Target_West_RunLength_2 |
| | Mask_West_RunLength_1 | Target_West_RunLength_1 |
| | Mask_West_Area_3 | Target_West_Area_3 |
| | Mask_West_Area_2 | Target_West_Area_2 |
| | Mask_West_Area_1 | Target_West_Area_1 |
| | Mask_West_Perimeter_3 | Target_West_Perimeter_3 |
| | Mask_West_Perimeter_2 | Target_West_Perimeter_2 |
| | Mask_West_Perimeter_1 | Target_West_Perimeter_1 |

TABLE 1-continued

| | | Per Mask Properties | Target Properties |
|---|---|---|---|
| | | Mask_West_Orientation_3 | Target_West_Orientation_3 |
| | | Mask_West_Orientation_2 | Target_West_Orientation_2 |
| | | Mask_West_Orientation_1 | Target_West_Orientation_1 |
| | | Mask_West_Vertex_Count_3 | Target_West_Vertex_Count_3 |
| | | Mask_West_Vertex_Count_2 | Target_West_Vertex_Count_2 |
| | | Mask_West_Vertex_Count_1 | Target_West_Vertex_Count_1 |
| | | Mask_West_Hor_Extent_3 | Target_West_Hor_Extent_3 |
| | | Mask_West_Hor_Extent_2 | Target_West_Hor_Extent_2 |
| | | Mask_West_Hor_Extent_1 | Target_West_Hor_Extent_1 |
| | | Mask_West_Ver_Extent_3 | Target_West_Ver_Extent_3 |
| | | Mask_West_Ver_Extent_2 | Target_West_Ver_Extent_2 |
| | | Mask_West_Ver_Extent_1 | Target_West_Ver_Extent_1 |
| | | Mask_North_Zone_3 | Target_North_Zone_3 |
| | | Mask_North_Zone_2 | Target_North_Zone_2 |
| | | Mask_North_Zone_1 | Target_North_Zone_1 |
| | | Mask_North_Distance_3 | Target_North_Distance_3 |
| | | Mask_North_Distance_2 | Target_North_Distance_2 |
| | | Mask_North_Distance_1 | Target_North_Distance_1 |
| | | Mask_North_RunLength_3 | Target_North_RunLength_3 |
| | | Mask_North_RunLength_2 | Target_North_RunLength_2 |
| | | Mask_North_RunLength_1 | Target_North_RunLength_1 |
| | | Mask_North_Area_3 | Target_North_Area_3 |
| | | Mask_North_Area_2 | Target_North_Area_2 |
| | | Mask_North_Area_1 | Target_North_Area_1 |
| | | Mask_North_Perimeter_3 | Target_North_Perimeter_3 |
| | | Mask_North_Perimeter_2 | Target_North_Perimeter_2 |
| | | Mask_North_Perimeter_1 | Target_North_Perimeter_1 |
| | | Mask_North_Orientation_3 | Target_North_Orientation_3 |
| | | Mask_North_Orientation_2 | Target_North_Orientation_2 |
| | | Mask_North_Orientation_1 | Target_North_Orientation_1 |
| | | Mask_North_Vertex_Count_3 | Target_North_Vertex_Count_3 |
| | | Mask_North_Vertex_Count_2 | Target_North_Vertex_Count_2 |
| | | Mask_North_Vertex_Count_1 | Target_North_Vertex_Count_1 |
| | | Mask_North_Hor_Extent_3 | Target_North_Hor_Extent_3 |
| | | Mask_North_Hor_Extent_2 | Target_North_Hor_Extent_2 |
| | | Mask_North_Hor_Extent_1 | Target_North_Hor_Extent_1 |
| | | Mask_North_Ver_Extent_3 | Target_North_Ver_Extent_3 |
| | | Mask_North_Ver_Extent_2 | Target_North_Ver_Extent_2 |
| | | Mask_North_Ver_Extent_1 | Target_North_Ver_Extent_1 |
| | | Mask_South_Zone_3 | Target_South_Zone_3 |
| | | Mask_South_Zone_2 | Target_South_Zone_2 |
| | | Mask_South_Zone_1 | Target_South_Zone_1 |
| | | Mask_South_Distance_3 | Target_South_Distance_3 |
| | | Mask_South_Distance_2 | Target_South_Distance_2 |
| | | Mask_South_Distance_1 | Target_South_Distance_1 |
| | | Mask_South_RunLength_3 | Target_South_RunLength_3 |
| | | Mask_South_RunLength_2 | Target_South_RunLength_2 |
| | | Mask_South_RunLength_1 | Target_South_RunLength_1 |
| | | Mask_South_Area_3 | Target_South_Area_3 |
| | | Mask_South_Area_2 | Target_South_Area_2 |
| | | Mask_South_Area_1 | Target_South_Area_1 |
| | | Mask_South_Perimeter_3 | Target_South_Perimeter_3 |
| | | Mask_South_Perimeter_2 | Target_South_Perimeter_2 |
| | | Mask_South_Perimeter_1 | Target_South_Perimeter_1 |
| | | Mask_South_Orientation_3 | Target_South_Orientation_3 |
| | | Mask_South_Orientation_2 | Target_South_Orientation_2 |
| | | Mask_South_Orientation_1 | Target_South_Orientation_1 |
| | | Mask_South_Vertex_Count_3 | Target_South_Vertex_Count_3 |
| | | Mask_South_Vertex_Count_2 | Target_South_Vertex_Count_2 |
| | | Mask_South_Vertex_Count_1 | Target_South_Vertex_Count_1 |
| | | Mask_South_Hor_Extent_3 | Target_South_Hor_Extent_3 |
| | | Mask_South_Hor_Extent_2 | Target_South_Hor_Extent_2 |
| | | Mask_South_Hor_Extent_1 | Target_South_Hor_Extent_1 |
| | | Mask_South_Ver_Extent_3 | Target_South_Ver_Extent_3 |
| | | Mask_South_Ver_Extent_2 | Target_South_Ver_Extent_2 |
| | | Mask_South_Ver_Extent_1 | Target_South_Ver_Extent_1 |
| Ordinal Image | Self-Ordinal Image | Mask_Self_NE_Zone_1 | Target_Self_NE_Zone_1 |
| | | Mask_Self_NE_Zone_2 | Target_Self_NE_Zone_2 |
| | | Mask_Self_NE_Zone_3 | Target_Self_NE_Zone_3 |
| | | Mask_Self_NE_Distance_3 | Target_Self_NE_Distance_3 |
| | | Mask_Self_NE_Distance_2 | Target_Self_NE_Distance_2 |
| | | Mask_Self_NE_Distance_1 | Target_Self_NE_Distance_1 |
| | | Mask_Self_NE_Corner_Type_3 | Target_Self_NE_Corner_Type_3 |
| | | Mask_Self_NE_Corner_Type_2 | Target_Self_NE_Corner_Type_2 |
| | | Mask_Self_NE_Corner_Type_1 | Target_Self_NE_Corner_Type_1 |
| | | Mask_Self_NE_Corner_Edge_Length_3 | Target_Self_NE_Corner_Edge_Length_3 |
| | | Mask_Self_NE_Corner_Edge_Length_2 | Target_Self_NE_Corner_Edge_Length_2 |
| | | Mask_Self_NE_Corner_Edge_Length_1 | Target_Self_NE_Corner_Edge_Length_1 |

TABLE 1-continued

| | Per Mask Properties | Target Properties |
|---|---|---|
| | Mask_Self_NE_Corner_Edge_Space_3 | Target_Self_NE_Corner_Edge_Space_3 |
| | Mask_Self_NE_Corner_Edge_Space_2 | Target_Self_NE_Corner_Edge_Space_2 |
| | Mask_Self_NE_Corner_Edge_Space_1 | Target_Self_NE_Corner_Edge_Space_1 |
| | Mask_Self_SE_Zone_1 | Target_Self_SE_Zone_1 |
| | Mask_Self_SE_Zone_2 | Target_Self_SE_Zone_2 |
| | Mask_Self_SE_Zone_3 | Target_Self_SE_Zone_3 |
| | Mask_Self_SE_Distance_3 | Target_Self_SE_Distance_3 |
| | Mask_Self_SE_Distance_2 | Target_Self_SE_Distance_2 |
| | Mask_Self_SE_Distance_1 | Target_Self_SE_Distance_1 |
| | Mask_Self_SE_Corner_Type_3 | Target_Self_SE_Corner_Type_3 |
| | Mask_Self_SE_Corner_Type_2 | Target_Self_SE_Corner_Type_2 |
| | Mask_Self_SE_Corner_Type_1 | Target_Self_SE_Corner_Type_1 |
| | Mask_Self_SE_Corner_Edge_Length_3 | Target_Self_SE_Corner_Edge_Length_3 |
| | Mask_Self_SE_Corner_Edge_Length_2 | Target_Self_SE_Corner_Edge_Length_2 |
| | Mask_Self_SE_Corner_Edge_Length_1 | Target_Self_SE_Corner_Edge_Length_1 |
| | Mask_Self_SE_Corner_Edge_Space_3 | Target_Self_SE_Corner_Edge_Space_3 |
| | Mask_Self_SE_Corner_Edge_Space_2 | Target_Self_SE_Corner_Edge_Space_2 |
| | Mask_Self_SE_Corner_Edge_Space_1 | Target_Self_SE_Corner_Edge_Space_1 |
| | Mask_Self_NW_Zone_1 | Target_Self_NW_Zone_1 |
| | Mask_Self_NW_Zone_2 | Target_Self_NW_Zone_2 |
| | Mask_Self_NW_Zone_3 | Target_Self_NW_Zone_3 |
| | Mask_Self_NW_Distance_3 | Target_Self_NW_Distance_3 |
| | Mask_Self_NW_Distance_2 | Target_Self_NW_Distance_2 |
| | Mask_Self_NW_Distance_1 | Target_Self_NW_Distance_1 |
| | Mask_Self_NW_Corner_Type_3 | Target_Self_NW_Corner_Type_3 |
| | Mask_Self_NW_Corner_Type_2 | Target_Self_NW_Corner_Type_2 |
| | Mask_Self_NW_Corner_Type_1 | Target_Self_NW_Corner_Type_1 |
| | Mask_Self_NW_Corner_Edge_Length_3 | Target_Self_NW_Corner_Edge_Length_3 |
| | Mask_Self_NW_Corner_Edge_Length_2 | Target_Self_NW_Corner_Edge_Length_2 |
| | Mask_Self_NW_Corner_Edge_Length_1 | Target_Self_NW_Corner_Edge_Length_1 |
| | Mask_Self_NW_Corner_Edge_Space_3 | Target_Self_NW_Corner_Edge_Space_3 |
| | Mask_Self_NW_Corner_Edge_Space_2 | Target_Self_NW_Corner_Edge_Space_2 |
| | Mask_Self_NW_Corner_Edge_Space_1 | Target_Self_NW_Corner_Edge_Space_1 |
| | Mask_Self_SW_Zone_1 | Target_Self_SW_Zone_1 |
| | Mask_Self_SW_Zone_2 | Target_Self_SW_Zone_2 |
| | Mask_Self_SW_Zone_3 | Target_Self_SW_Zone_3 |
| | Mask_Self_SW_Distance_3 | Target_Self_SW_Distance_3 |
| | Mask_Self_SW_Distance_2 | Target_Self_SW_Distance_2 |
| | Mask_Self_SW_Distance_1 | Target_Self_SW_Distance_1 |
| | Mask_Self_SW_Corner_Type_3 | Target_Self_SW_Corner_Type_3 |
| | Mask_Self_SW_Corner_Type_2 | Target_Self_SW_Corner_Type_2 |
| | Mask_Self_SW_Corner_Type_1 | Target_Self_SW_Corner_Type_1 |
| | Mask_Self_SW_Corner_Edge_Length_3 | Target_Self_SW_Corner_Edge_Length_3 |
| | Mask_Self_SW_Corner_Edge_Length_2 | Target_Self_SW_Corner_Edge_Length_2 |
| | Mask_Self_SW_Corner_Edge_Length_1 | Target_Self_SW_Corner_Edge_Length_1 |
| | Mask_Self_SW_Corner_Edge_Space_3 | Target_Self_SW_Corner_Edge_Space_3 |
| | Mask_Self_SW_Corner_Edge_Space_2 | Target_Self_SW_Corner_Edge_Space_2 |
| | Mask_Self_SW_Corner_Edge_Space_1 | Target_Self_SW_Corner_Edge_Space_1 |
| Outer-Ordinal Image | Mask_Outer_NE_Zone_1 | Target_Outer_NE_Zone_1 |
| | Mask_Outer_NE_Zone_2 | Target_Outer_NE_Zone_2 |
| | Mask_Outer_NE_Zone_3 | Target_Outer_NE_Zone_3 |
| | Mask_Outer_NE_Distance_3 | Target_Outer_NE_Distance_3 |
| | Mask_Outer_NE_Distance_2 | Target_Outer_NE_Distance_2 |
| | Mask_Outer_NE_Distance_1 | Target_Outer_NE_Distance_1 |
| | Mask_Outer_NE_Corner_Type_3 | Target_Outer_NE_Corner_Type_3 |
| | Mask_Outer_NE_Corner_Type_2 | Target_Outer_NE_Corner_Type_2 |
| | Mask_Outer_NE_Corner_Type_1 | Target_Outer_NE_Corner_Type_1 |
| | Mask_Outer_NE_Corner_Edge_Length_3 | Target_Outer_NE_Corner_Edge_Length_3 |
| | Mask_Outer_NE_Corner_Edge_Length_2 | Target_Outer_NE_Corner_Edge_Length_2 |
| | Mask_Outer_NE_Corner_Edge_Length_1 | Target_Outer_NE_Corner_Edge_Length_1 |
| | Mask_Outer_NE_Corner_Edge_Space_3 | Target_Outer_NE_Corner_Edge_Space_3 |
| | Mask_Outer_NE_Corner_Edge_Space_2 | Target_Outer_NE_Corner_Edge_Space_2 |
| | Mask_Outer_NE_Corner_Edge_Space_1 | Target_Outer_NE_Corner_Edge_Space_1 |
| | Mask_Outer_SE_Zone_1 | Target_Outer_SE_Zone_1 |
| | Mask_Outer_SE_Zone_2 | Target_Outer_SE_Zone_2 |
| | Mask_Outer_SE_Zone_3 | Target_Outer_SE_Zone_3 |
| | Mask_Outer_SE_Distance_3 | Target_Outer_SE_Distance_3 |
| | Mask_Outer_SE_Distance_2 | Target_Outer_SE_Distance_2 |
| | Mask_Outer_SE_Distance_1 | Target_Outer_SE_Distance_1 |
| | Mask_Outer_SE_Corner_Type_3 | Target_Outer_SE_Corner_Type_3 |
| | Mask_Outer_SE_Corner_Type_2 | Target_Outer_SE_Corner_Type_2 |
| | Mask_Outer_SE_Corner_Type_1 | Target_Outer_SE_Corner_Type_1 |
| | Mask_Outer_SE_Corner_Edge_Length_3 | Target_Outer_SE_Corner_Edge_Length_3 |
| | Mask_Outer_SE_Corner_Edge_Length_2 | Target_Outer_SE_Corner_Edge_Length_2 |
| | Mask_Outer_SE_Corner_Edge_Length_1 | Target_Outer_SE_Corner_Edge_Length_1 |
| | Mask_Outer_SE_Corner_Edge_Space_3 | Target_Outer_SE_Corner_Edge_Space_3 |
| | Mask_Outer_SE_Corner_Edge_Space_2 | Target_Outer_SE_Corner_Edge_Space_2 |
| | Mask_Outer_SE_Corner_Edge_Space_1 | Target_Outer_SE_Corner_Edge_Space_1 |

TABLE 1-continued

| Per Mask Properties | Target Properties |
|---|---|
| Mask_Outer_NW_Zone_1 | Target_Outer_NW_Zone_1 |
| Mask_Outer_NW_Zone_2 | Target_Outer_NW_Zone_2 |
| Mask_Outer_NW_Zone_3 | Target_Outer_NW_Zone_3 |
| Mask_Outer_NW_Distance_3 | Target_Outer_NW_Distance_3 |
| Mask_Outer_NW_Distance_2 | Target_Outer_NW_Distance_2 |
| Mask_Outer_NW_Distance_1 | Target_Outer_NW_Distance_1 |
| Mask_Outer_NW_Corner_Type_3 | Target_Outer_NW_Corner_Type_3 |
| Mask_Outer_NW_Corner_Type_2 | Target_Outer_NW_Corner_Type_2 |
| Mask_Outer_NW_Corner_Type_1 | Target_Outer_NW_Corner_Type_1 |
| Mask_Outer_NW_Corner_Edge_Length_3 | Target_Outer_NW_Corner_Edge_Length_3 |
| Mask_Outer_NW_Corner_Edge_Length_2 | Target_Outer_NW_Corner_Edge_Length_2 |
| Mask_Outer_NW_Corner_Edge_Length_1 | Target_Outer_NW_Corner_Edge_Length_1 |
| Mask_Outer_NW_Corner_Edge_Space_3 | Target_Outer_NW_Corner_Edge_Space_3 |
| Mask_Outer_NW_Corner_Edge_Space_2 | Target_Outer_NW_Corner_Edge_Space_2 |
| Mask_Outer_NW_Corner_Edge_Space_1 | Target_Outer_NW_Corner_Edge_Space_1 |
| Mask_Outer_SW_Zone_1 | Target_Outer_SW_Zone_1 |
| Mask_Outer_SW_Zone_2 | Target_Outer_SW_Zone_2 |
| Mask_Outer_SW_Zone_3 | Target_Outer_SW_Zone_3 |
| Mask_Outer_SW_Distance_3 | Target_Outer_SW_Distance_3 |
| Mask_Outer_SW_Distance_2 | Target_Outer_SW_Distance_2 |
| Mask_Outer_SW_Distance_1 | Target_Outer_SW_Distance_1 |
| Mask_Outer_SW_Corner_Type_3 | Target_Outer_SW_Corner_Type_3 |
| Mask_Outer_SW_Corner_Type_2 | Target_Outer_SW_Corner_Type_2 |
| Mask_Outer_SW_Corner_Type_1 | Target_Outer_SW_Corner_Type_1 |
| Mask_Outer_SW_Corner_Edge_Length_3 | Target_Outer_SW_Corner_Edge_Length_3 |
| Mask_Outer_SW_Corner_Edge_Length_2 | Target_Outer_SW_Corner_Edge_Length_2 |
| Mask_Outer_SW_Corner_Edge_Length_1 | Target_Outer_SW_Corner_Edge_Length_1 |
| Mask_Outer_SW_Corner_Edge_Space_3 | Target_Outer_SW_Corner_Edge_Space_3 |
| Mask_Outer_SW_Corner_Edge_Space_2 | Target_Outer_SW_Corner_Edge_Space_2 |
| Mask_Outer_SW_Corner_Edge_Space_1 | Target_Outer_SW_Corner_Edge_Space_1 |
| POI Image / POI_Width | |
| POI_Orientation | |
| Mask_Vertex_Count | Target_Vertex_Count |
| Mask_Total_Length | Target_Total_Length |
| Mask_Length | Target_Length |
| Mask_Concave_Count | Target_Concave_Count |
| Mask_Convex_Count | Target_Convex_Count |
| Mask_Facial_Border | Target_Facial_Border |
| Mask_Facial_Length | Target_Facial_Length |

The information in the Table 1 is merely for example purposes. As discussed above, for one, some, or each edge in the layout design, part or all of Table 1 may be populated with values. Explanations of some of the above properties are as follows:

Mask_East_Zone_1, Mask_East_Zone_2, and Mask_East_Zone_3 relate to whether or not, at a respective mask, there is an external polygon in the east direction in the respective zones (e.g., Mask_East_Zone_1=1 if there is an external polygon at the respective mask level in zone 1). Target_East_Zone_1, Target_East_Zone_2, and Target_East_Zone_3 relate to whether or not, at the target level, there is an external polygon in the east direction in the respective zones (e.g., Target_East_Zone_1=1 if there is an external polygon at the target level in zone 1).

Mask_East_Distance_1, Mask_East_Distance_2, and Mask_East_Distance_3 relate, for a respective mask, to the distance of the POI to the external polygon in the respective zones to the east (e.g., for a respective mask, Mask_East_Distance_1=X nm to polygon in zone 1). Target_East_Distance_1, Target_East_Distance_2, and Target_East_Distance_3 relate, for the target level, to the distance of the POI to the external polygon in the respective zones to the east.

Mask_East_RunLength_1, Mask_East_RunLength_2, and Mask_East_RunLength_3 relate, for a respective mask, to the common runlength between the external polygon and the resident polygon. Target_East_RunLength_1, Target_East_RunLength_2, and Target_East_RunLength_3 relate, for the target level, to the common runlength between the external polygon and the resident polygon. An example of this is illustrated at element 715 in FIG. 7A.

Mask_East_Area_1, Mask_East_Area_2, and Mask_East_Area_3 are the areas, for a respective mask, of the external polygons to the east in zones 1, 2, and 3, respectively. Target_East_Area_1, Target_East_Area_2, and Target_East_Area_3 are the areas, for the target level, of the external polygons to the east in zones 1, 2, and 3, respectively.

Mask_East_Perimeter_1, Mask_East_Perimeter_2, and Mask_East_Perimeter_3 are, for a respective mask, the perimeters of the external polygons to the east in zones 1, 2, and 3, respectively. Target_East_Perimeter_1, Target_East_Perimeter_2, and Target_East_Perimeter_3 are, for the target level, the perimeters of the external polygons to the east in zones 1, 2, and 3, respectively.

Mask_East_Orientation_1, Mask_East_Orientation_2, and Mask_East_Orientation_3 are, for a respective mask, the orientation of the external polygon to the east in zones 1, 2, and 3, respectively. Target_East_Orientation_1, Target_East_Orientation_2, and Target_East_Orientation_3 are, for the target level, the orientation of the external polygon to the east in zones 1, 2, and 3, respectively. An example of this is illustrated at element 708 in FIG. 7A.

Mask_East_Vertex_Count_1, Mask_East_Vertex_Count_2, and Mask_East_Vertex_Count_3 are, for a respective mask, the number of vertices of the external polygon to the east in zones 1, 2, and 3, respectively. Target_East_Vertex_Count_1, Target_East_Vertex_Count_2, and Target_East_Vertex_Count_3 are, for the target level, the number of vertices of the external polygon to the east in zones 1, 2, and 3, respectively.

Mask_East_Hor_Extent_1, Mask_East_Hor_Extent_2, and Mask_East_Hor_Extent_3 are, for a respective mask, are the horizontal extent of the external polygon to the east in zones 1, 2, and 3, respectively. Target_East_Hor_Extent_1, Target_East_Hor_Extent_2, and Target_East_Hor_Extent_3 are, for the target level, are the horizontal extent of the external polygon to the east in zones 1, 2, and 3, respectively. An example of this is illustrated at element 633 in FIG. 6D.

Mask_East_Ver_Extent_1, Mask_East_Ver_Extent_2, and Mask_East_Ver_Extent_3 are, for a respective mask, are the vertical extent of the external polygon to the east in zones 1, 2, and 3, respectively. Target_East_Ver_Extent_1, Target_East_Ver_Extent_2, and Target_East_Ver_Extent_3 are, for the target level, are the vertical extent of the external polygon to the east in zones 1, 2, and 3, respectively. An example of this is illustrated at element 634 in FIG. 6D.

Mask_Self_NE_Zone_1, Mask_Self_NE_Zone_2, and Mask_Self_NE_Zone_3 relate to whether or not, at a respective mask, there is a corner for the resident polygon in the north-east direction in the respective zones (e.g., Mask_Self_NE_Zone_1=1 if there is a corner on the resident polygon at the respective mask level in zone 1). Target_Self_NE_Zone_1, Target_Self_NE_Zone_2, and Target_Self_NE_Zone_3 relate to whether or not, at the target level, there is a corner for the resident polygon in the north-east direction in the respective zones.

Mask_Self_NE_Distance_1, Mask_Self_NE_Distance_2, and Mask_Self_NE_Distance_3 relate, for a respective mask, to the distance of the POI to the corner on the resident polygon in the respective zones to the north-east (e.g., for a respective mask, Mask_Self_NE_Distance_1=Y nm to corner on resident polygon in zone 1).

Mask_Self_NE_Corner_Type_1, Mask_Self_NE_Corner_Type_2, and Mask_Self_NE_Corner_Type_3 relate, for a respective mask, to the corner type (e.g., convex or concave) for a corner on the resident polygon in the north-east direction in the respective zones. Target_Self_NE_Corner_Type_1, Target_Self_NE_Corner_Type_2, and Target_Self_NE_Corner_Type_3 relate, for the target level, to the corner type (e.g., convex or concave) for a corner on the resident polygon in the north-east direction in the respective zones.

Mask_Self_NE_Corner_Edge_Length_1, Mask_Self_NE_Corner_Edge_Length_2, and Mask_Self_NE_Corner_Edge_Length_3 relate, for a respective mask, to edge length (such as illustrated in FIG. 6C at 624) of the resident polygon for the respective zones. Target_Self_NE_Corner_Edge_Length_1, Target_Self_NE_Corner_Edge_Length_2, and Target_Self_NE_Corner_Edge_Length_3 relate, for the target level, to edge length of the resident polygon for the respective zones.

Mask_Self_NE_Corner_Edge_Space_1, Mask_Self_NE_Corner_Edge_Space_2, and Mask_Self_NE_Corner_Edge_Space_3 relate, for a respective mask, to edge width (such as illustrated in FIG. 6C at 623) of the resident polygon for the respective zones. Target_Self_NE_Corner_Edge_Space_1, Target_Self_NE_Corner_Edge_Space_2, and Target_Self_NE_Corner_Edge_Space_3 relate, for the target level, to edge width of the resident polygon for the respective zones.

Similarly, the outer ordinal image (which relates to external polygons) may have similar parameters for one, some, or all of the ordinal directions including any one, any combination, or all of: Mask_Outer_Zone; Target_Outer_Zone; Mask_Outer_Distance; Target_Outer_Distance; Mask_Outer_Corner_Type; Target_Outer_Corner_Type; Mask_Outer_Corner_Edge_Length; Target_Outer_Corner_Edge_Length; Mask_Outer_Corner_Edge_Space; or Target_Outer_Corner_Edge_Space.

Finally, the resident POI may be characterized based on any one, any combination, or all of: POI_Width (width of the POI); POI_Orientation (e.g., horizontal or vertical); Vertex_Count (the number of vertices on the resident polygon, either at the respective mask level or at the target level); Total_Length (e.g., how far does the POI reside from the edge of the resident polygon, either at the respective mask level or at the target level); Length (e.g., distance from the POI to the first vertex on the resident polygon, either at the respective mask level or at the target level); Concave_Count (the number of concave edges in the resident polygon, either at the respective mask level or at the target level); Convex_Count (the number of convex edges in the resident polygon, either at the respective mask level or at the target level); Facial_Border (e.g., the distance from the POI to an external polygon, such as illustrated at element 782 of FIG. 7E, either at the respective mask level or at the target level); or Facial_Length (e.g., the common runlength for the POI and an external polygon, such as illustrated at element 781 of FIG. 7E, either at the respective mask level or at the target level).

In this regard, various entries in Table 1 are described in FIGS. 7A-E. By way of example, one or both of the cardinal image or the POI image may be defined at the mask level or at the target level, as discussed above. Further, various information may be associated with the cardinal image, the ordinal image, and the POI image, as shown in Table 1. Merely by way of example, the cardinal image may include at one or both of the mask level or the target level any one, any combination or all of: whether there is a polygon at the east/west/north/south borders of the POI; the distance of the POI to a polygon in a respective cardinal direction in the different zones (e.g., Mask_East_Distance_3); the area, perimeter, orientation, vertex count for polygons in the different zones. In addition, the ordinal image may include various properties, such as illustrated in Table 1. Other information, in addition to, or instead of the information in t Table 1 may be used to characterize one, some, or all of the cardinal image, the ordinal image, or the POI image.

Figure 7A:
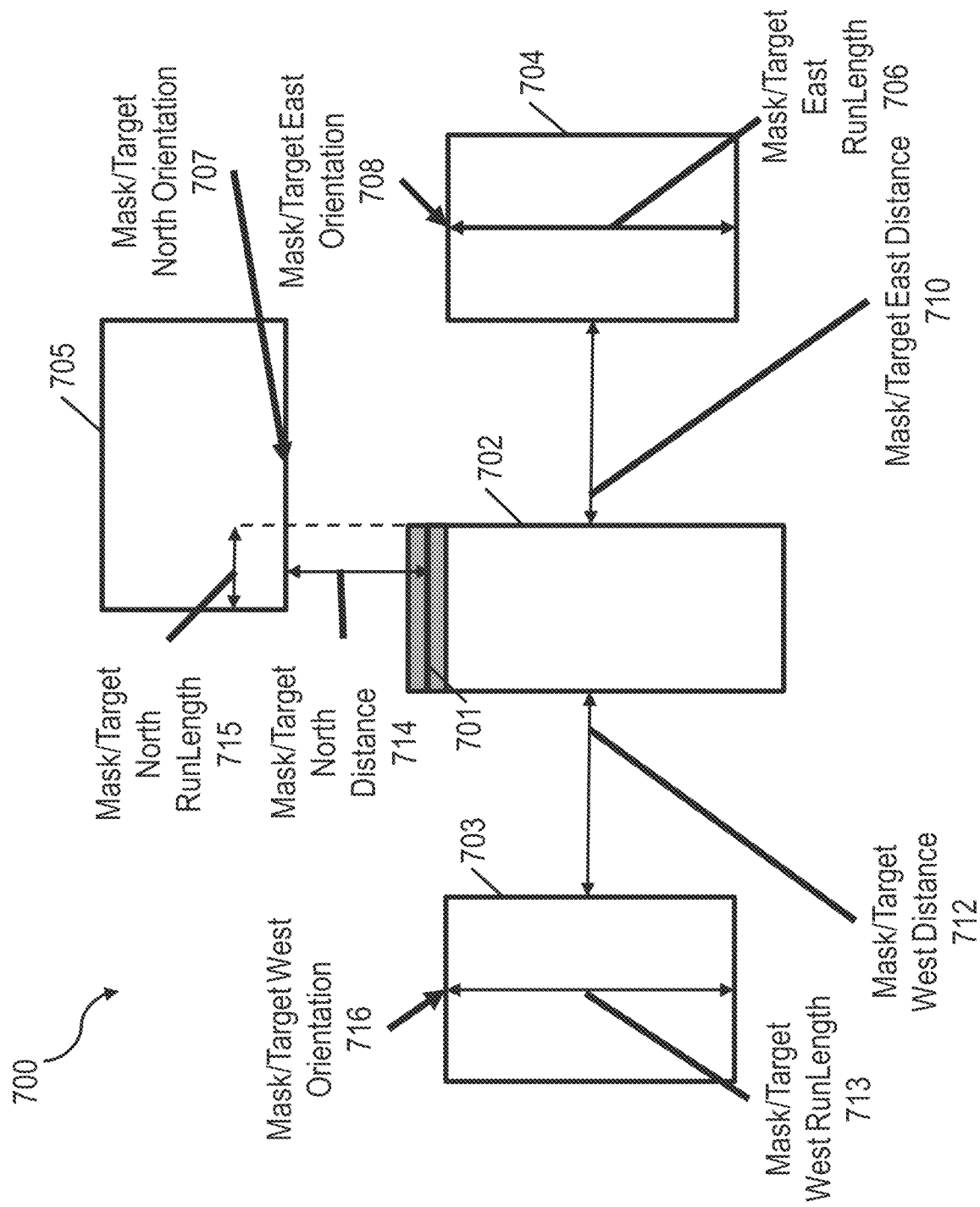
FIGS. 7A-D illustrate block diagrams for defining cardinal images of the line edge relative to external polygons.

FIGS. 7A-D illustrate block diagrams 700, 720, 740, 760 for defining cardinal images of the line edge relative to external polygons. In particular FIG. 7A illustrates block diagram 700 with a POI 701 on resident polygon 702, defining relations with one or more external polygons including north external polygon 705, east external polygon 704, and west external polygon 703. A grey box around line-end POIs 701, 731, 751, 771, 788 highlight the respective POI. For example, resident polygon 702 relative to north external polygon 705 may be defined by any one, any combination, or all of: mask/target north distance 714 between resident polygon 702 and north external polygon 705; mask/target north runlength 715 (defining a common length between resident polygon 702 and north external polygon 705); or mask/target north orientation 707. As another example, resident polygon 702 relative to east external polygon 704 may be defined by any one, any combination, or all of: mask/target east distance 710 between resident polygon 702 and east external polygon 704; mask/target east runlength 706 (defining a common length between resident polygon 702 and east external polygon 704); or mask/target east orientation 708. As still another example, resident polygon 702 relative to west external polygon 703 may be defined by any one, any combination, or all of: mask/target west distance 712 between resident polygon 702 and west external polygon 703; mask/target west runlength 713 (defining a common length between resident polygon 702 and west external polygon 703); or mask/target west orientation 716.

Figure 7B:
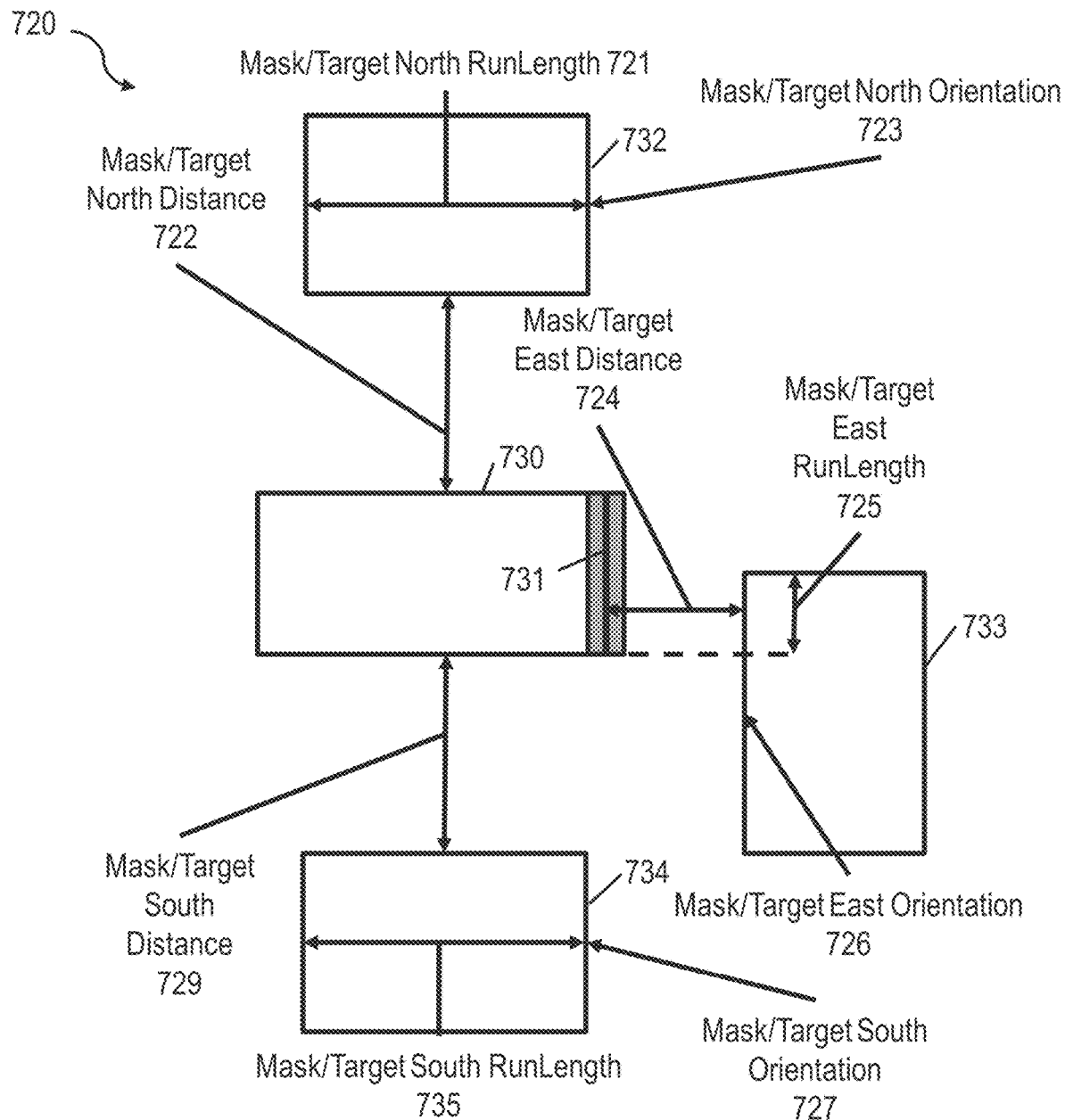

FIG. 7B illustrates block diagram 720 with a POI 731 on resident polygon 730, defining relations with one or more external polygons including north external polygon 732, east external polygon 733, and south external polygon 734. For example, resident polygon 702 relative to north external polygon 732 may be defined by any one, any combination, or all of: mask/target north distance 722 between resident polygon 730 and north external polygon 732; mask/target north runlength 721 (defining a common length between resident polygon 730 and north external polygon 732); or mask/target north orientation 723. As another example, resident polygon 702 relative to east external polygon 733 may be defined by any one, any combination, or all of: mask/target east distance 724 between resident polygon 730 and east external polygon 733; mask/target east runlength 725 (defining a common length between resident polygon 730 and east external polygon 733); or mask/target east orientation 726. As still another example, resident polygon 730 relative to south external polygon 734 may be defined by any one, any combination, or all of: mask/target south distance 729 between resident polygon 730 and south external polygon 734; mask/target south runlength 735 (defining a common length between resident polygon 730 and south external polygon 734); or mask/target south orientation 727.

Figure 7C:
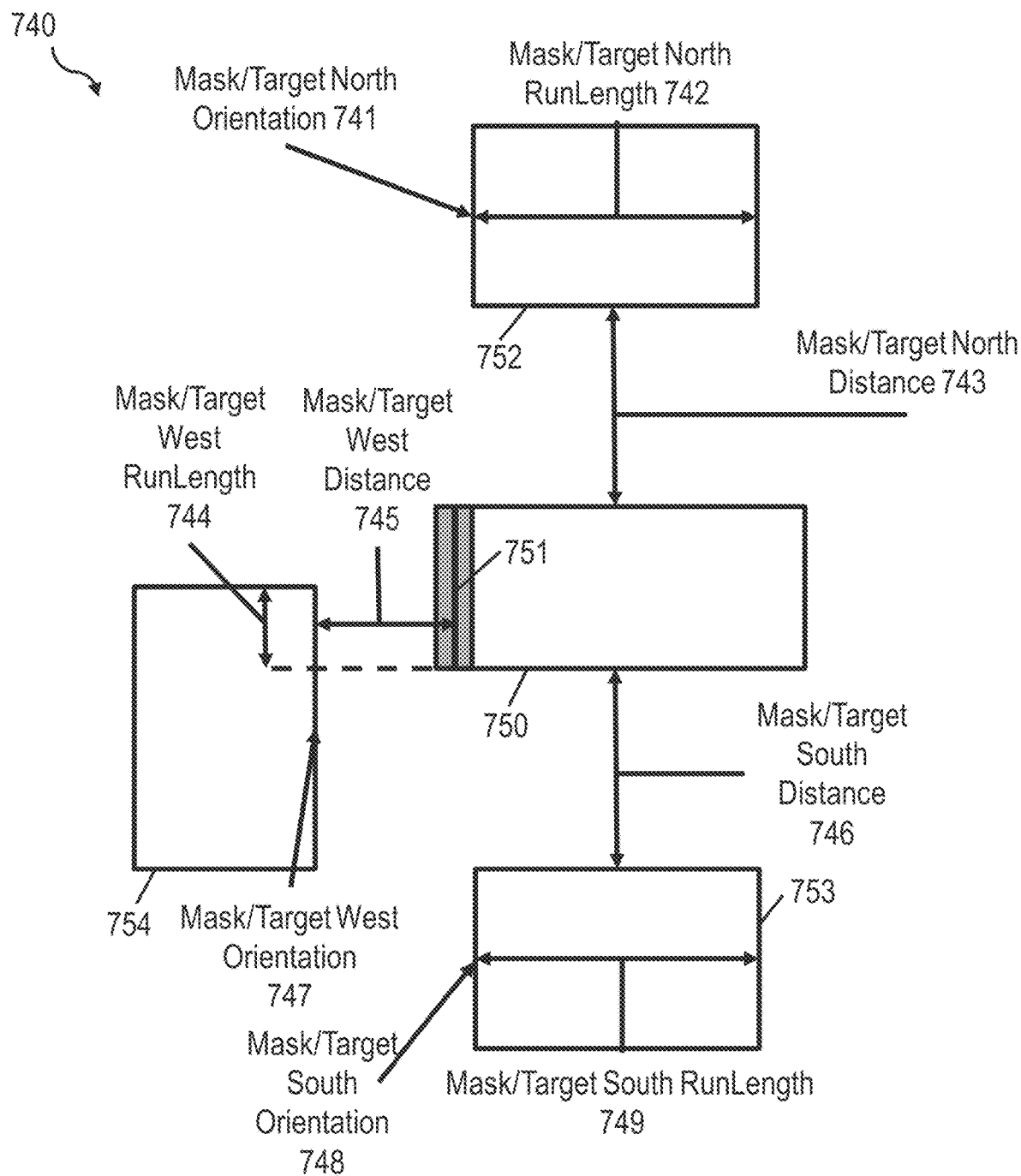

FIG. 7C illustrates block diagram 740 with a POI 751 on resident polygon 750, defining relations with one or more external polygons including north external polygon 752, south external polygon 753, and west external polygon 754. For example, resident polygon 750 relative to north external polygon 752 may be defined by any one, any combination, or all of: mask/target north distance 743 between resident polygon 750 and north external polygon 752; mask/target north runlength 742 (defining a common length between resident polygon 750 and north external polygon 752); or mask/target north orientation 741. As another example, resident polygon 750 relative to south external polygon 753 may be defined by any one, any combination, or all of: mask/target south distance 746 between resident polygon 750 and south external polygon 753; mask/target south runlength 749 (defining a common length between resident polygon 750 and south external polygon 753); or mask/target south orientation 748. As still another example, resident polygon 750 relative to west external polygon 754 may be defined by any one, any combination, or all of: mask/target west mask/target distance 745 between resident polygon 750 and west external polygon 754; mask/target west runlength 744 (defining a common length between resident polygon 750 and west external polygon 754); or mask/target west orientation 747.

Figure 7D:
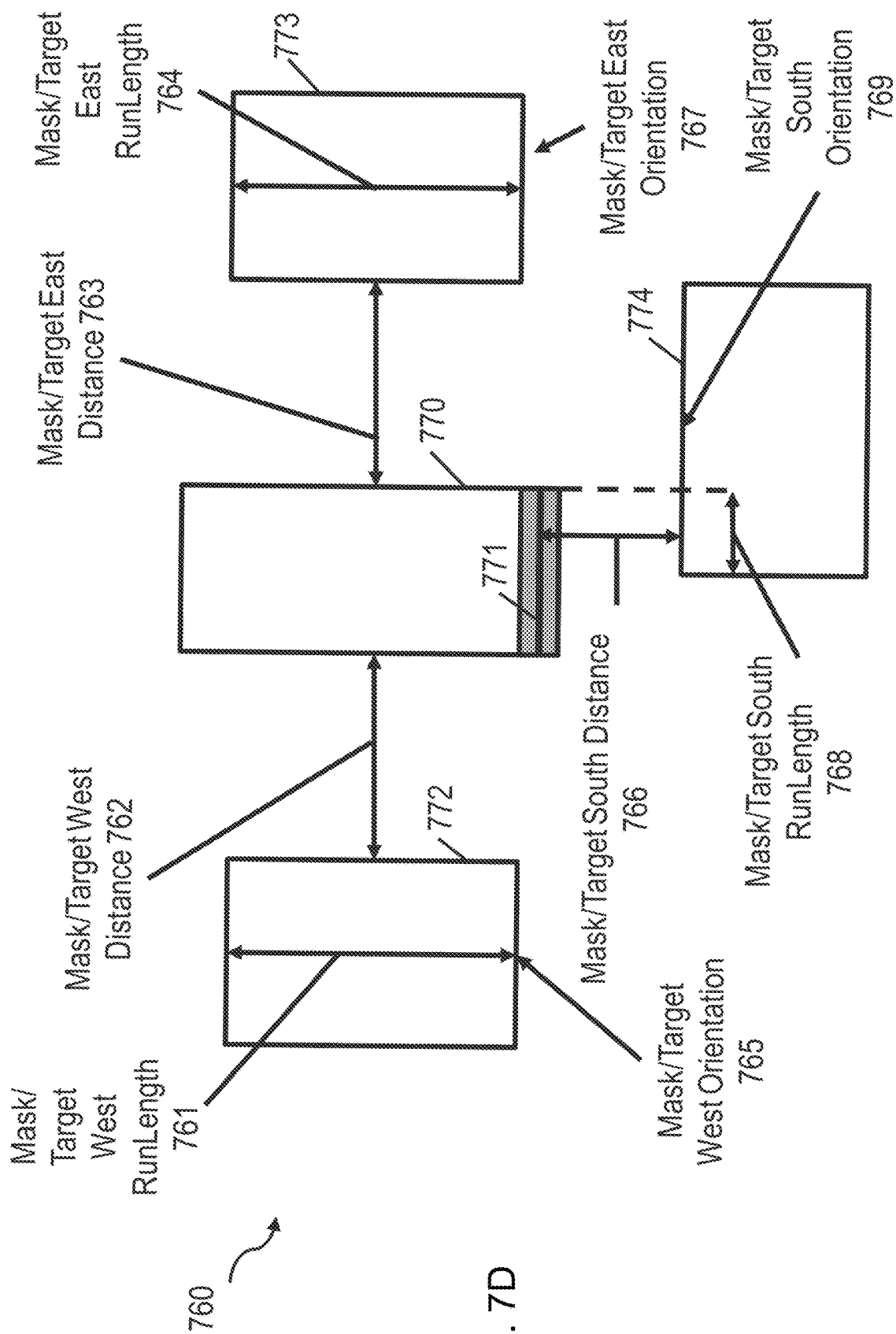

FIG. 7D illustrates block diagram 760 with a POI 771 on resident polygon 770, defining relations with one or more external polygons including east external polygon 773, south external polygon 774, and west external polygon 772. For example, resident polygon 770 relative to east external polygon 773 may be defined by any one, any combination, or all of: mask/target east distance 763 between resident polygon 770 and east external polygon 773; mask/target east runlength 764 (defining a common length between resident polygon 770 and east external polygon 773); or mask/target east orientation 767. As another example, resident polygon 770 relative to south external polygon 774 may be defined by any one, any combination, or all of: mask/target south distance 766 between resident polygon 770 and south external polygon 774; mask/target south runlength 768 (defining a common length between resident polygon 770 and south external polygon 774); or mask/target south orientation 769. As still another example, resident polygon 770 relative to west external polygon 772 may be defined by any one, any combination, or all of: mask/target west distance 762 between resident polygon 770 and west external polygon 772; mask/target west runlength 761 (defining a common length between resident polygon 770 and west external polygon 772); or mask/target west orientation 765.

Figure 7E:
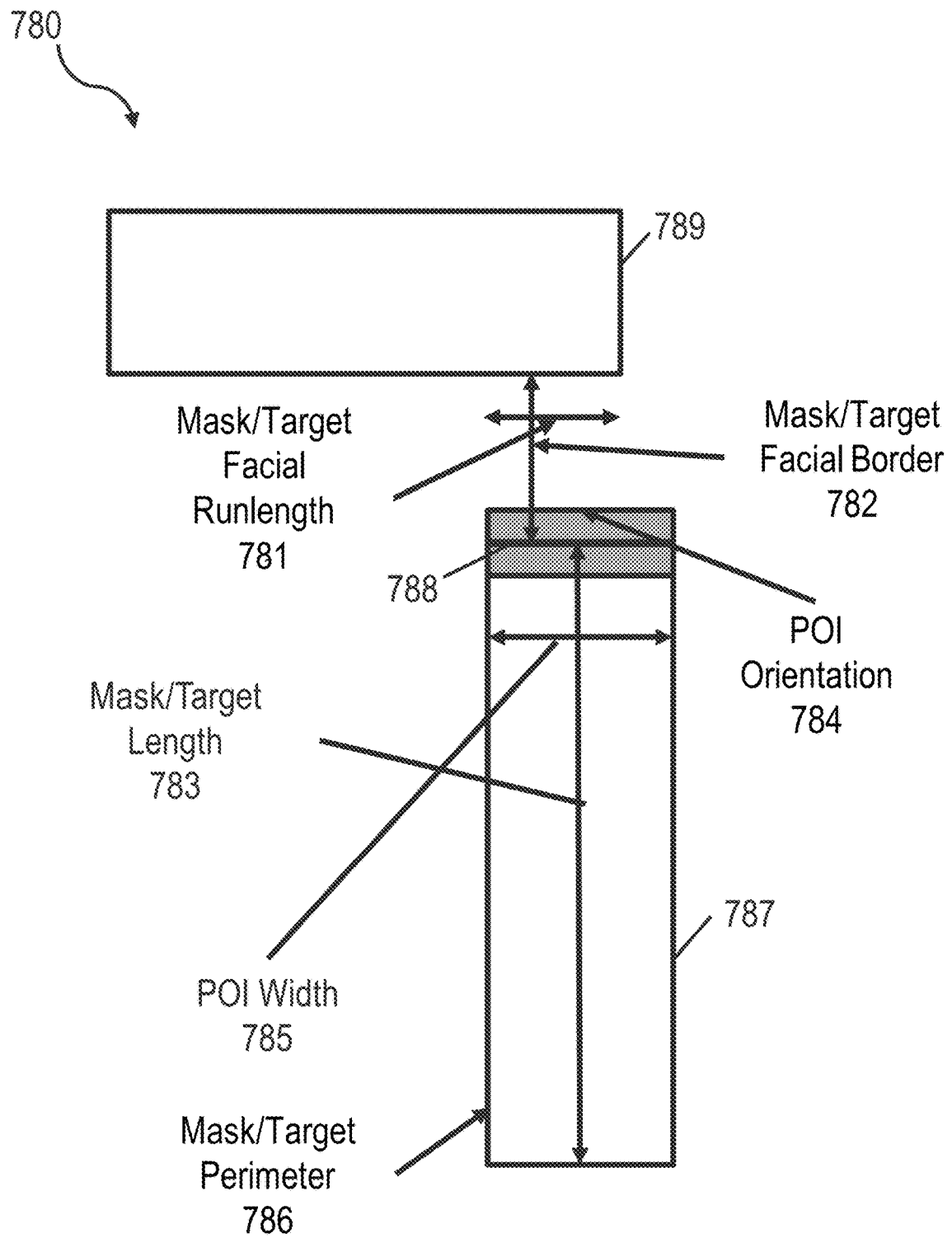
FIG. 7E illustrates a block diagram for defining a POI image for the resident polygon.

FIG. 7E illustrates a block diagram 780 for defining a POI image for a POI 788 on the resident polygon 787. The resident polygon 787 includes any one, any combination, or all of: POI width 785 (e.g., a line end width); mask/target length 783; mask/target perimeter 786; or POI orientation 784 (shown as horizontal in FIG. 7E). Further, the resident polygon 787 may be defined relative to one or more other polygons, such as external polygon 789, including one or both of: mask/target facial border 782; or mask/target facial runlength 781.

Figure 8A:
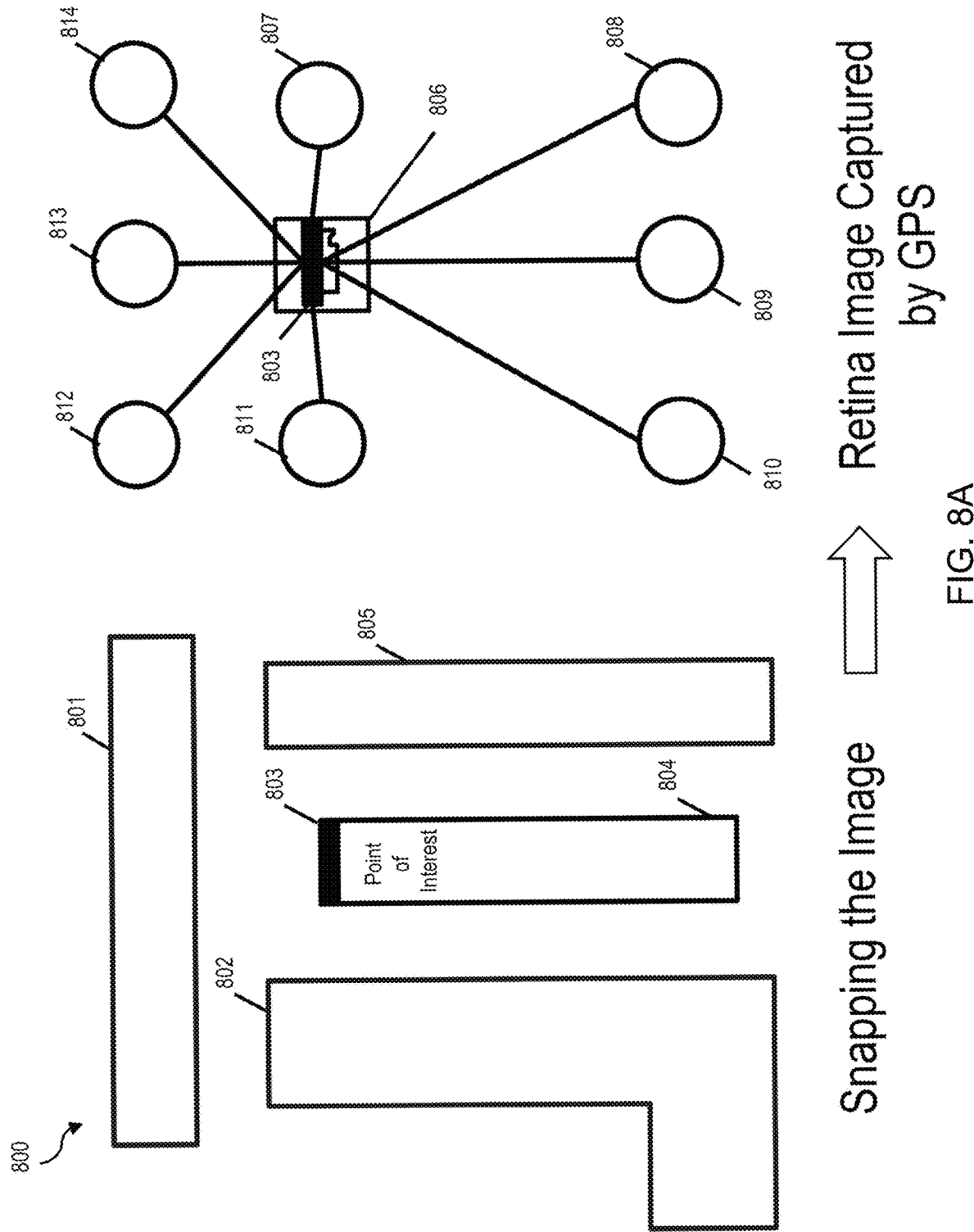

FIGS. 8A-I illustrates block diagrams for a first example of translating the layout to taking snapshots of different images in order to define a retina image captured by GPS. Specifically, FIG. 8A illustrates a block diagram 800 of "snapping" an image of a representation of the layout design to a retina image captured by GPS. The representation of the layout design is shown on the left side of the figure with 803 being the POI, the resident polygon 804 and external polygons 801, 802, 805. The right side of the figure illustrates the "snapping" of images for the POI 803 using camera 806 at different locations 807, 808, 809, 810, 811, 812, 813, 814. In one or some embodiments, the images are taken at the cardinal and ordinal directions. Further, the image taken may comprise one or both of the topological features or the dimensional features at the different locations.

Figure 8B:
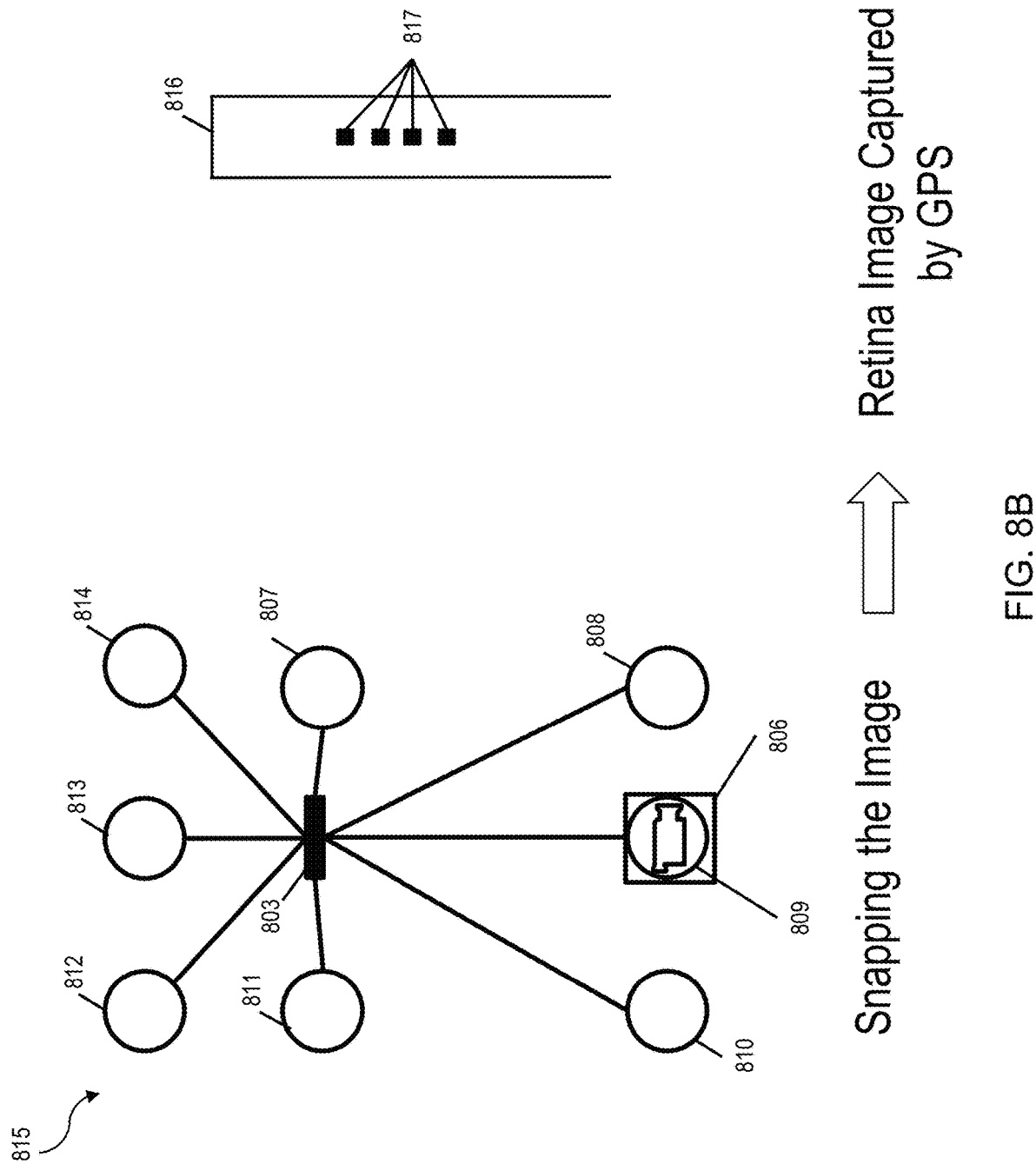

FIG. 8B illustrates a block diagram 815 with the camera 806 at location 809 in order to obtain one or both of the topological features or the dimensional features at location 809. As shown, the retina image captured by GPS includes information 817 in order to construct polygon 816 (which is a representation of polygon 804 in the representation of the layout design). The information 817 obtained may be similar to that illustrated in FIG. 6A. Further, location 809 may be used in order to obtain information regarding resident polygon 804.

Figure 8C:
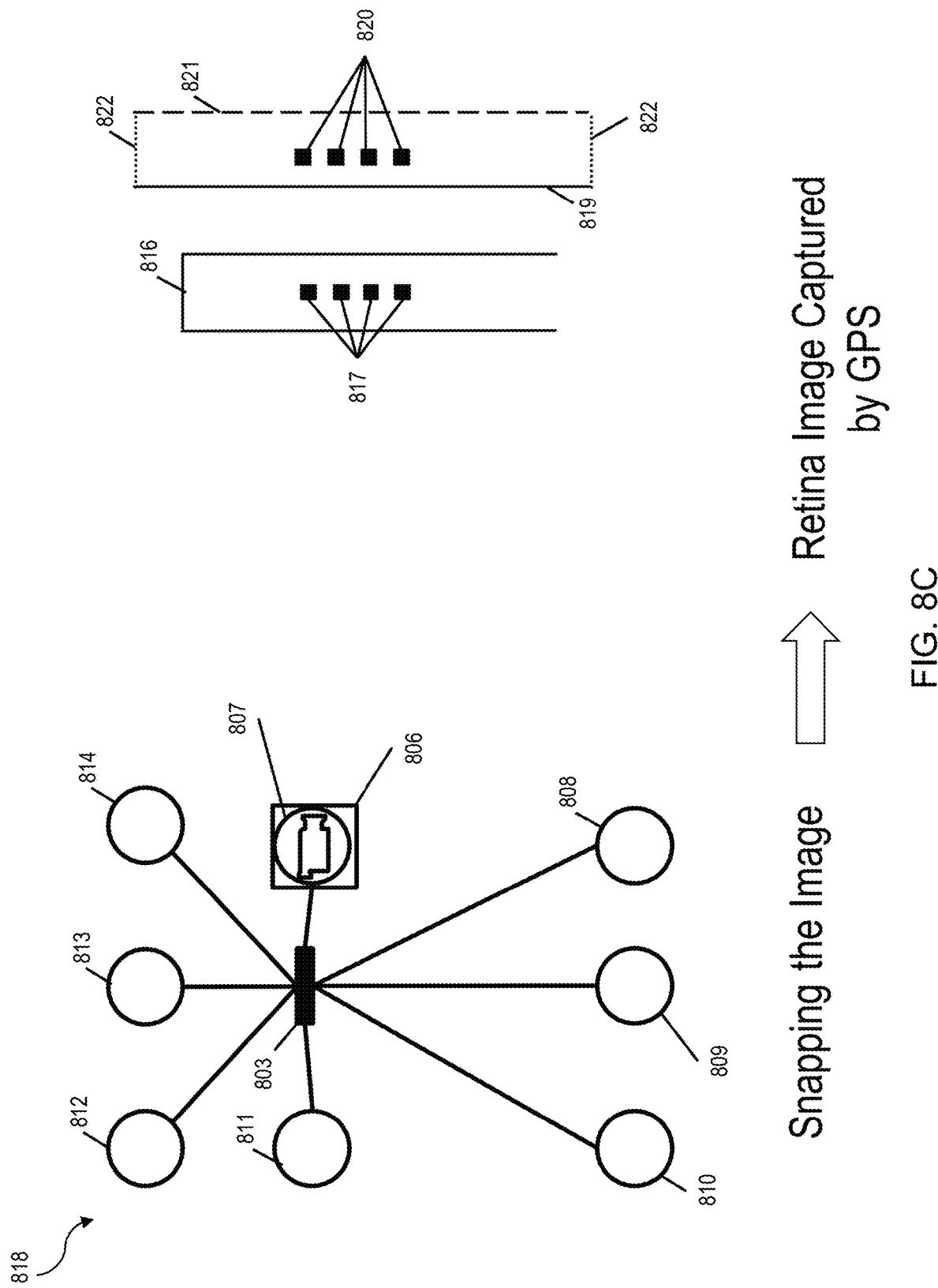

FIG. 8C illustrates a block diagram 818 with the camera 806 at location 807 in order to obtain one or both of the topological features or the dimensional features at location 807. As shown, the retina image captured by GPS includes information 820 in order to at least partly construct polygon 819 (which is a partial representation of polygon 805 in the representation of the layout design). Information 821, 822 are dashed lines that represent the horizontal and vertical extent of a respective polygon, such as polygon 819. Further, location 807 may be used in order to obtain information regarding external polygon 805, which is to the east of resident polygon 804.

FIG. 8D illustrates a block diagram 823 with the camera 806 at location 811 in order to obtain one or both of the topological features or the dimensional features at location 811. As shown, the retina image captured by GPS includes information 827 in order to at least partly construct polygon 824 (which is a partial representation of polygon 802 in the representation of the layout design). Information 825, 826 are dashed lines that represent the horizontal and vertical extent of a respective polygon, such as polygon 824. With additional information, such as illustrated below with regard to FIG. 8G, the confines of polygon 824 may be further defined. In addition, location 811 may be used in order to obtain information regarding external polygon 802, which is to the west of resident polygon 804.

FIG. 8E illustrates a block diagram 828 with the camera 806 at location 813 in order to obtain one or both of the topological features or the dimensional features at location 813. As shown, the retina image captured by GPS includes information 832 in order to at least partly construct polygon 829 (which is a partial representation of polygon 801 in the representation of the layout design). Information 830, 831. Further, location 813 may be used in order to obtain information regarding external polygon 801, which is to the north of resident polygon 804.

FIG. 8F illustrates a block diagram 833 with the camera 806 at location 808 in order to obtain one or both of the topological features or the dimensional features at location 808. As discussed above, various features may be captured at the cardinal directions (e.g., polygon information) and at the ordinal directions (e.g., corner information). As shown, the retina image captured by GPS includes information 834, 835 (such as corner information in the south-west direction)) in order to at least partly construct polygons 816, 819 (which is a representation of polygons 804, 805 in the representation of the layout design). Information 836.

Figure 8G:
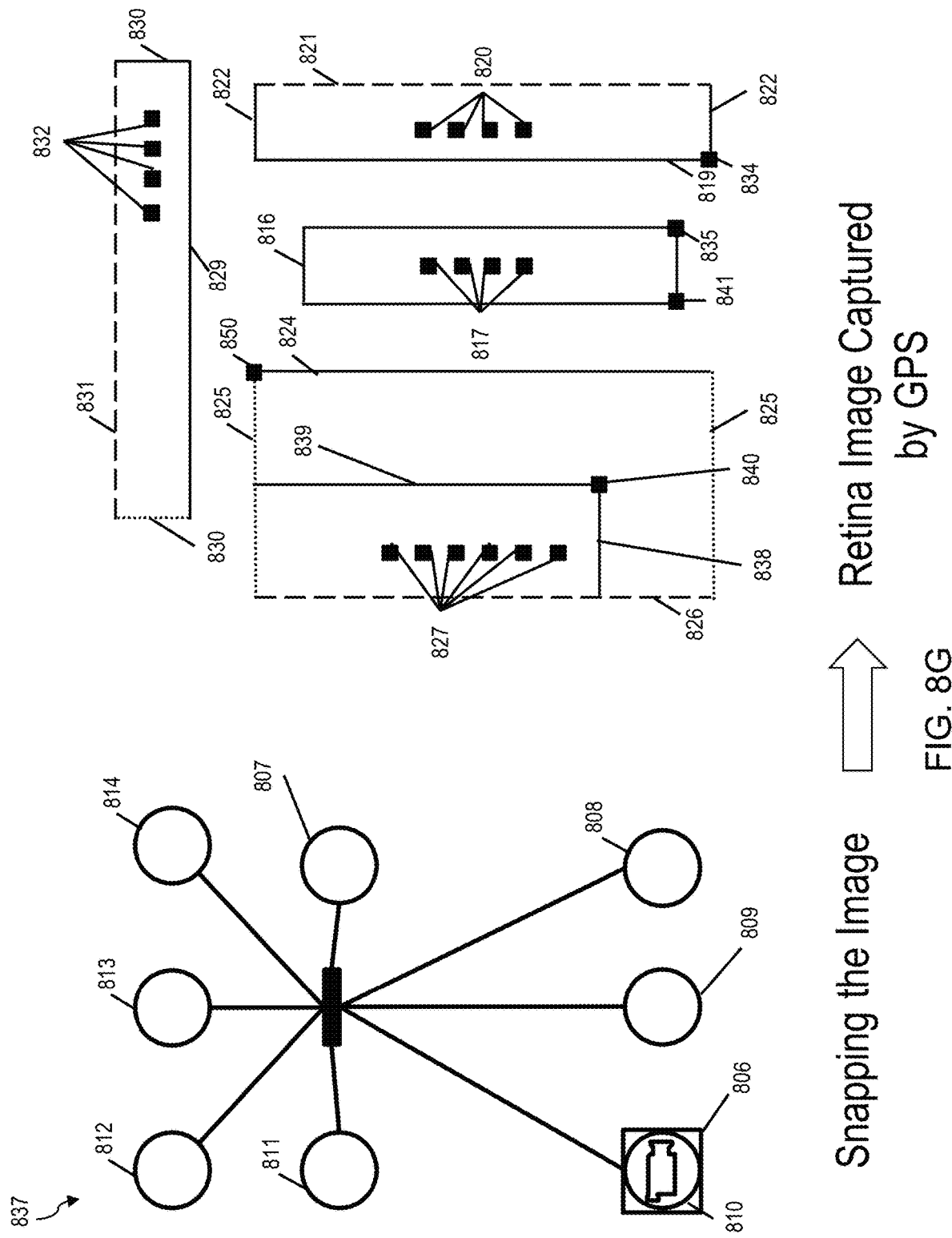

FIG. 8G illustrates a block diagram 837 with the camera 806 at location 810 in order to obtain one or both of the topological features or the dimensional features at location 810. As shown, the retina image captured by GPS includes information 838, 839, 840, 850 (such as corner information for polygon 824) and information 841 (such as corner information for polygon 816) in order to at least partly construct polygons 816, 824 (which is a representation of polygons 802, 804 in the layout design).

Figure 8H:
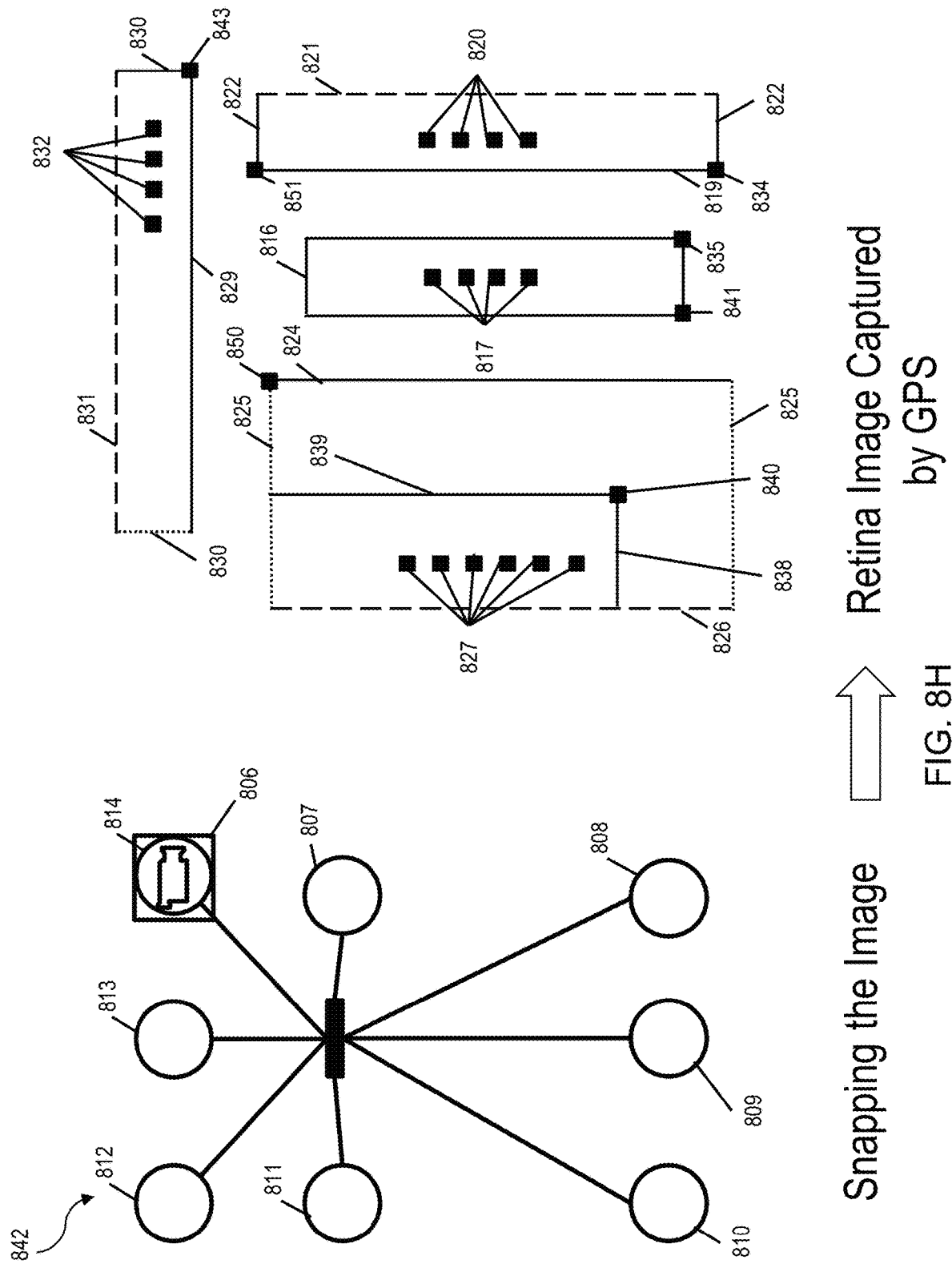

FIG. 8H illustrates a block diagram 842 with the camera 806 at location 814 in order to obtain one or both of the topological features or the dimensional features at location 814. As shown, the retina image captured by GPS includes information 843 (such as corner information for polygon 829), information 851 (such as corner information for polygon 822) in order to at least partly construct polygons 819, 829 (which is a representation of polygons 801, 805 in the layout design).

Figure 8I:
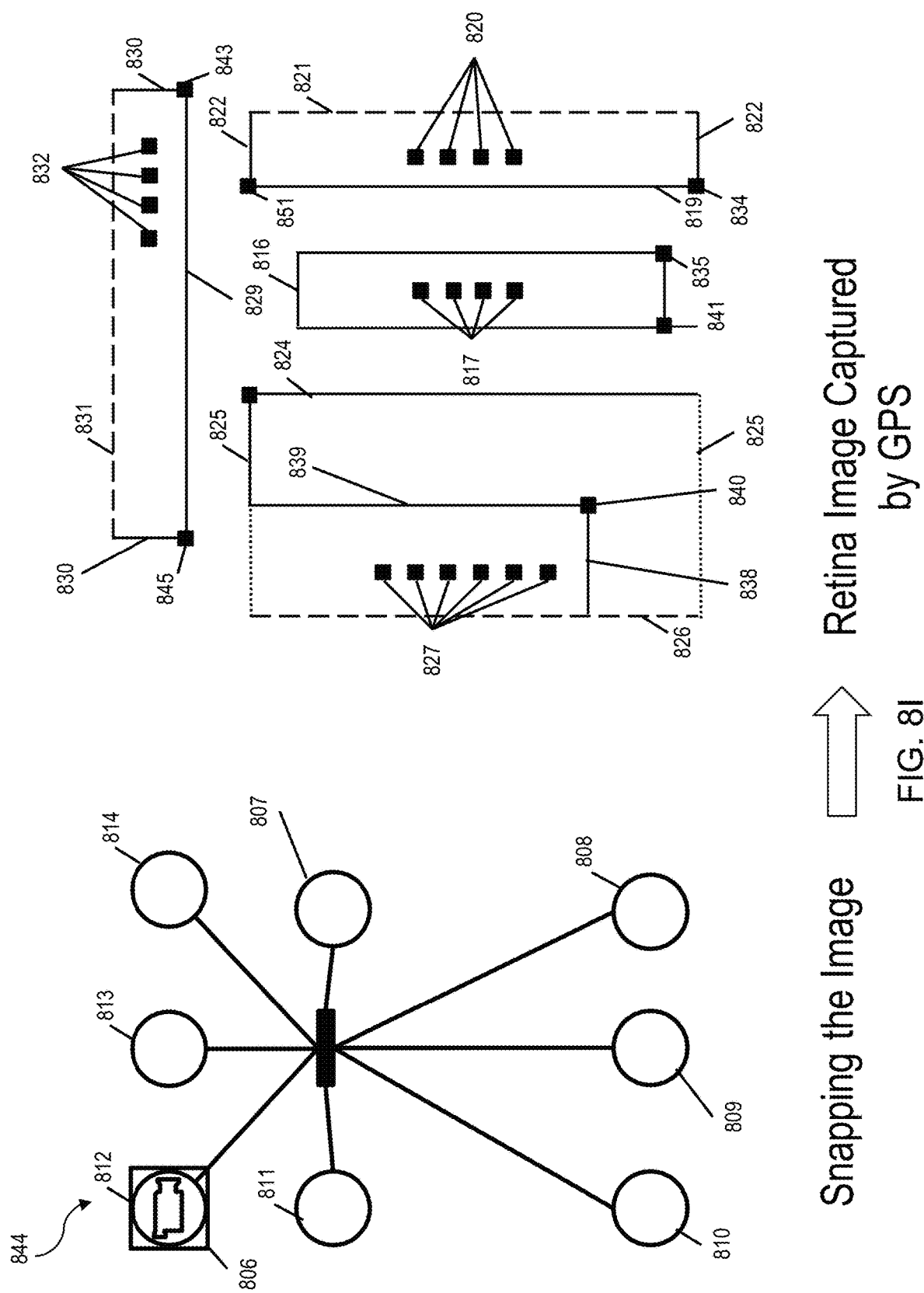

FIG. 8I illustrates a block diagram 844 with the camera 806 at location 812 in order to obtain one or both of the topological features or the dimensional features at location 812. As shown, the retina image captured by GPS includes information 845 (such as corner information for polygon 829) in order to at least partly construct polygon 829 (which is a representation of polygons 801 in the layout design).

Figure 9A:
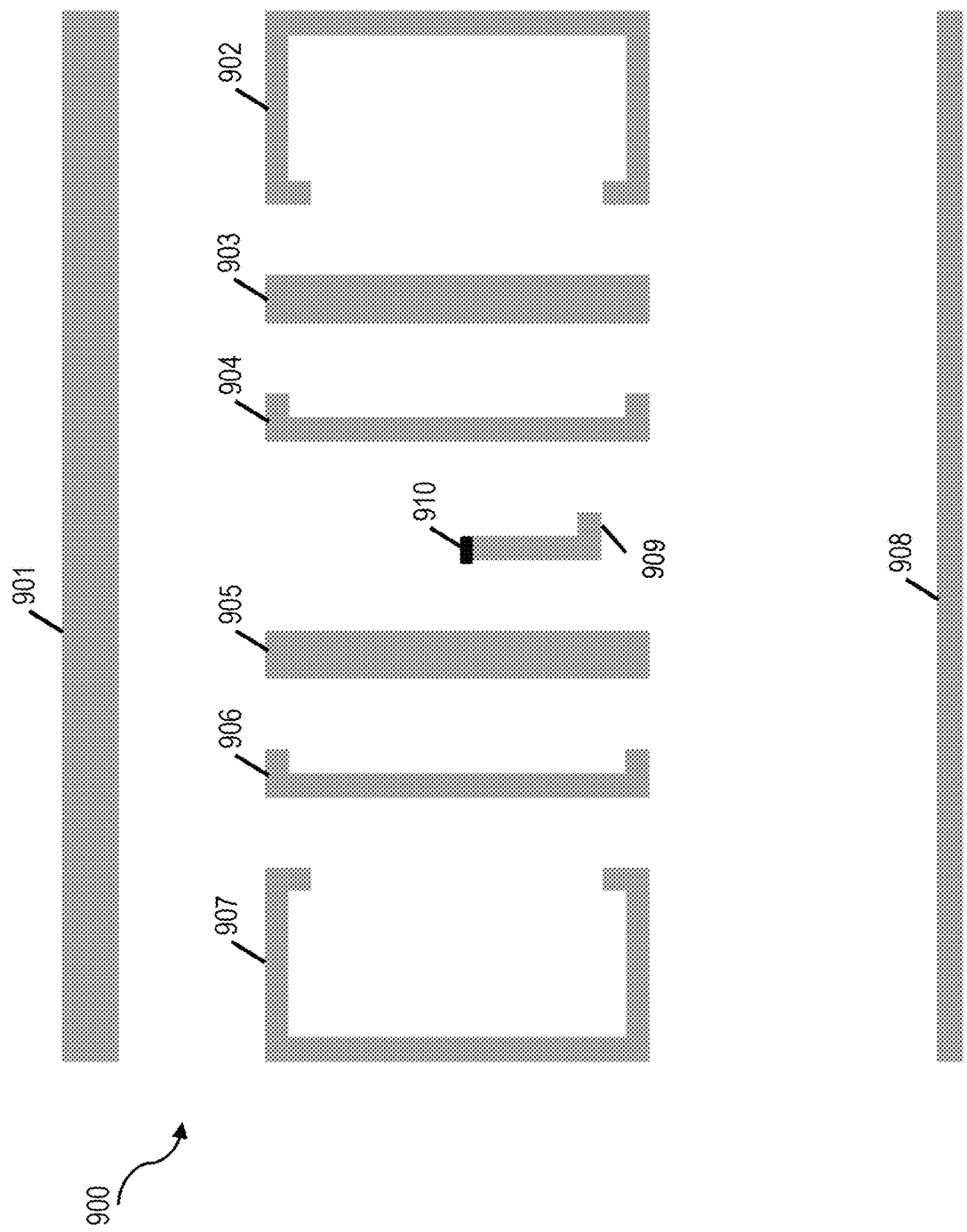
FIGS. 9A-Z illustrates block diagrams for a second example of translating the layout to taking snapshots of different images in order to define a retina image captured by GPS.
Figure 9B:
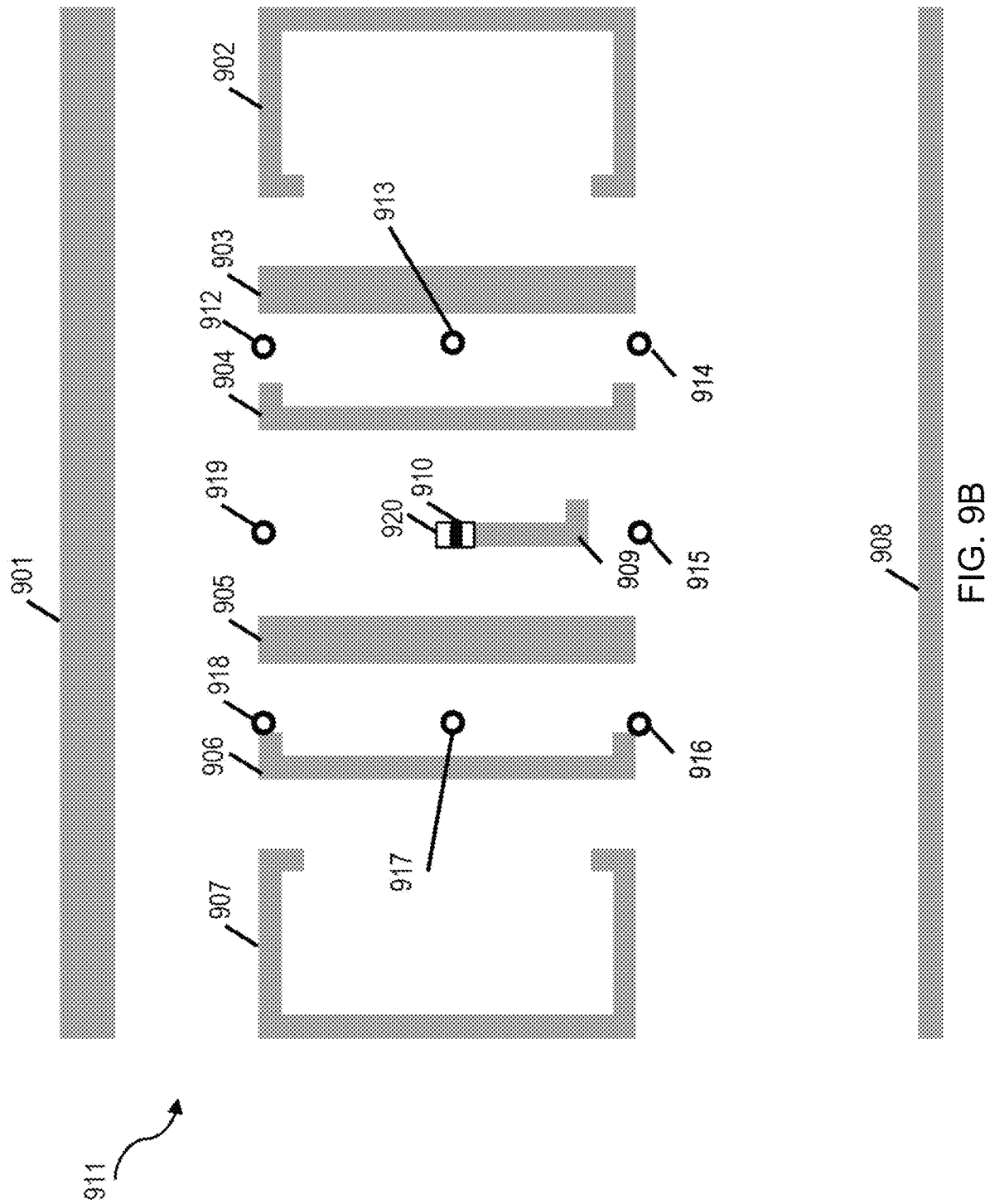
Figure 9C:
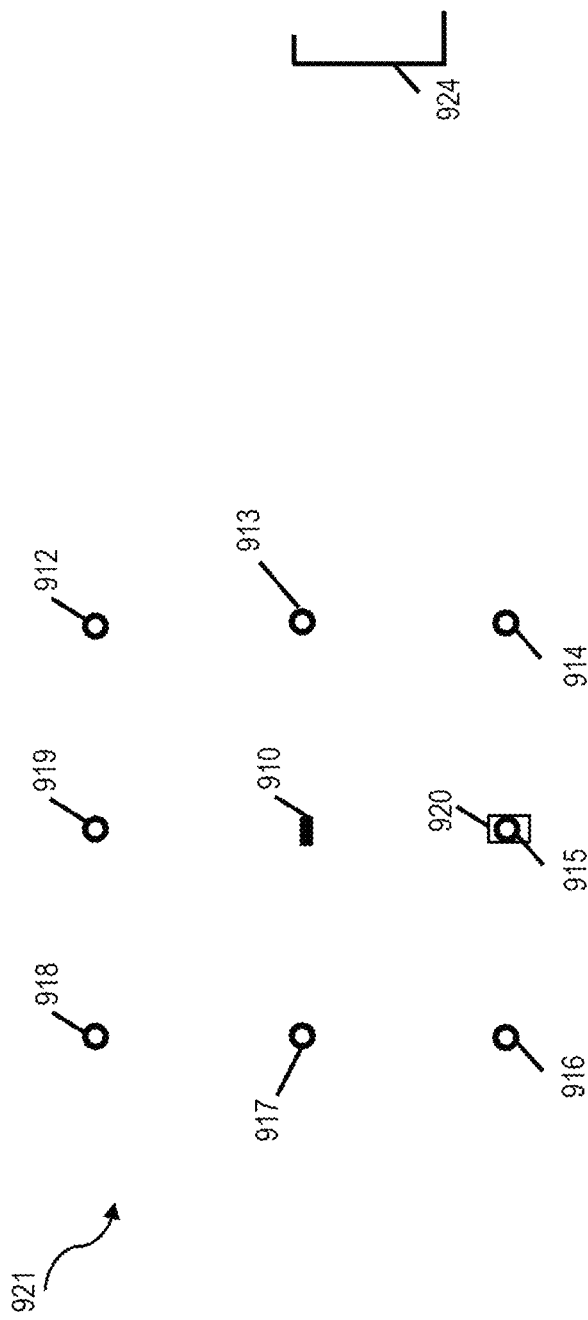
Figure 9D:
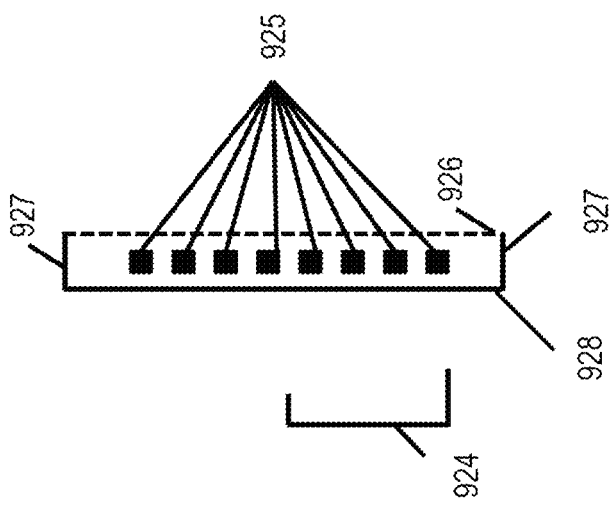
Figure 9D:
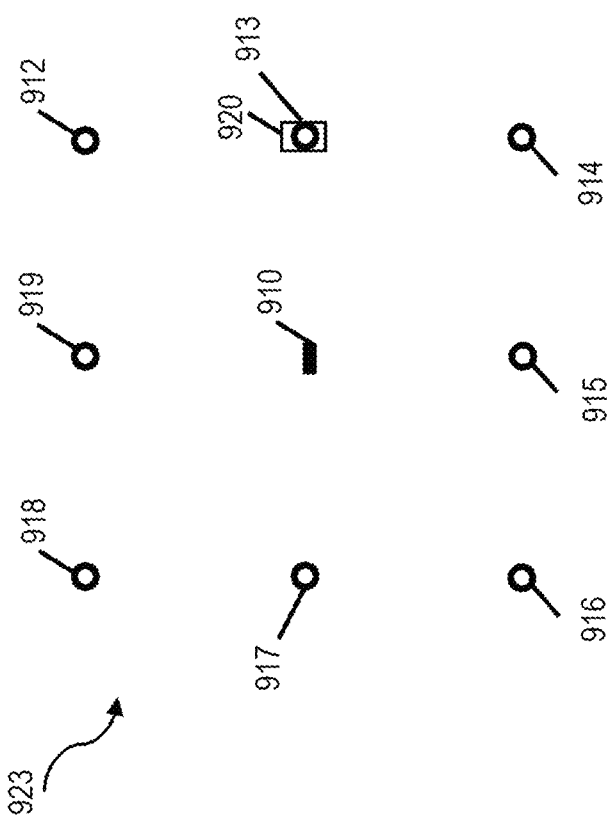
Figure 9E:
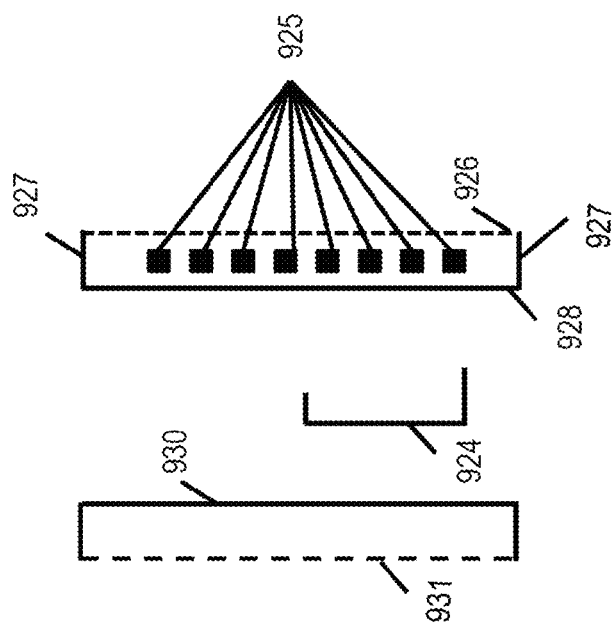
Figure 9E:
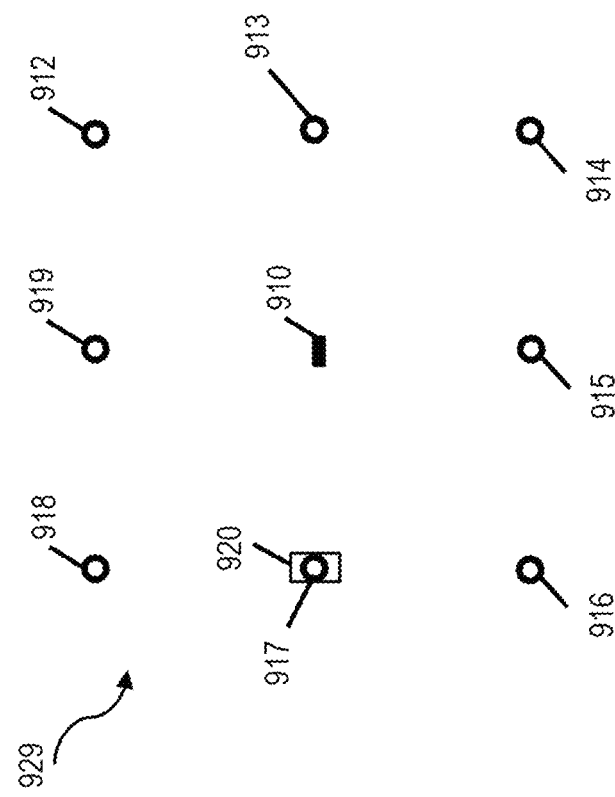
Figure 9F:
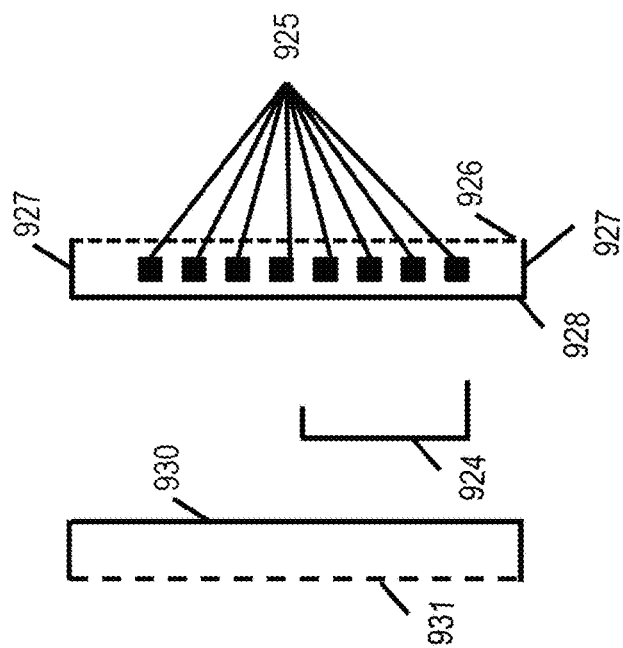
Figure 9F:
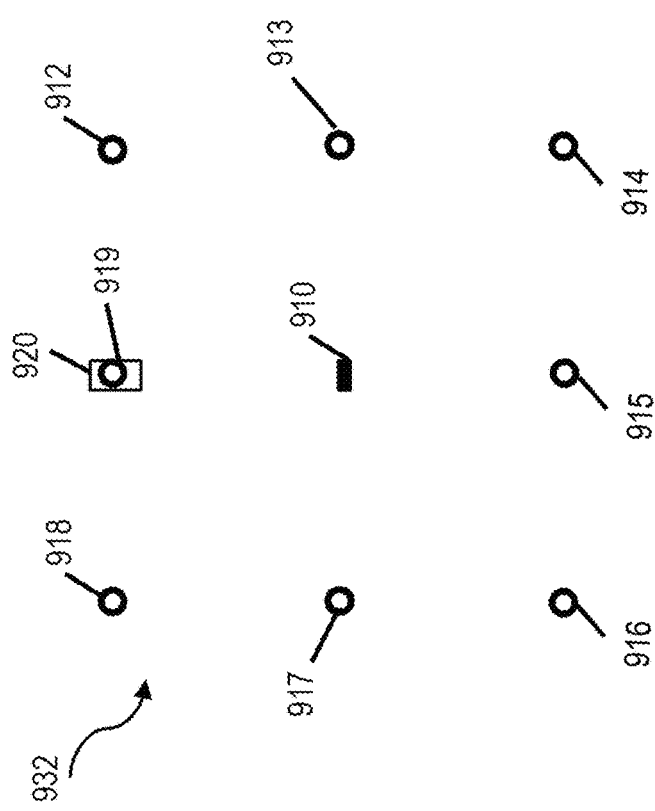
Figure 9G:
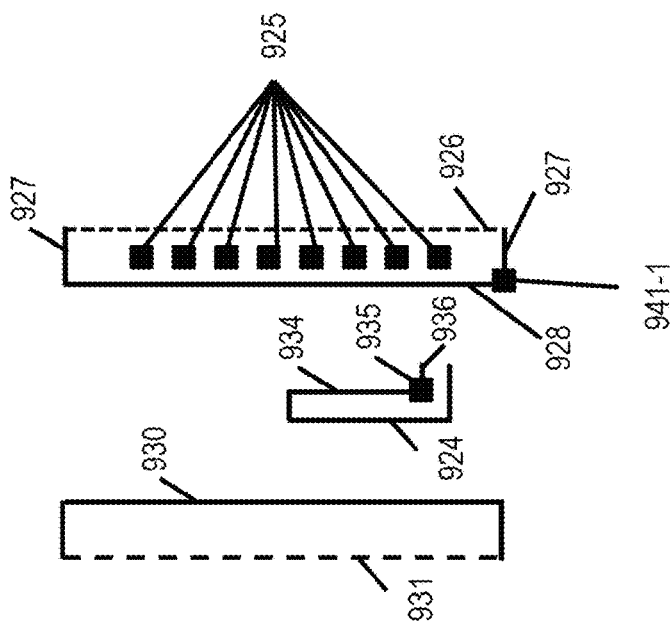
Figure 9G:
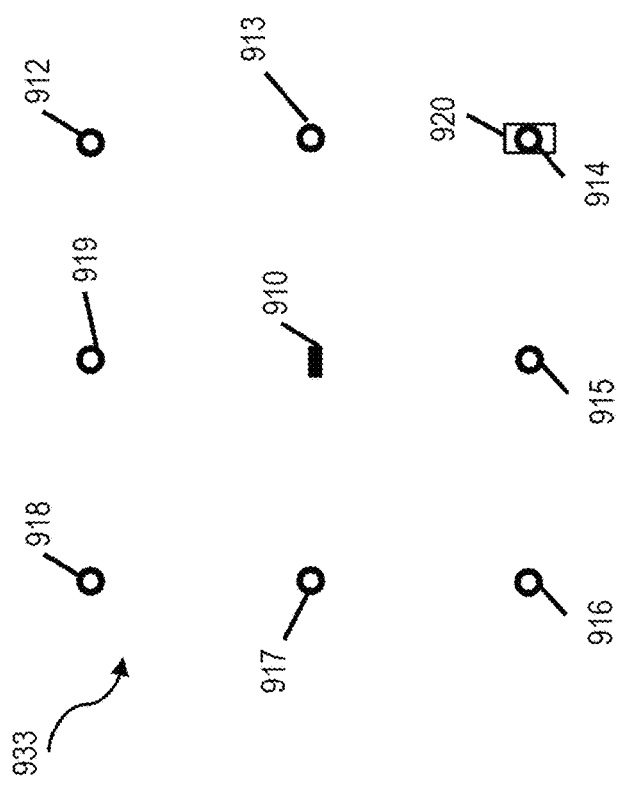
Figure 9H:
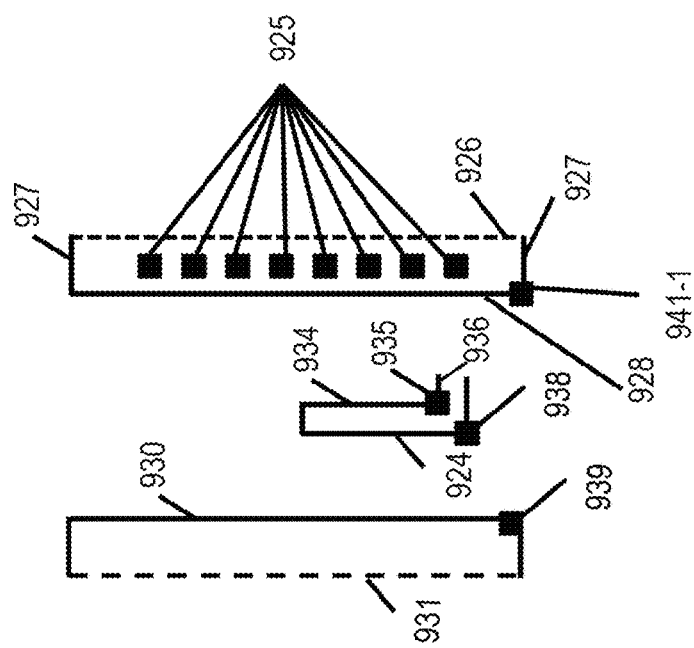
Figure 9H:
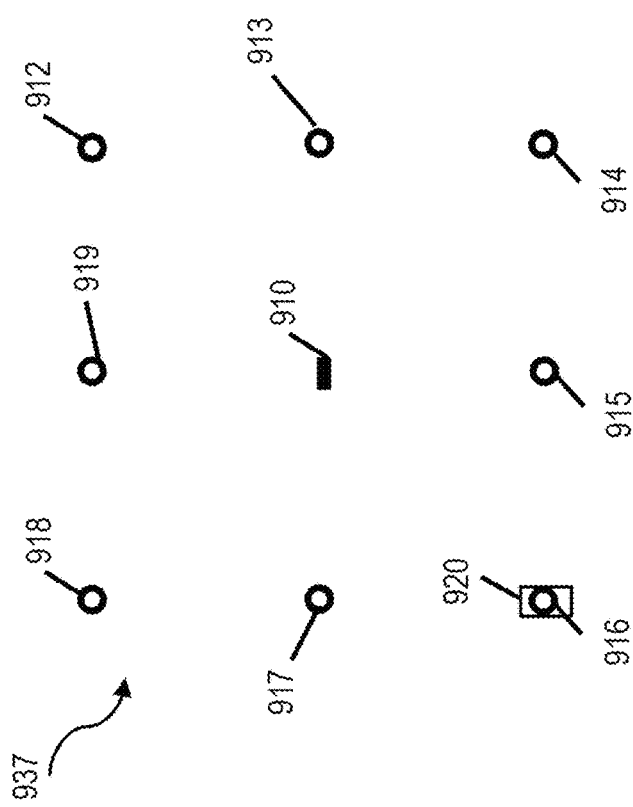
Figure 9I:
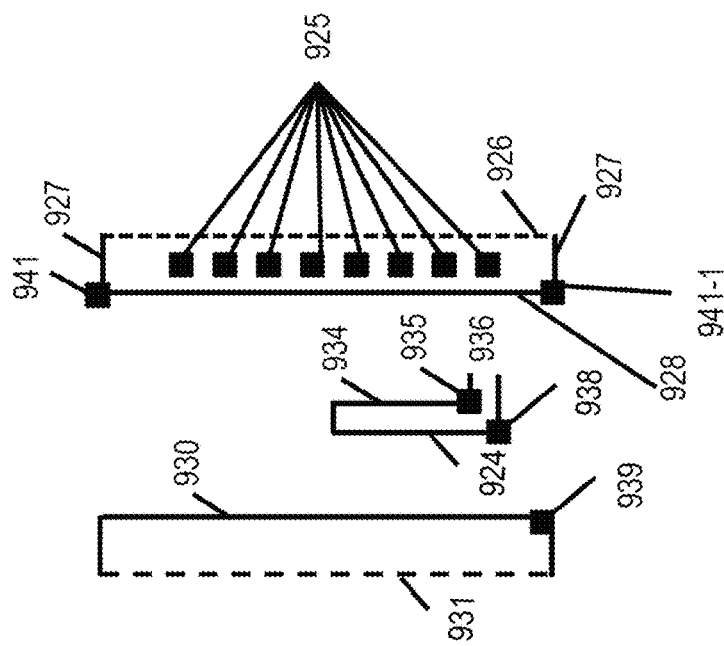
Figure 9I:
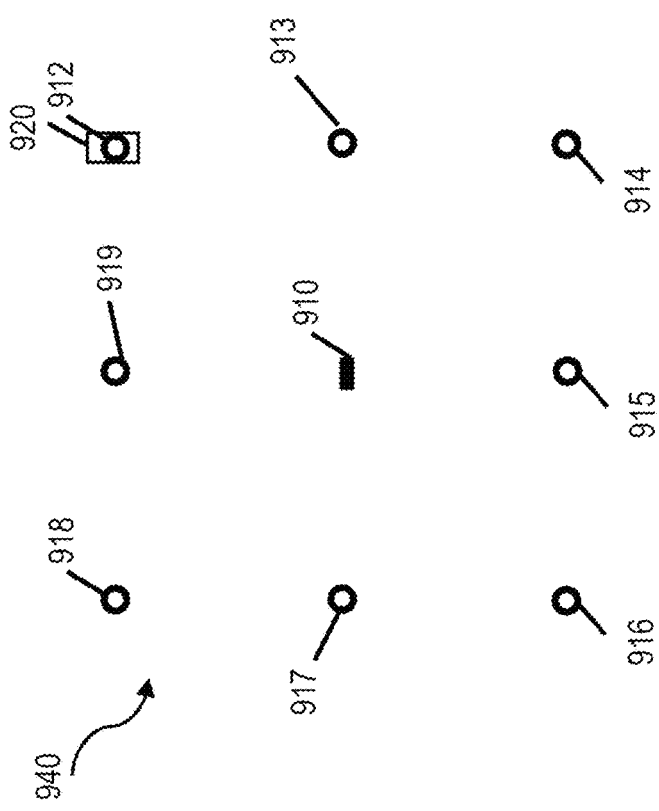
Figure 9J:
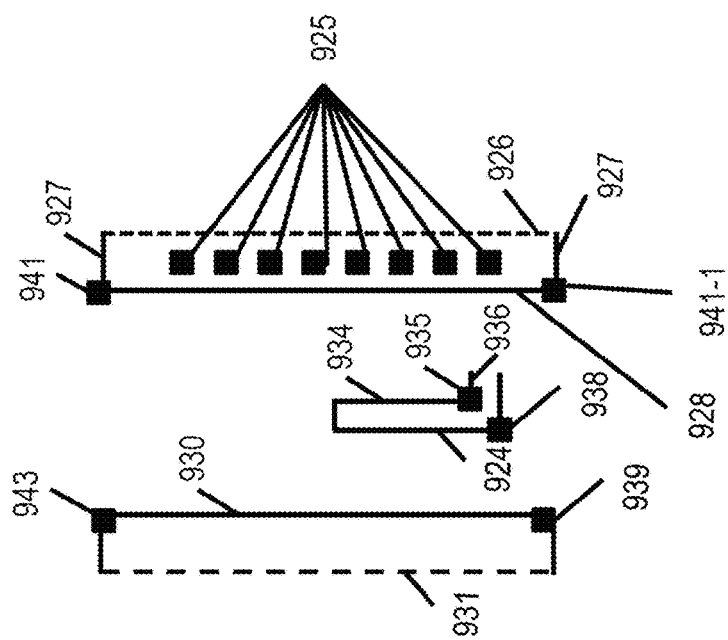
Figure 9J:
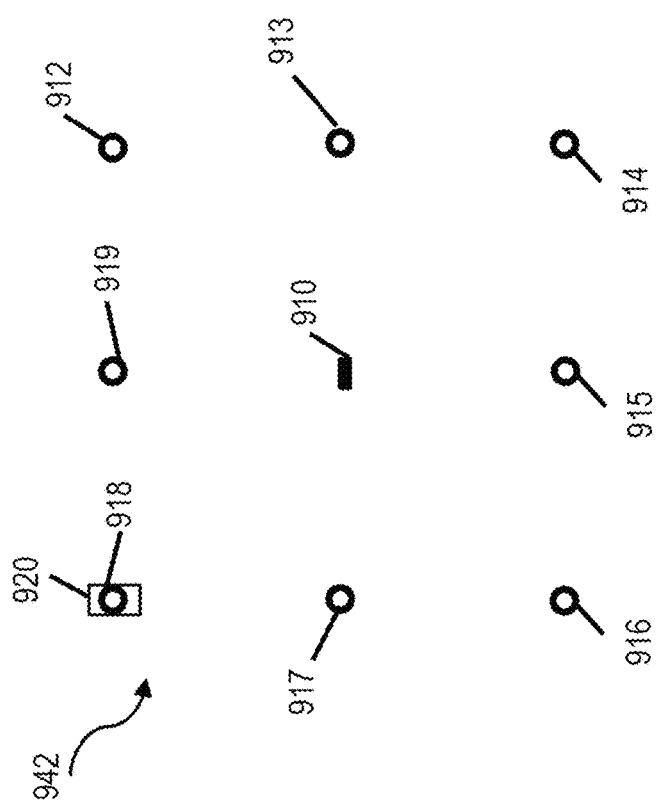
Figure 9K:
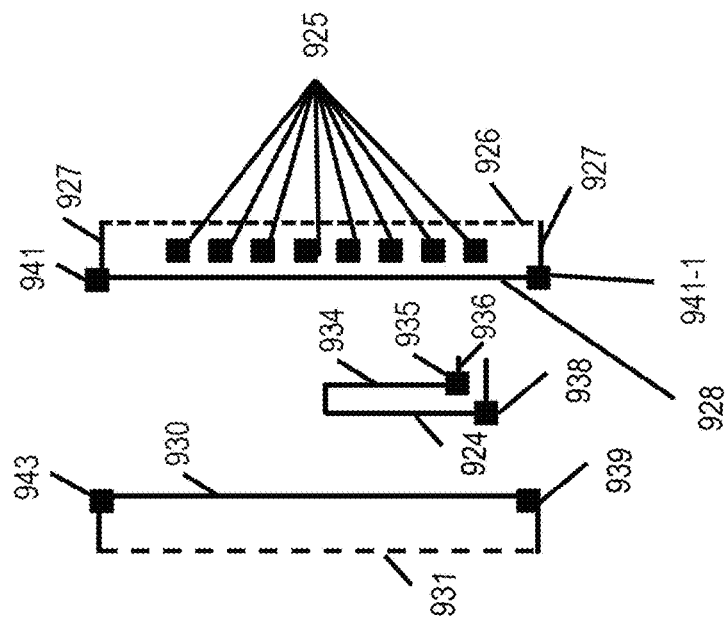
Figure 9K:
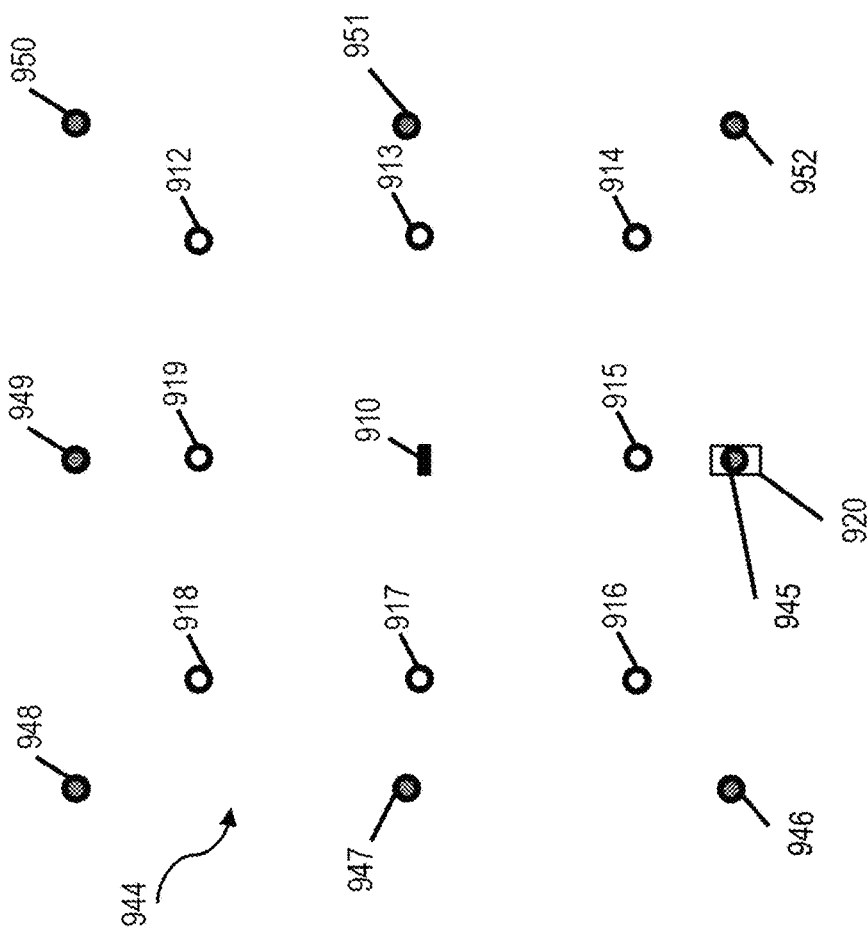
Figure 9L:
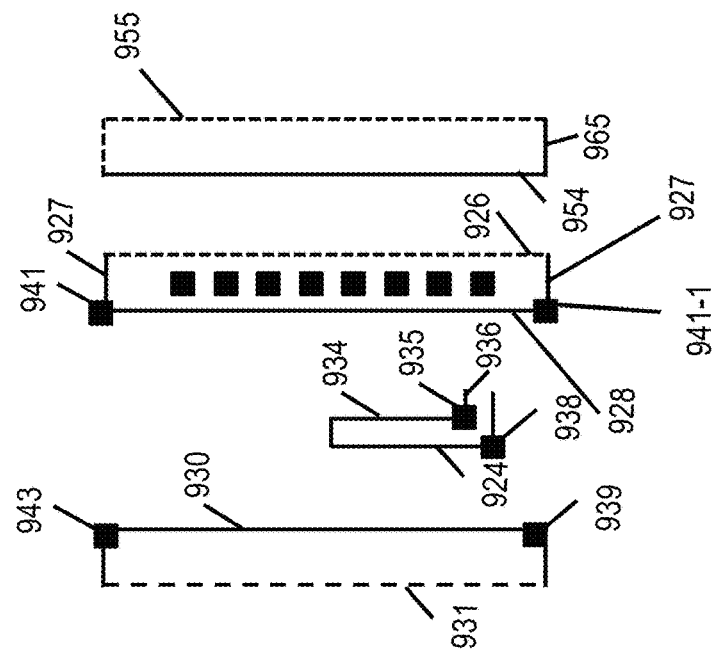
Figure 9L:
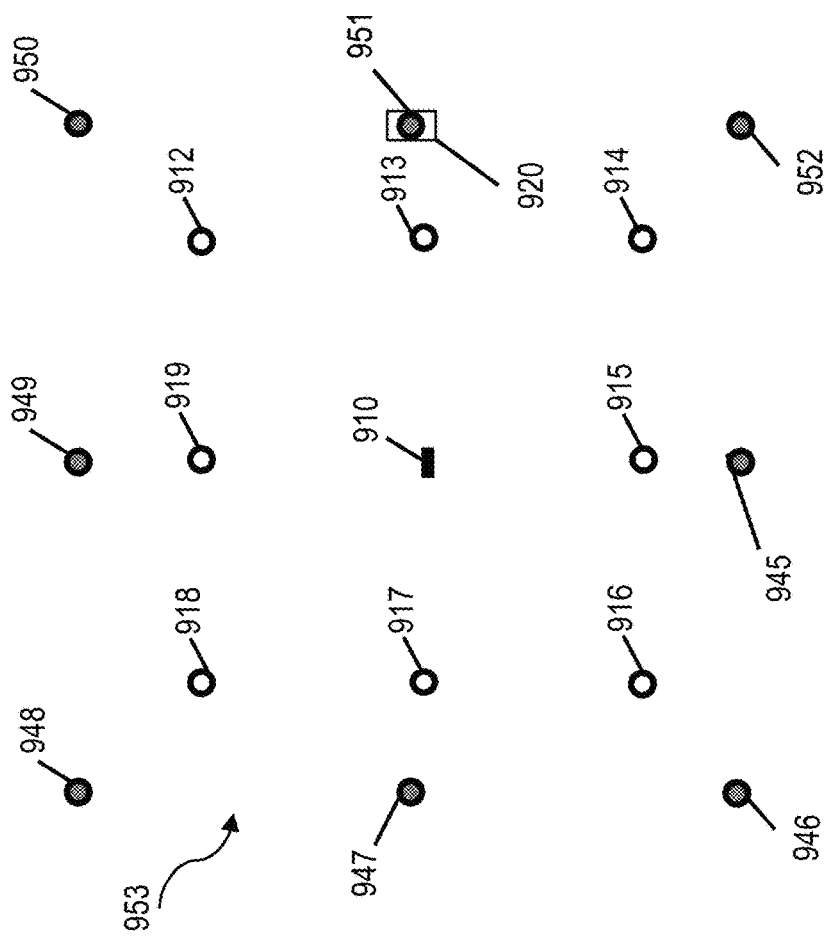
Figure 9M:
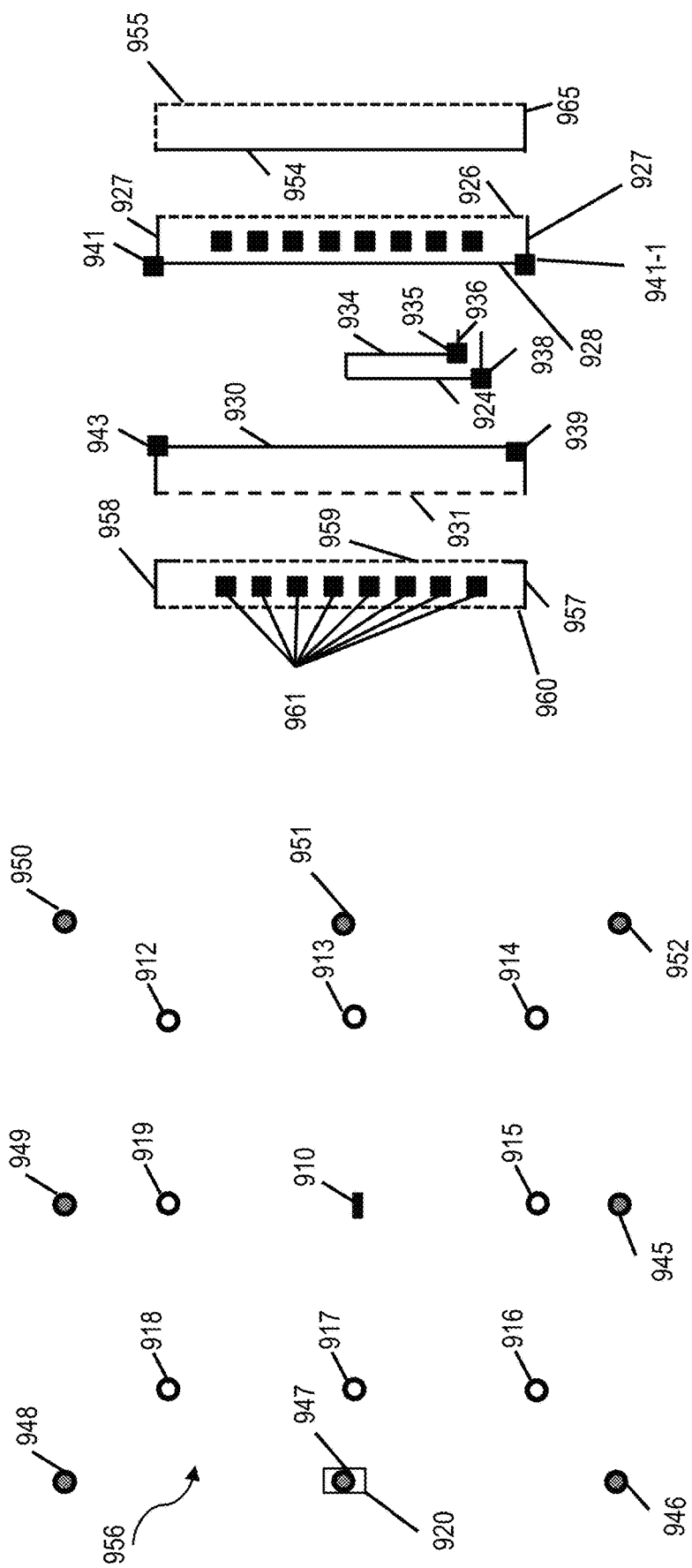
Figure 9N:
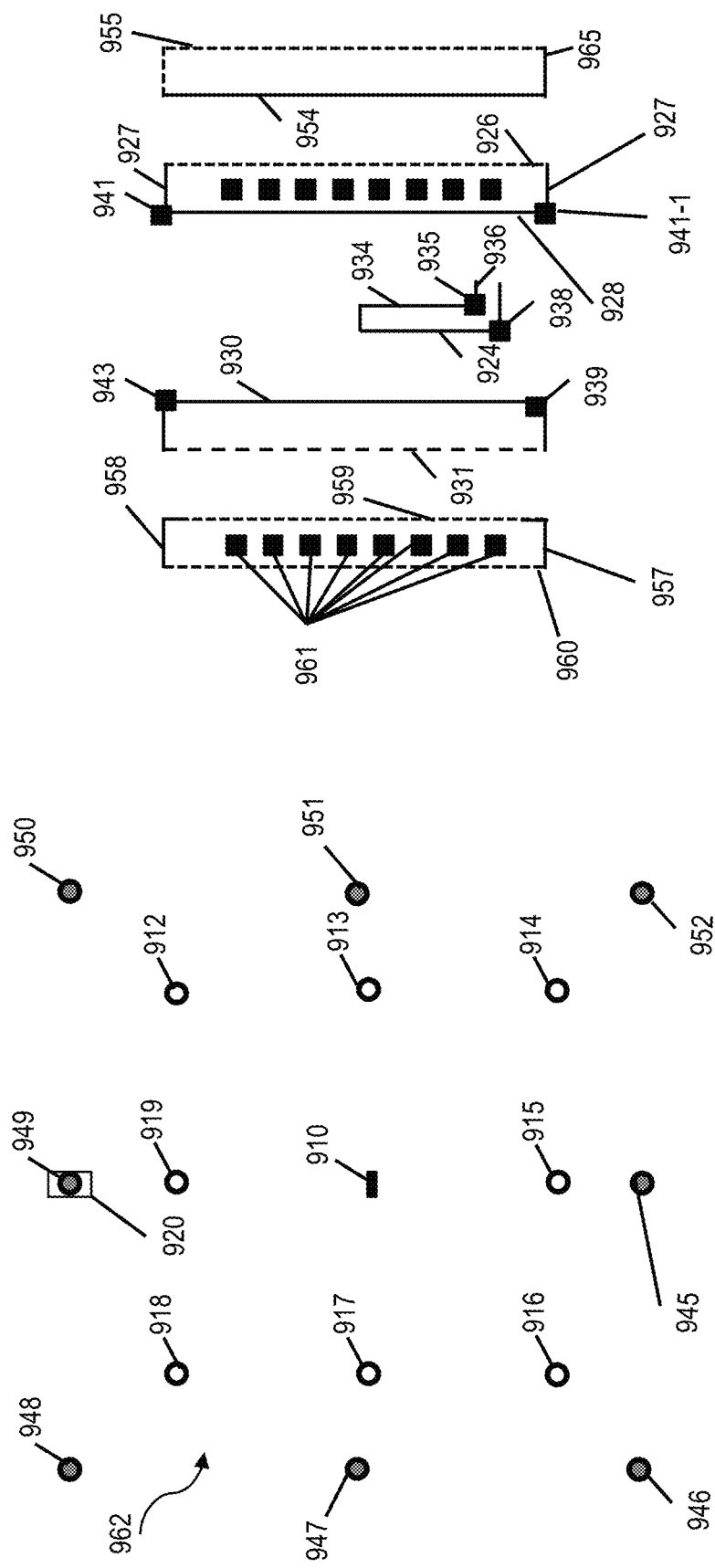
Figure 9O:
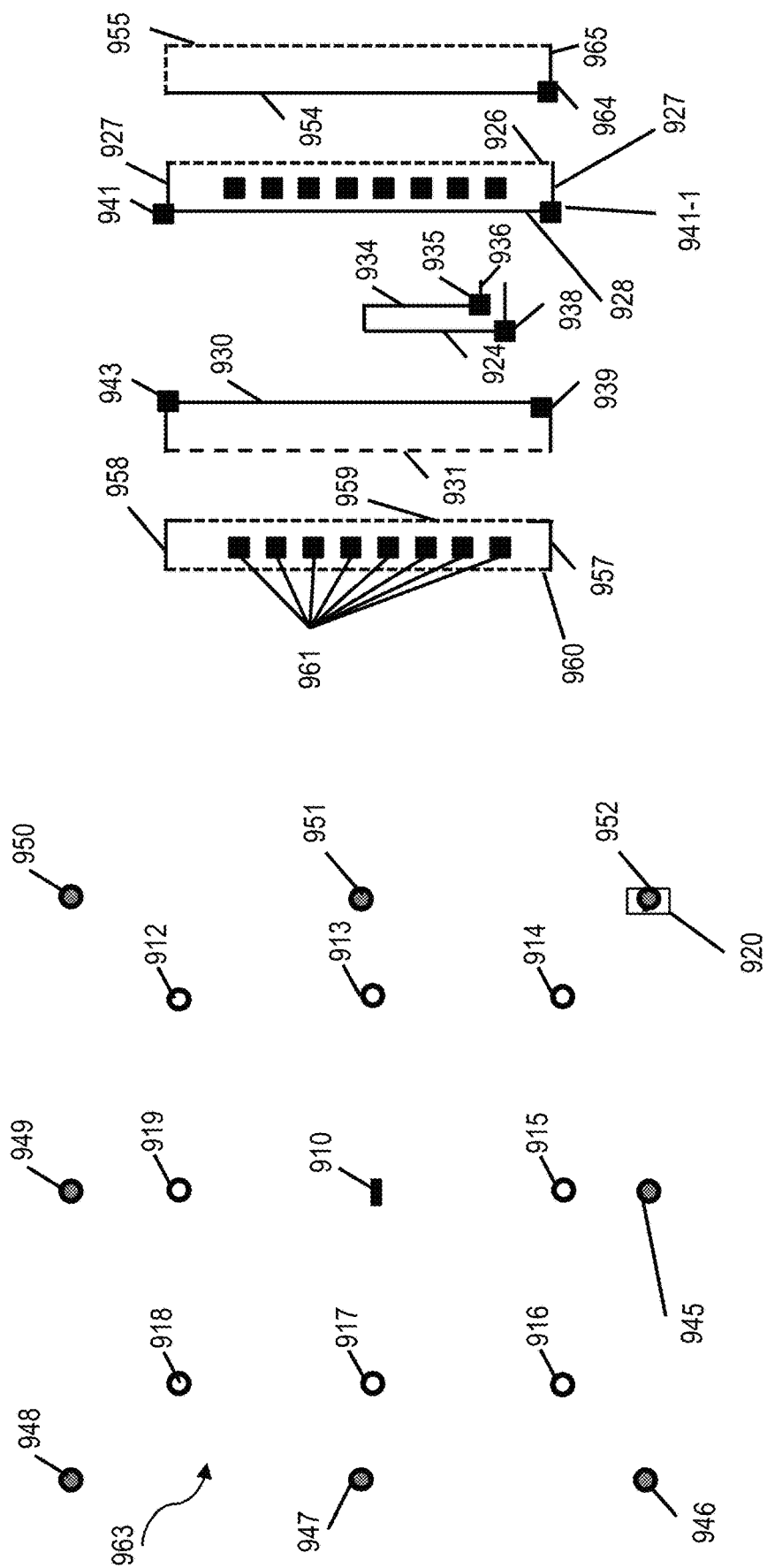
Figure 9P:
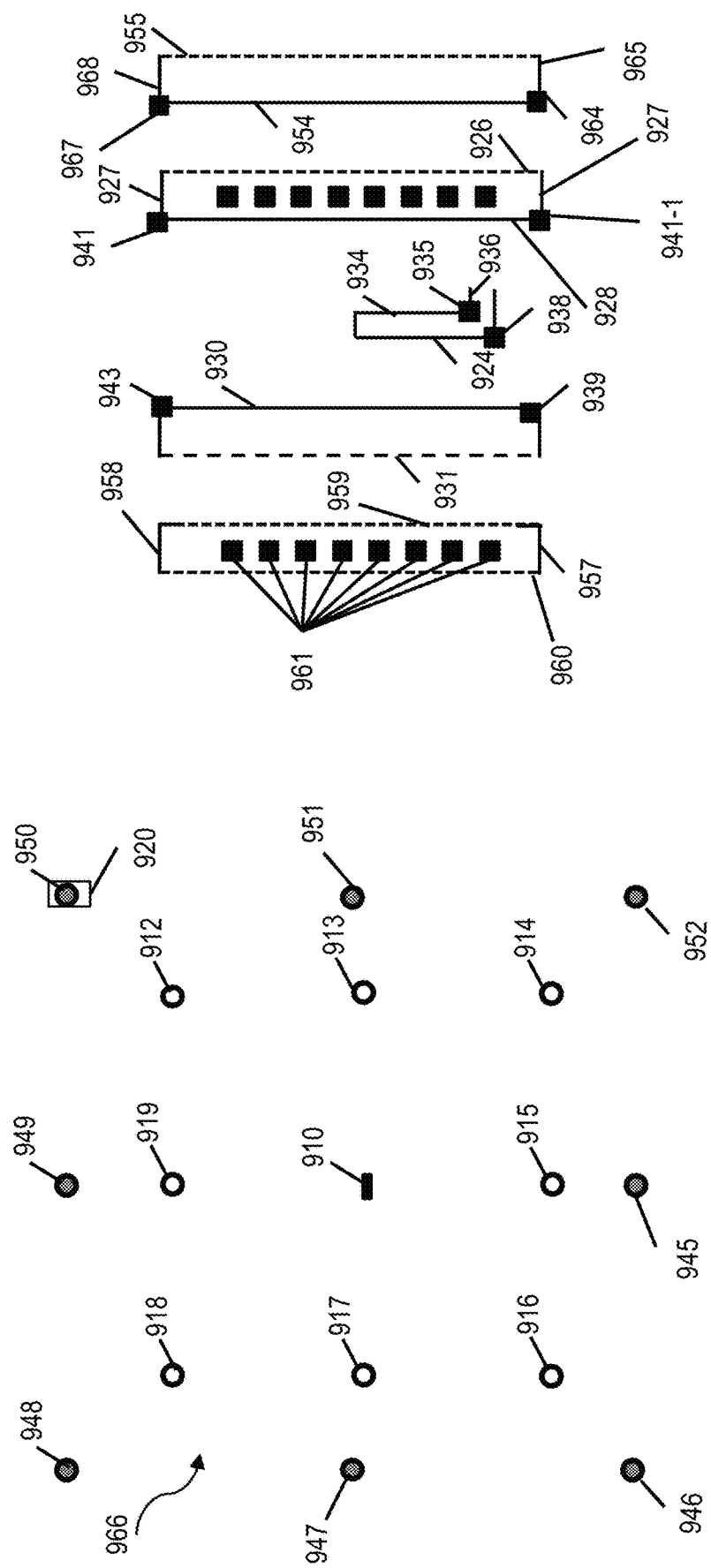
Figure 9Q:
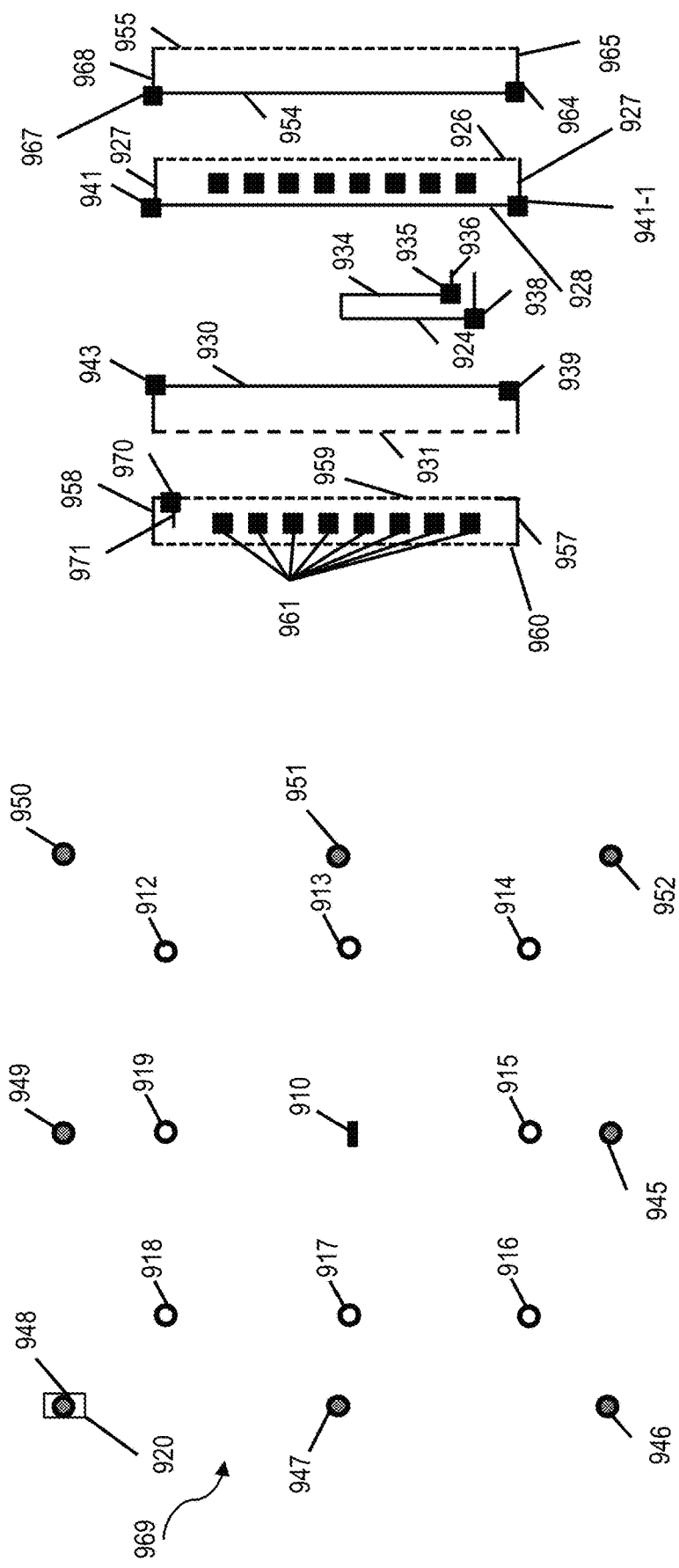
Figure 9R:
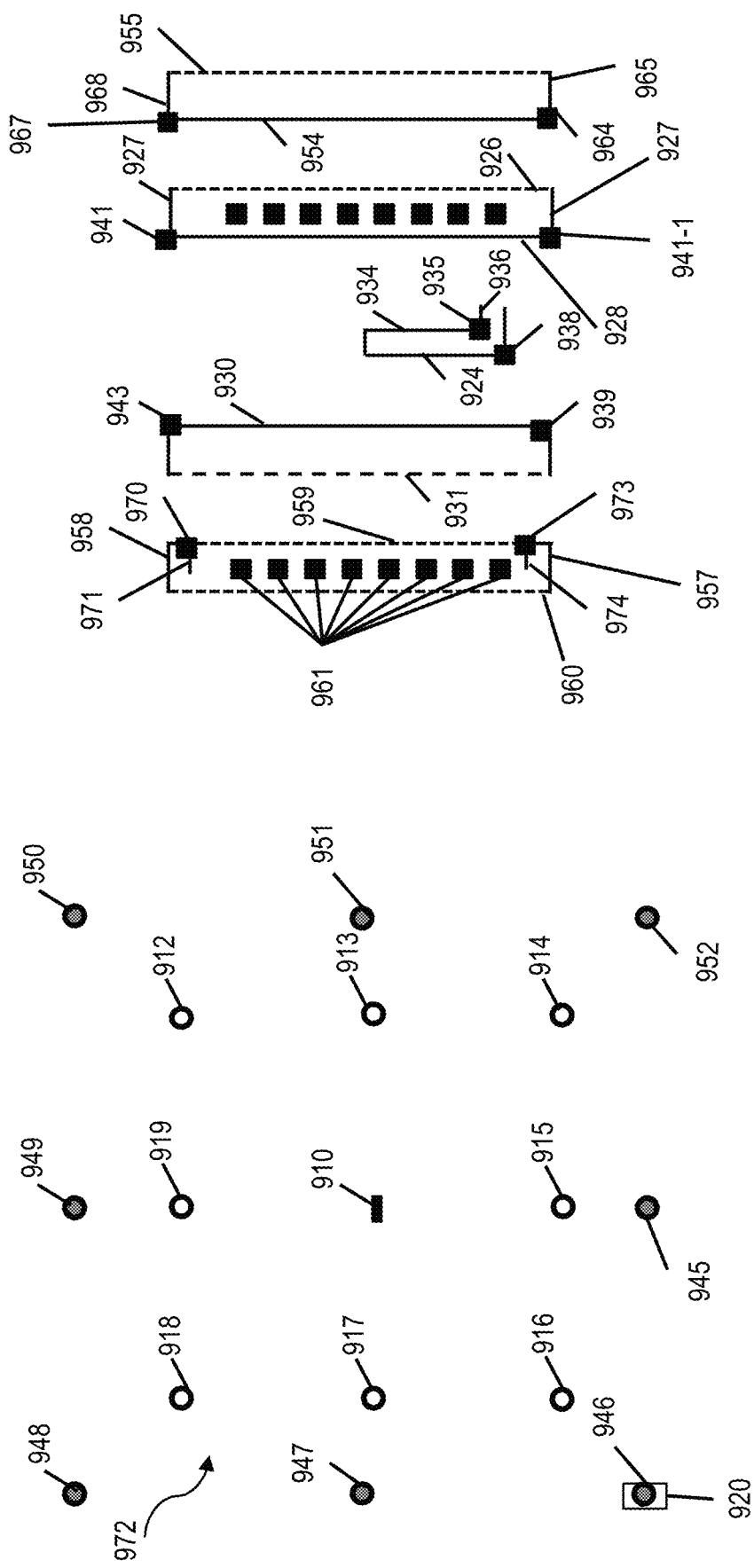
Figure 9S:
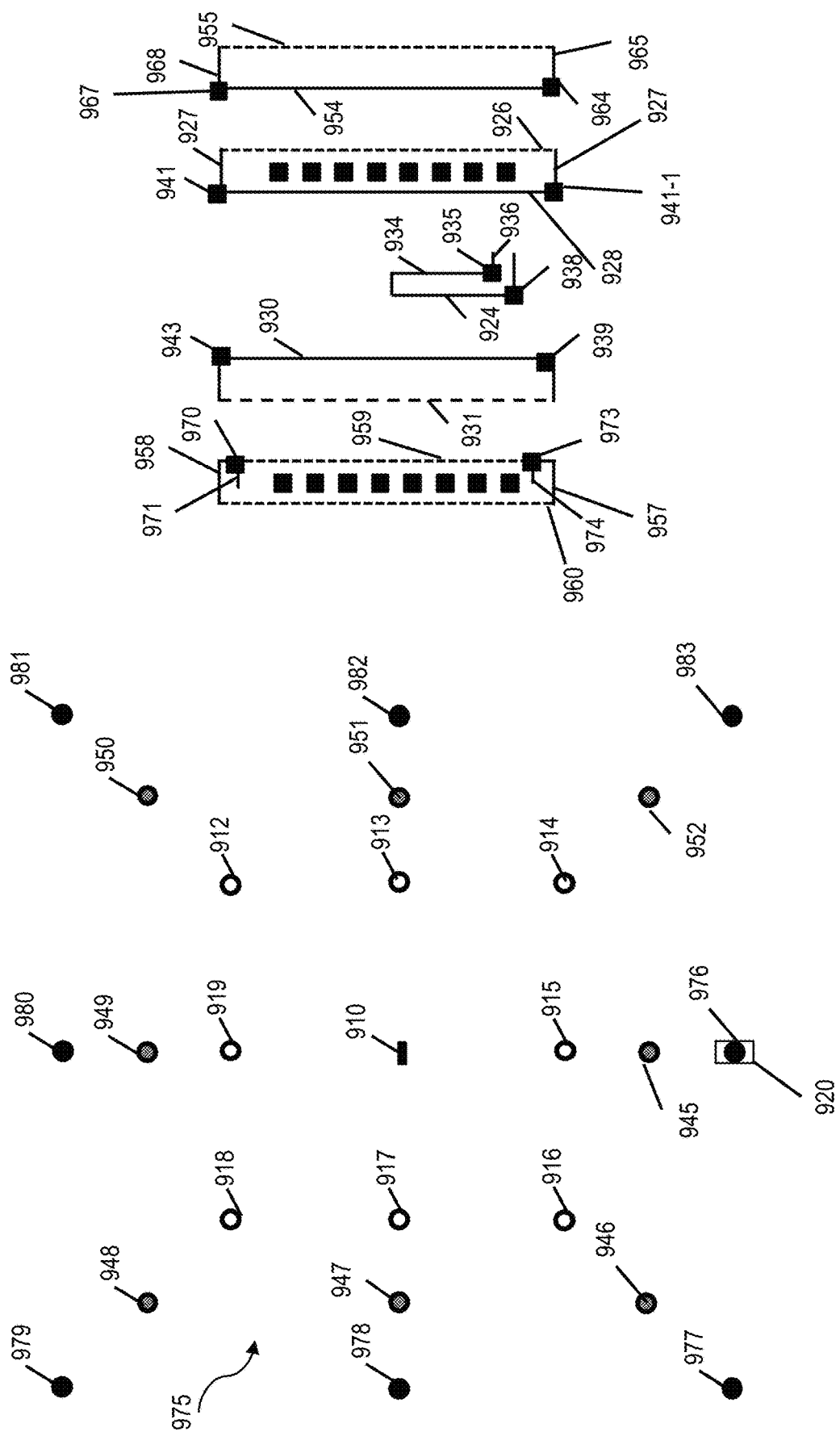
Figure 9T:
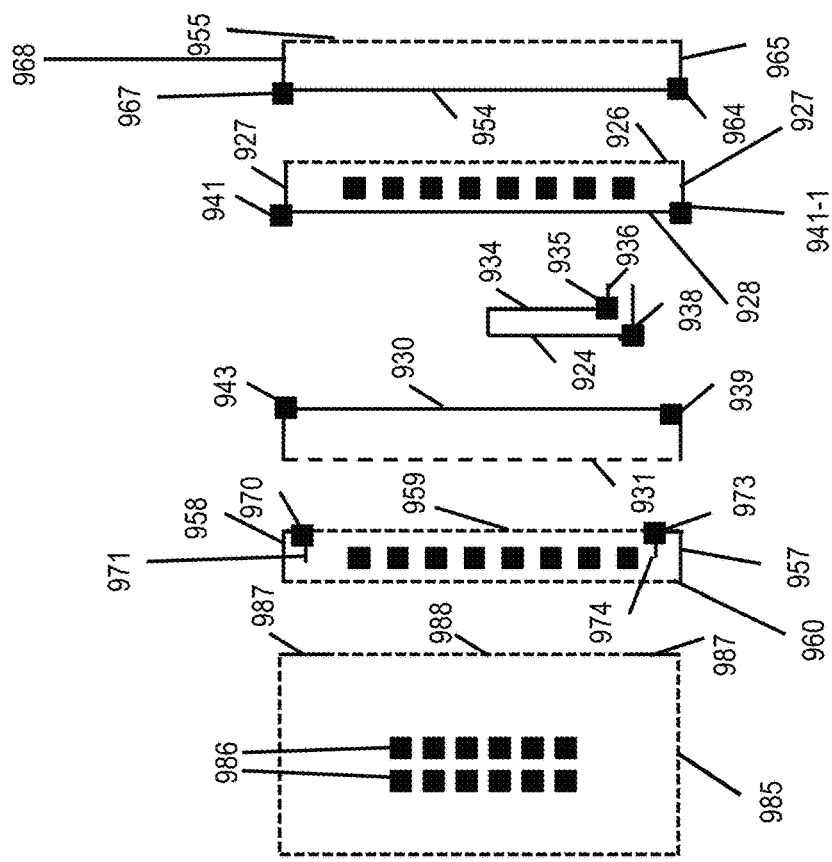
Figure 9T:
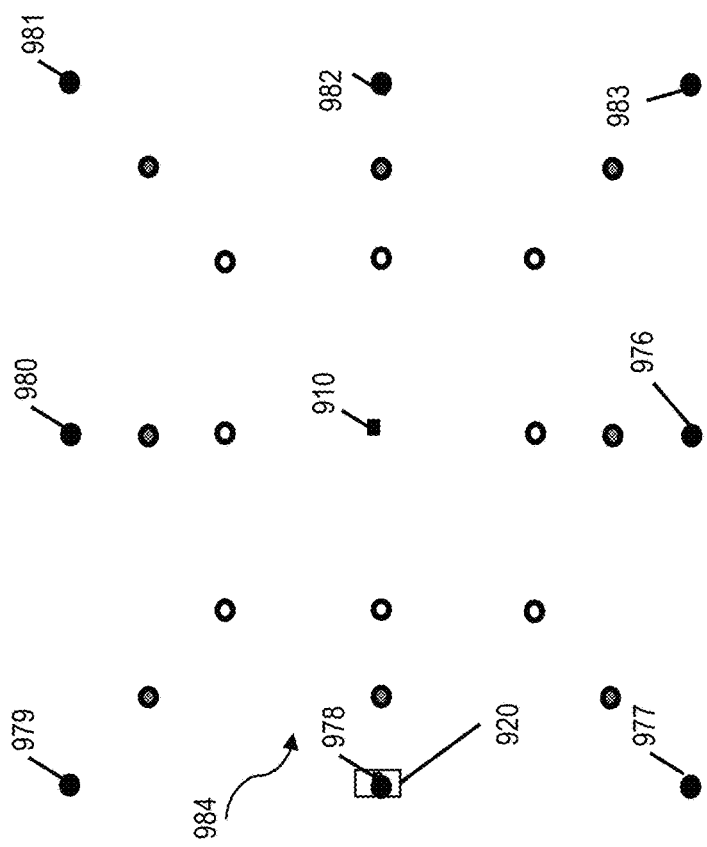
Figure 9U:
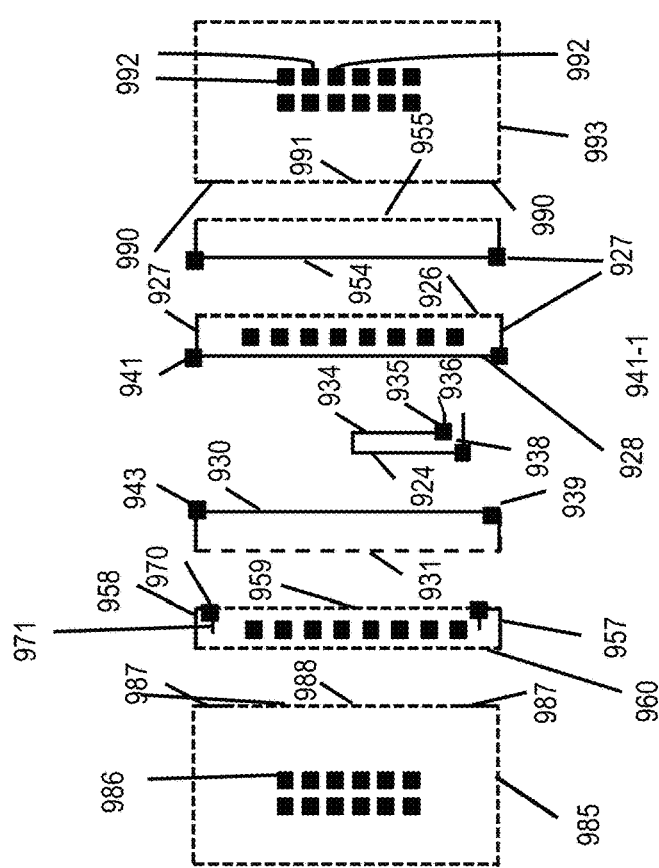
Figure 9U:
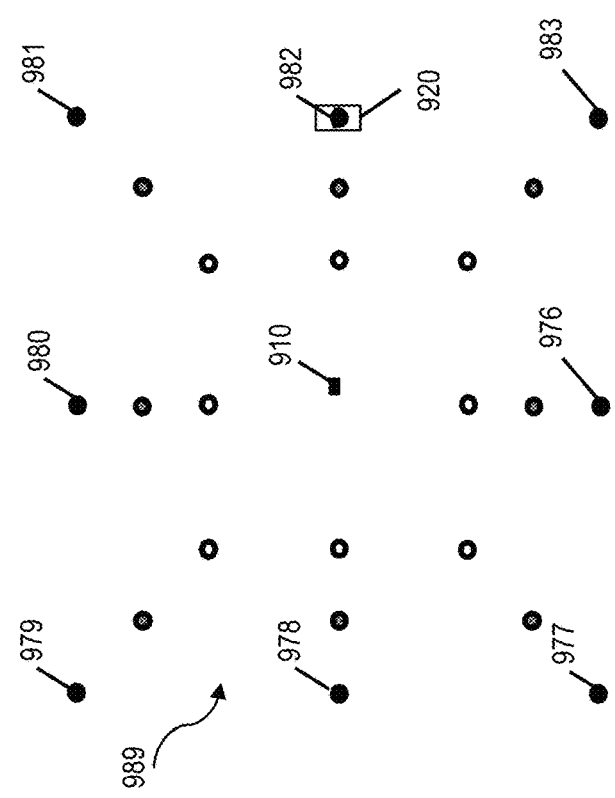
Figure 9V:
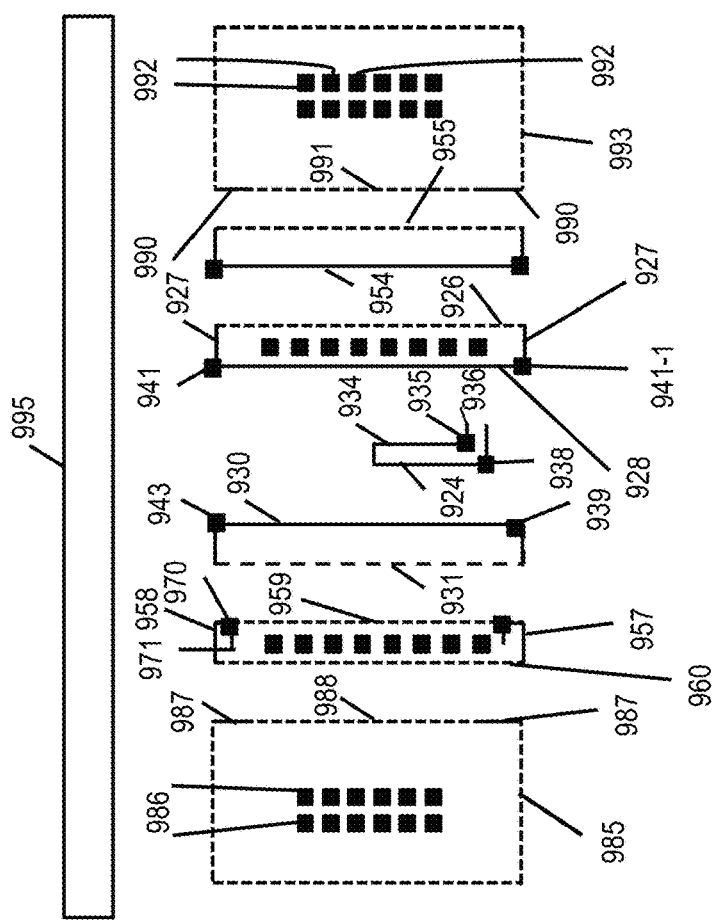
Figure 9V:
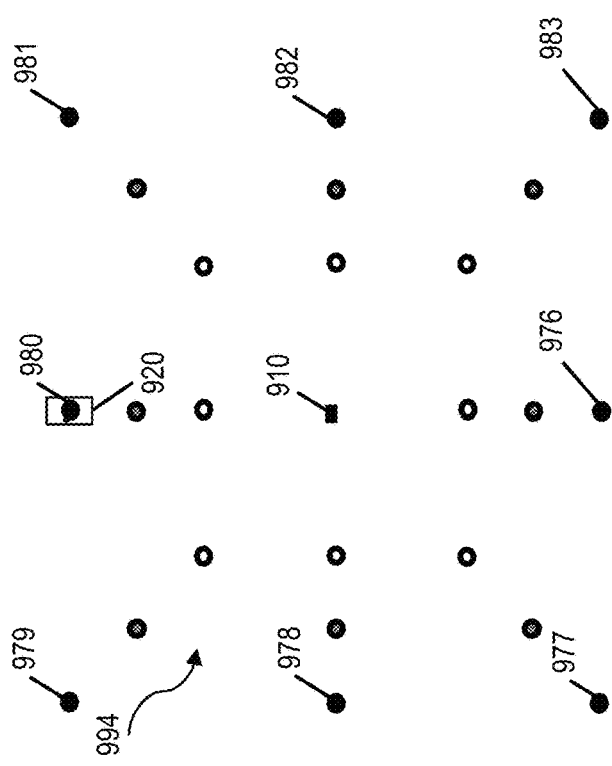
Figure 9W:
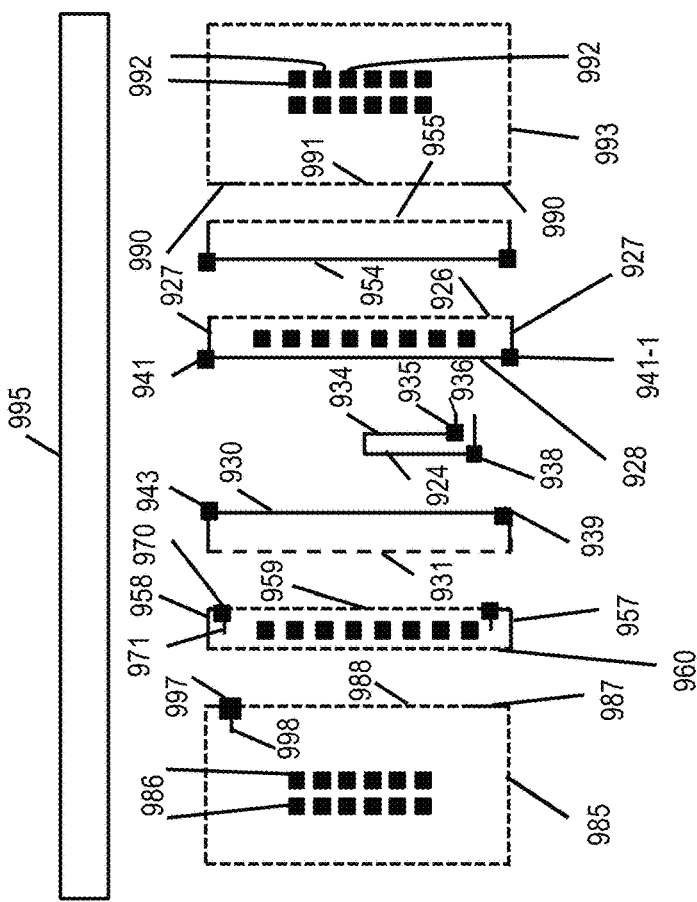
Figure 9W:
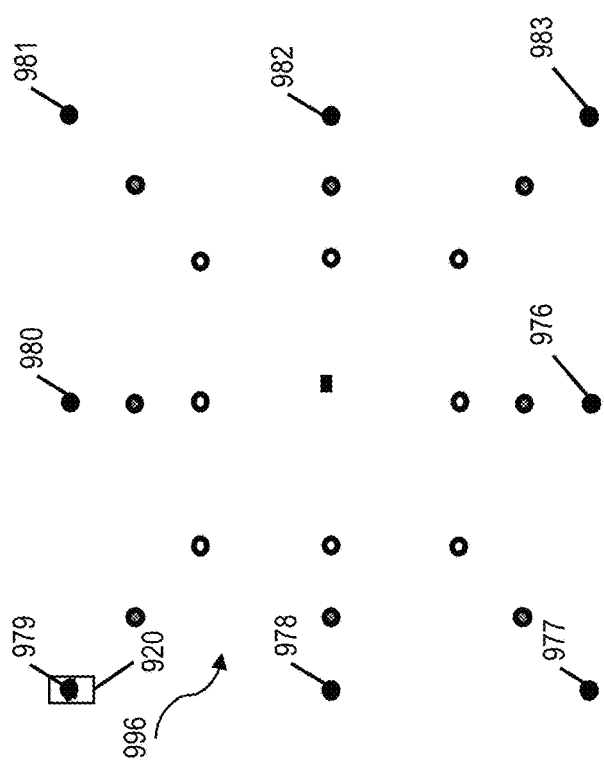
Figure 9X:
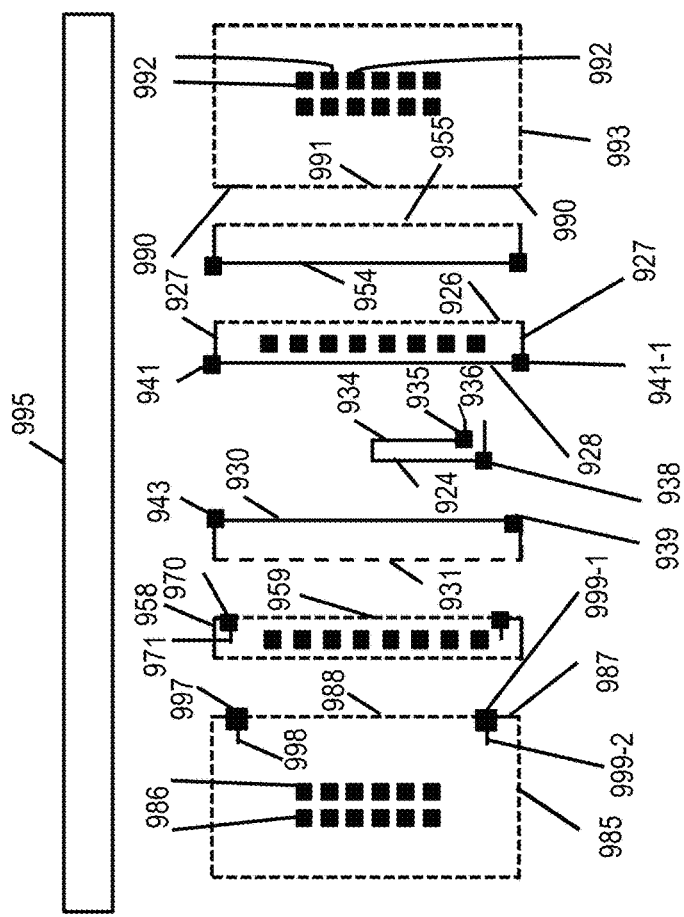
Figure 9X:
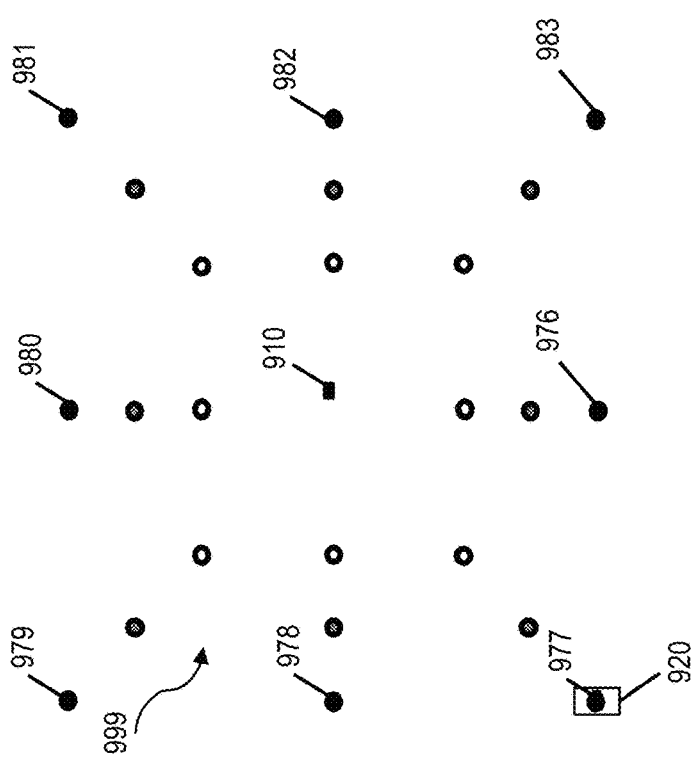
Figure 9Y:
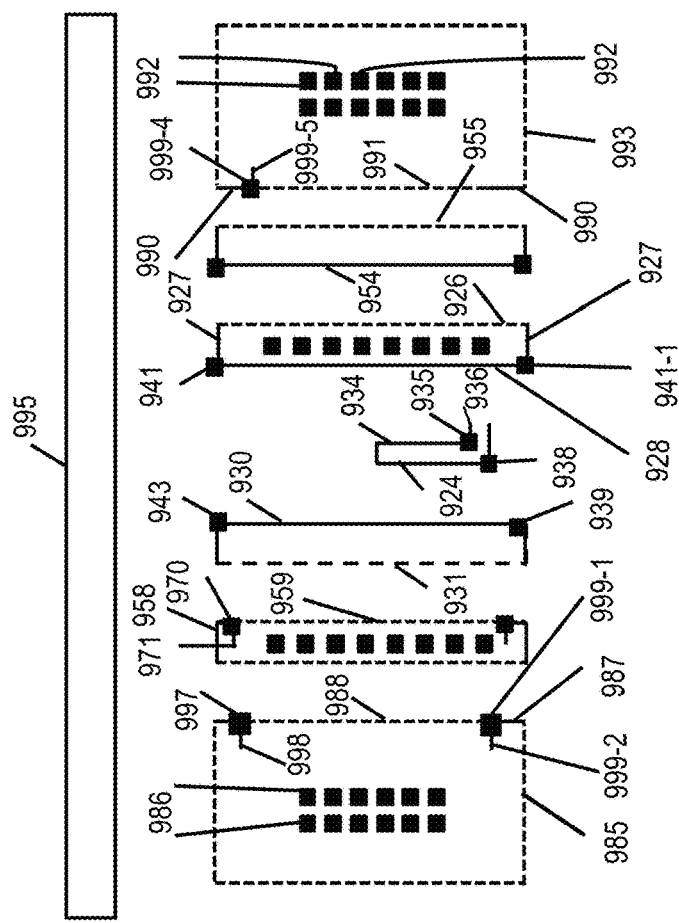
Figure 9Y:
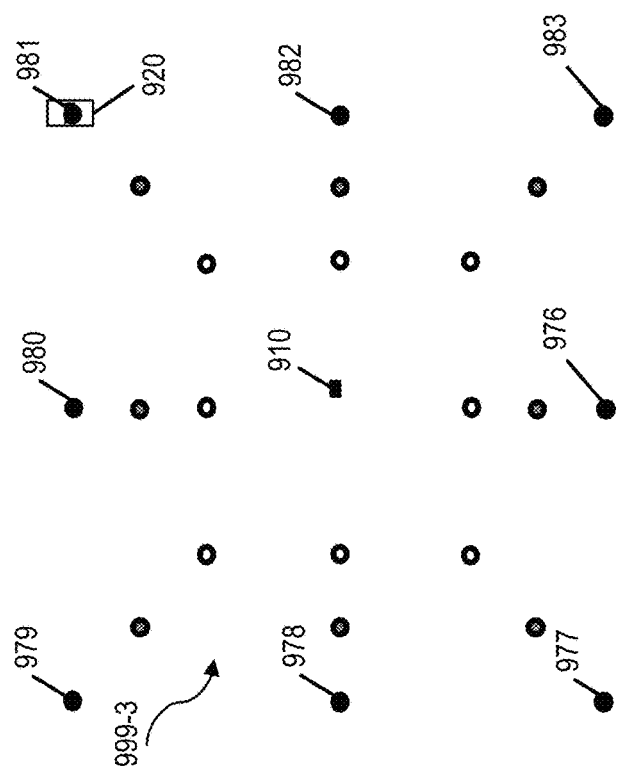
Figure 9Z:
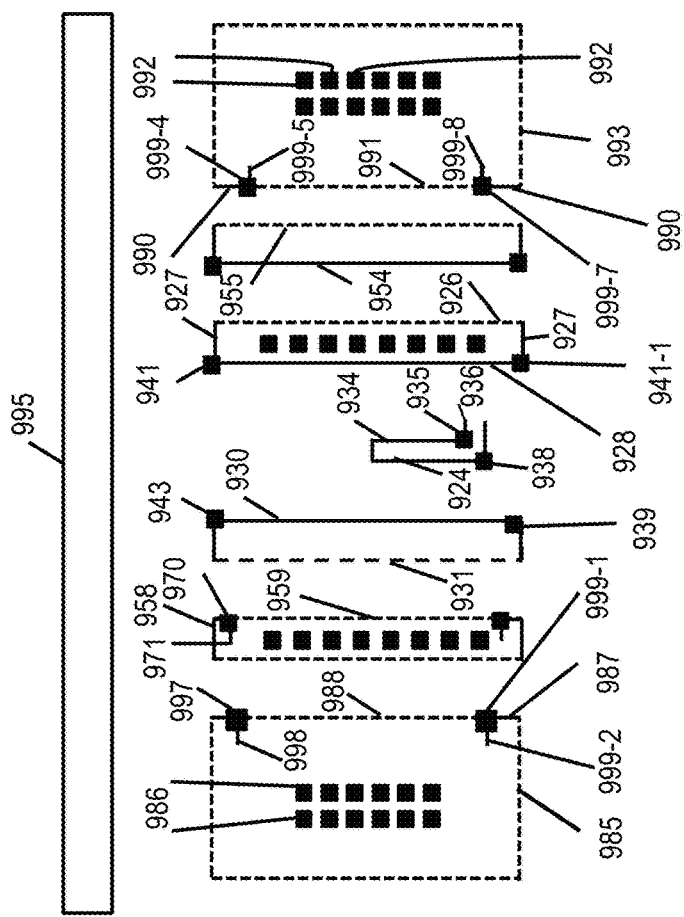
Figure 9Z:
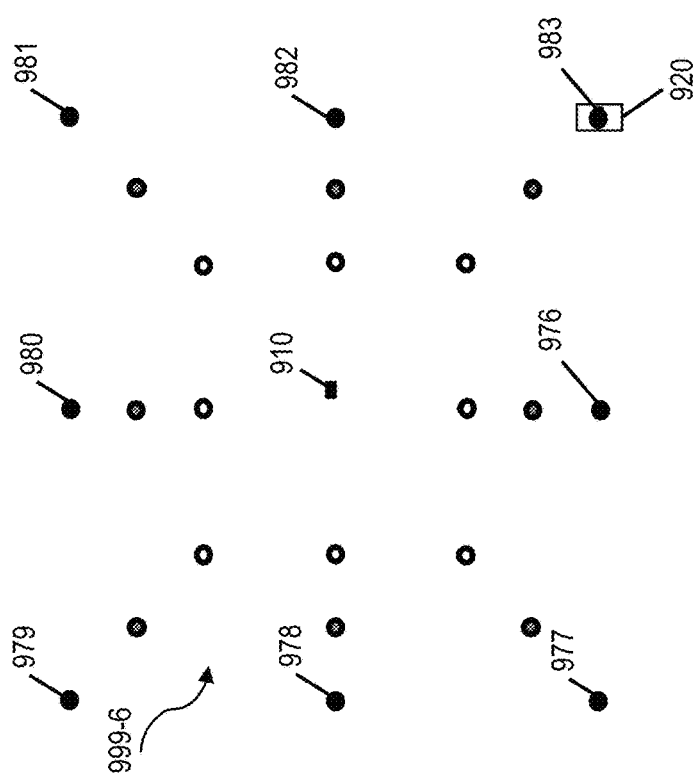

FIGS. 9A-Z illustrates block diagrams for a second example of translating the layout to taking snapshots of different images in order to define a retina image captured by GPS. In particular, FIG. 9A is a block diagram 900 of a layout design including POI 910, and polygons 901, 902, 903, 904, 905, 906, 907, 908, 909.

FIG. 9B is a block diagram 911 with snapshot locations 912, 913, 914, 915, 916, 917, 918 in a first zone. As discussed above (such as with regard to FIG. 6E), the snapshots may be taken from locations in different zones, such as at least two zones, at least three zones, etc. FIGS. 9A-Z illustrate snapshots taken from three distinct zones using camera 920.

As discussed above, different parts of the layout design, such as polygon information versus corner information, may be obtained at different directions (e.g., polygon information at the cardinal directions and corner information at the ordinal directions). Thus, for snapshot locations in the first zone, FIGS. 9C-F are at the cardinal directions and FIGS. 9G-J are at the ordinal directions. In particular, FIG. 9C is a block diagram 921 showing camera 920 at location 915, resulting in information 924 being generated for polygon 909. FIG. 9D is a block diagram 923 showing camera 920 at location 913, resulting in information 925, 926, 927, 928 being generated for polygon 904. FIG. 9E is a block diagram 929 showing camera 920 at location 917, resulting in information 930, 931 being generated for polygon 905. FIG. 9F is a block diagram 932 showing camera 920 at location 919, resulting in no information being generated since the layout design does not include polygons in that vicinity.

FIG. 9G is a block diagram 933 showing camera 920 at location 914 (at the south-east ordinal direction), resulting in information 934, 935, 936 being generated for corners of polygon 909, and information 941-1 for a corner of polygon 904. FIG. 9H is a block diagram 937 showing camera 920 at location 916 (at the south-west ordinal direction), resulting in information 938 being generated for a corner of polygon 909, and information 939 for a corner of polygon 905. FIG. 9I is a block diagram 940 showing camera 920 at location 912 (at the north-east ordinal direction), resulting in information 941 being generated for a corner of polygon 904. FIG. 9J is a block diagram 942 showing camera 920 at location 918 (at the north-west ordinal direction), resulting in information 943 being generated for a corner of polygon 905.

As discussed above, the snapshots may be obtained for different zones. For example, FIG. 9K is a block diagram 944 showing locations 945, 946, 947, 948, 949, 950, 951, 952 for zone two, with the camera 920 at 945. Further, a first set of locations, such as the cardinal locations 945, 947, 949, 951, may obtain polygon information while a second set of locations, such as the ordinal locations 946, 948, 950, 952, may obtain corner information. As shown, the camera in FIG. 9K is at a cardinal direction in order to obtain information regarding a polygon. Because there are no polygons in the vicinity of location 945, no additional information is generated from the snapshot by camera 920 at 945. FIG. 9L is a block diagram 953 showing camera 920 at location 951, resulting in information 954, 955, 965 being generated for polygon 903. FIG. 9M is a block diagram 956 showing camera 920 at location 947, resulting in information 957, 958, 959, 960, 961 being generated for polygon 906. FIG. 9N is a block diagram 962 showing camera 920 at location 949. Because there are no polygons in the vicinity of location 949, no additional information is generated from the snapshot by camera 920 at 949.

FIG. 9O is a block diagram 963 showing camera 920 at location 952 (at the south-east ordinal direction in zone 2), resulting in information 964 being generated for a corner of polygon 903. FIG. 9P is a block diagram 966 showing camera 920 at location 950 (at the north-east ordinal direction in zone 2), resulting in information 967, 968 being generated for a corner of polygon 903. FIG. 9Q is a block diagram 969 showing camera 920 at location 948 (at the north-west ordinal direction in zone 2), resulting in information 970, 971 being generated for a corner of polygon 906. FIG. 9R is a block diagram 972 showing camera 920 at location 946 (at the south-west ordinal direction in zone 2), resulting in information 973, 974 being generated for a corner of polygon 906.

FIG. 9S is a block diagram 975 showing locations 976, 977, 978, 979, 980, 981, 982, 983 for zone three, with the camera 920 at 76. Further, a first set of locations, such as the cardinal locations 976, 978, 980, 982, may obtain polygon information while a second set of locations, such as the ordinal locations 977, 979, 981, 983, may obtain corner information. As shown, the camera in FIG. 9S is at a cardinal direction in order to obtain information regarding a polygon. Because there are no polygons in the vicinity of location 976, no additional information is generated from the snapshot by camera 920 at 976. FIG. 9T is a block diagram 984 showing camera 920 at location 978, resulting in information 985, 986, 987, 988 being generated for polygon 907. FIG. 9U is a block diagram 989 showing camera 920 at location 982, resulting in information 990, 991, 992, 993 being generated for polygon 902. FIG. 9V is a block diagram 994 showing camera 920 at location 980, resulting in information 995 being generated for polygon 901.

FIG. 9W is a block diagram 996 showing camera 920 at location 979 (at the north-west ordinal direction in zone 3), resulting in information 997, 998 being generated for a corner of polygon 907. FIG. 9X is a block diagram 999 showing camera 920 at location 977 (at the south-west ordinal direction in zone 3), resulting in information 999-1, 999-2 being generated for a corner of polygon 907. FIG. 9Y is a block diagram 999-3 showing camera 920 at location 981 (at the north-east ordinal direction in zone 3), resulting in information 999-4, 999-5 being generated for a corner of polygon 902. FIG. 9Z is a block diagram 999-6 showing camera 920 at location 983 (at the south-east ordinal direction in zone 3), resulting in information 999-7, 999-8 being generated for a corner of polygon 902.

Thus, FIGS. 8A-I and 9A-Z illustrate that various images, such as the final image around the POI may be captured in an incremental or modular approach. In particular, the GPS may capture the context for the layout design, whether using single patterning technology (e.g., using a single mask) or multi-patterning technology (e.g., using multiple masks).

The following example embodiments of the invention are also disclosed:

Embodiment 1

A computer-implemented method for analyzing a plurality of points of interest (POIs) in a semiconductor layout design for a downstream application, the method comprising:
  accessing a representation of the semiconductor layout design;
  for a respective POI in the semiconductor layout design:
  defining the respective POI with regard to a plurality of topological features indicative of quantized values, the quantized values restricted to a discrete set of values for each of the plurality of topological features in order to constrain a description of the respective POI;
  defining, based on the plurality of topological features for the respective POI, a plurality of dimensional features indicative of analog values, the analog values comprising measurements with regard to the semiconductor layout design;
  generating a numerical representation for the respective POI based on the plurality of topological features and the plurality of dimensional features for the respective POI; and
  analyzing the numerical representation for the respective POI for the downstream application.

Embodiment 2

The method of embodiment 1,
  wherein the respective POI comprises a respective edge in the semiconductor layout design.

Embodiment 3

The method of any of embodiments 1 and 2,
  wherein the plurality of topological features are selected based on the downstream application.

Embodiment 4

The method of any of embodiments 1-3,
  wherein the quantized values for each of the plurality of topological features is restricted to two values.

Embodiment 5

The method of any of embodiments 1-4,
  wherein the plurality of topological features constrains the description of the respective POI to a finite tree structure; and
  wherein the plurality of dimensional features builds on the finite tree structure with the measurements with regard to the semiconductor layout design.

Embodiment 6

The method of any of embodiments 1-5,

Embodiment 7

The method of any of embodiments 1-6,
  wherein the measurements comprise measurements associated with a resident polygon on which the resident POI is resident and measurements relative to an external polygon that is external to the resident polygon.

Embodiment 8

The method of any of embodiments 1-7,
  wherein for a first downstream application, both the plurality of topological features and the plurality of dimensional features are analyzed; and
  wherein for a second downstream application, the plurality of topological features are analyzed but the plurality of dimensional features are not analyzed.

Embodiment 9

One or more non-transitory computer-readable media storing computer-executable instructions for causing one or more processors performance of a method according to any of embodiments 1-8.

Embodiment 10

A system, comprising: one or more processors, the one or more processors programmed to perform a method according to any of embodiments 1-9.

Embodiment 11

A computer-implemented method for analyzing a plurality of plurality of points of interest (POIs) in a semiconductor layout design for a downstream application, the method comprising:

for the plurality of POIs in the semiconductor layout design:

defining a plurality of relations for a respective POI with regard to a resident polygon on which the respective POI is resident and relative to an external polygon that is external to the resident polygon; and based on the defined plurality of relations, defining at least one image representation of the respective POI of the resident polygon and the external polygon; and analyzing the at least one image representation of the respective POI for the downstream application.

Embodiment 12

The method of embodiment 11,
wherein defining the plurality of relations comprises:
defining, for the respective POI, a plurality of topological features indicative of quantized values with regard to the resident polygon and the external polygon, the quantized values restricted to a discrete set of values for each of the plurality of topological features in order to constrain a description of the respective POI; and defining, based on the plurality of topological features for the respective POI, a plurality of dimensional features indicative of analog values, the plurality of analog values comprising measurements with regard to the resident polygon and the external polygon.

Embodiment 13

The method of any of embodiments 11 and 12,
wherein the plurality of topological features include corners for the resident polygon and the external polygon; and
wherein the plurality of dimensional features are related to the corners for the resident polygon.

Embodiment 14

The method of any of embodiments 11-13,
wherein the at least one image representation comprises one or more cardinal image representations defined on a plurality of cardinal directions and one or more ordinal image representations defined on a plurality of ordinal directions.

Embodiment 15

The method of any of embodiments 11-14,
wherein the one or more cardinal image representations are indicative of a plurality of external polygons defined on the plurality of cardinal directions; and
wherein the one or more ordinal image representations are indicative of a plurality of corners in the semiconductor layout design defined on the plurality of ordinal directions.

Embodiment 16

The method of any of embodiments 11-15,
wherein a POI image representation is defined for the resident polygon.

Embodiment 17

The method of any of embodiments 11-16,
wherein the one or more ordinal image representations comprise a self-ordinal image representation on the plurality of ordinal directions for the resident polygon and an outer-ordinal image representation on the plurality of ordinal directions for the external polygons.

Embodiment 18

The method of any of embodiments 11-17,
wherein a plurality of zones at different distances are defined with respect to the respective POI;
wherein the self-ordinal image representation is defined for the plurality of zones;
wherein the outer-ordinal image representation is defined for the plurality of zones; and
wherein the one or more cardinal image representations are defined for the plurality of zones.

Embodiment 19

The method of any of embodiments 11-18,
wherein processing of the semiconductor layout design is patterned using multi-patterning such that the semiconductor layout design is split into a plurality of masks;
wherein the self-ordinal image representation is defined for each of the plurality of masks;
wherein the outer-ordinal image representation is defined for each of the plurality of masks; and
wherein the one or more cardinal image representations are defined for each of the plurality of masks.

Embodiment 20

The method of any of embodiments 11-19,
wherein processing of the semiconductor layout design is patterned using multi-patterning such that the semiconductor layout design is split into a plurality of masks; and
wherein the at least one image representation is defined for each of the plurality of masks.

Embodiment 21

The method of any of embodiments 11-20,
wherein the at least one image representation is defined both for each of the plurality of masks and at a target level for the semiconductor layout design.

Embodiment 22

The method of any of embodiments 11-21,
wherein a plurality of zones at different distances are defined with respect to the respective POI; and
wherein the at least one image representation is defined for each of the plurality of zones for the plurality of masks and at the target level for the semiconductor layout design.

Embodiment 23

One or more non-transitory computer-readable media storing computer-executable instructions for causing one or more processors performance of a method according to any of embodiments 11-22.

Embodiment 24

A system, comprising: one or more processors, the one or more processors programmed to perform a method according to any of embodiments 11-22.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

The invention claimed is:

1. A computer-implemented method for analyzing a plurality of points of interest (POIs) in a semiconductor layout design for a downstream application, the method comprising:
   accessing a representation of the semiconductor layout design;
   for a respective POI in the semiconductor layout design:
   defining the respective POI with regard to a plurality of topological features indicative of quantized values, the quantized values restricted to a discrete set of values for each of the plurality of topological features in order to constrain a description of the respective POI;
   defining, based on the plurality of topological features for the respective POI, a plurality of dimensional features indicative of analog values, the analog values comprising measurements with regard to the semiconductor layout design;
   generating a numerical representation for the respective POI based on the plurality of topological features and the plurality of dimensional features for the respective POI; and
   analyzing the numerical representation for the respective POI for the downstream application.

2. The method of claim 1, wherein the respective POI comprises a respective edge in the semiconductor layout design.

3. The method of claim 2, wherein the plurality of topological features are selected based on the downstream application.

4. The method of claim 2, wherein the quantized values for each of the plurality of topological features is restricted to two values.

5. The method of claim 2, wherein the plurality of topological features constrains the description of the respective POI to a finite tree structure; and
   wherein the plurality of dimensional features builds on the finite tree structure with the measurements with regard to the semiconductor layout design.

6. The method of claim 5, wherein the measurements comprise measurements associated with a resident polygon on which the resident POI is resident and measurements relative to an external polygon that is external to the resident polygon.

7. The method of claim 1, wherein the respective POI is defined based on both the plurality of topological features and the plurality of dimensional features; and
   wherein analyzing the numerical representation for the respective POI for the downstream application consists of analyzing the plurality of topological features indicative of quantized values.

8. The method of claim 7, wherein for a first downstream application, both the plurality of topological features and the plurality of dimensional features are analyzed; and
   wherein for a second downstream application, the plurality of topological features are analyzed but the plurality of dimensional features are not analyzed.

9. A computer-implemented method for analyzing a plurality of plurality of points of interest (POIs) in a semiconductor layout design for a downstream application, the method comprising:
   for the plurality of POIs in the semiconductor layout design:
   defining a plurality of relations for a respective POI with regard to a resident polygon on which the respective POI is resident and relative to an external polygon that is external to the resident polygon; and
   based on the defined plurality of relations, defining at least one image representation of the respective POI of the resident polygon and the external polygon; and
   analyzing the at least one image representation of the respective POI for the downstream application.

10. The method of claim 9, wherein defining the plurality of relations comprises:
    defining, for the respective POI, a plurality of topological features indicative of quantized values with regard to the resident polygon and the external polygon, the quantized values restricted to a discrete set of values for each of the plurality of topological features in order to constrain a description of the respective POI; and
    defining, based on the plurality of topological features for the respective POI, a plurality of dimensional features indicative of analog values, the plurality of analog values comprising measurements with regard to the resident polygon and the external polygon.

11. The method of claim 10, wherein the plurality of topological features include corners for the resident polygon and the external polygon; and
    wherein the plurality of dimensional features are related to the corners for the resident polygon.

12. The method of claim 9, wherein the at least one image representation comprises one or more cardinal image representations defined on a plurality of cardinal directions and one or more ordinal image representations defined on a plurality of ordinal directions.

13. The method of claim 12, wherein the one or more cardinal image representations are indicative of a plurality of external polygons defined on the plurality of cardinal directions; and
    wherein the one or more ordinal image representations are indicative of a plurality of corners in the semiconductor layout design defined on the plurality of ordinal directions.

14. The method of claim 13, wherein a POI image representation is defined for the resident polygon.

15. The method of claim 14, wherein the one or more ordinal image representations comprise a self-ordinal image representation on the plurality of ordinal directions for the resident polygon and an outer-ordinal image representation on the plurality of ordinal directions for the external polygons.

16. The method of claim 15, wherein a plurality of zones at different distances are defined with respect to the respective POI;
    wherein the self-ordinal image representation is defined for the plurality of zones;
    wherein the outer-ordinal image representation is defined for the plurality of zones; and
    wherein the one or more cardinal image representations are defined for the plurality of zones.

17. The method of claim 16, wherein processing of the semiconductor layout design is patterned using multi-patterning such that the semiconductor layout design is split into a plurality of masks;

wherein the self-ordinal image representation is defined for each of the plurality of masks;

wherein the outer-ordinal image representation is defined for each of the plurality of masks; and wherein the one or more cardinal image representations are defined for each of the plurality of masks.

18. The method of claim 9, wherein processing of the semiconductor layout design is patterned using multi-patterning such that the semiconductor layout design is split into a plurality of masks; and wherein the at least one image representation is defined for each of the plurality of masks.

19. The method of claim 18, wherein the at least one image representation is defined both for each of the plurality of masks and at a target level for the semiconductor layout design.

20. The method of claim 19, wherein a plurality of zones at different distances are defined with respect to the respective POI; and wherein the at least one image representation is defined for each of the plurality of zones for the plurality of masks and at the target level for the semiconductor layout design.

\* \* \* \* \*